United States Patent
Hagiwara et al.

[11] Patent Number: 6,153,886
[45] Date of Patent: Nov. 28, 2000

[54] ALIGNMENT APPARATUS IN PROJECTION EXPOSURE APPARATUS

[75] Inventors: Shigeru Hagiwara, Kawasaki; Hideo Mizutani, Yokohama; Kazuya Ota, Setagaya-ku, all of Japan

[73] Assignee: Nikon Corporation, Tokyo, Japan

[21] Appl. No.: 09/407,610

[22] Filed: Sep. 28, 1999

Related U.S. Application Data

[63] Continuation of application No. 08/999,731, Oct. 3, 1997, abandoned, which is a continuation of application No. 08/768,836, Dec. 19, 1996, abandoned, which is a continuation of application No. 08/388,963, Feb. 15, 1995, abandoned, which is a continuation of application No. 08/198,077, Feb. 17, 1994, abandoned.

[30] Foreign Application Priority Data

| Feb. 19, 1993 | [JP] | Japan | ..... 5-29532 |
| Mar. 5, 1993 | [JP] | Japan | ..... 5-44772 |
| Mar. 5, 1993 | [JP] | Japan | ..... 5-44773 |

[51] Int. Cl.[7] ................................ G01N 21/86
[52] U.S. Cl. ................ 250/548; 250/559.3; 356/401
[58] Field of Search ................ 250/548, 559.3, 250/559.29; 356/399–401; 355/53, 55

[56] References Cited

U.S. PATENT DOCUMENTS

| 4,631,416 | 12/1986 | Trutna, Jr. | ..... 250/548 |
| 4,856,905 | 8/1989 | Nishi | ..... 250/548 |
| 5,100,237 | 3/1992 | Wittekoek et al. | ..... 356/401 |
| 5,204,535 | 4/1993 | Mizutani | ..... 250/548 |
| 5,272,501 | 12/1993 | Nishi et al. | ..... 355/53 |
| 5,583,609 | 12/1996 | Mizutani et al. | ..... 355/46 |

*Primary Examiner*—Que T. Le
*Attorney, Agent, or Firm*—Oliff & Berridge, PLC

[57] ABSTRACT

An alignment apparatus according to the present invention is constructed, for example, which is arranged in an exposure apparatus provided with a projection optical system which projects a predetermined pattern formed on a mask onto a substrate under exposure light, which performs relative positioning between the mask and the substrate, which has light irradiating means for irradiating alignment light in a wavelength region different from that of exposure light onto an alignment mark formed on the substrate through the projection optical system and detecting means for detecting light from the alignment mark through the projection optical system, wherein, for alignment light as irradiation light traveling toward the alignment mark and alignment light as detection light from the alignment mark, there are provided correction optical elements for irradiation light and correction optical elements for detection light to cause axial chromatic aberration and magnification chromatic aberration in the opposite directions to axial chromatic aberration and magnification chromatic aberration of the projection optical system between the mask and the substrate, wherein the alignment light is multi-colored light with a plurality of beams different in wavelength from each other in the wavelength region different from that of exposure light, and wherein the correction optical elements for irradiation light or the correction optical elements for detection light each are provided in correspondence with the plurality of beams different in wavelength.

48 Claims, 45 Drawing Sheets

FIG. 24A
FIG. 24B
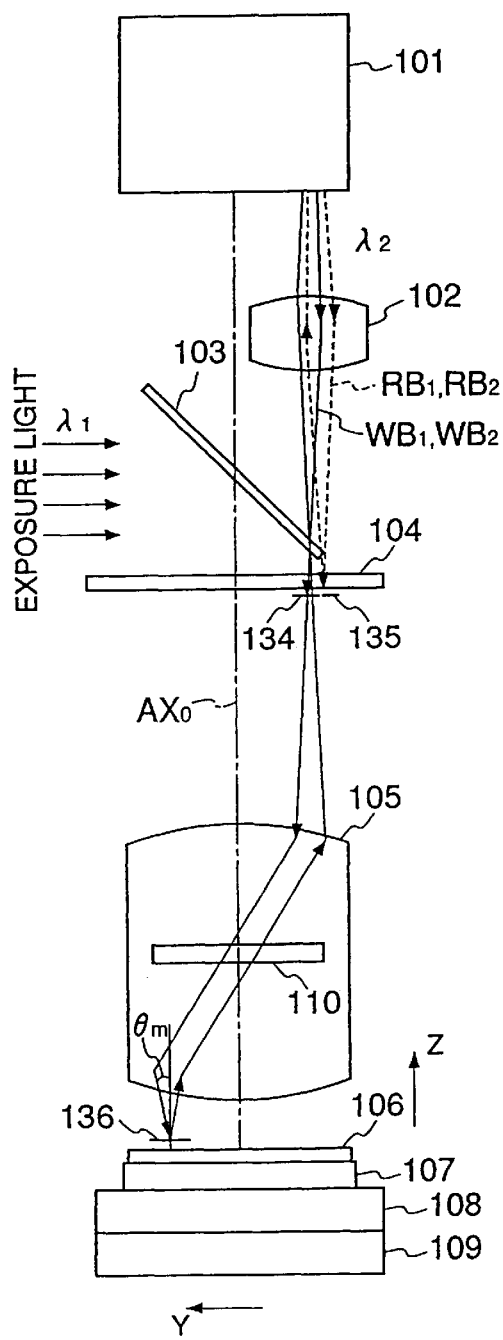
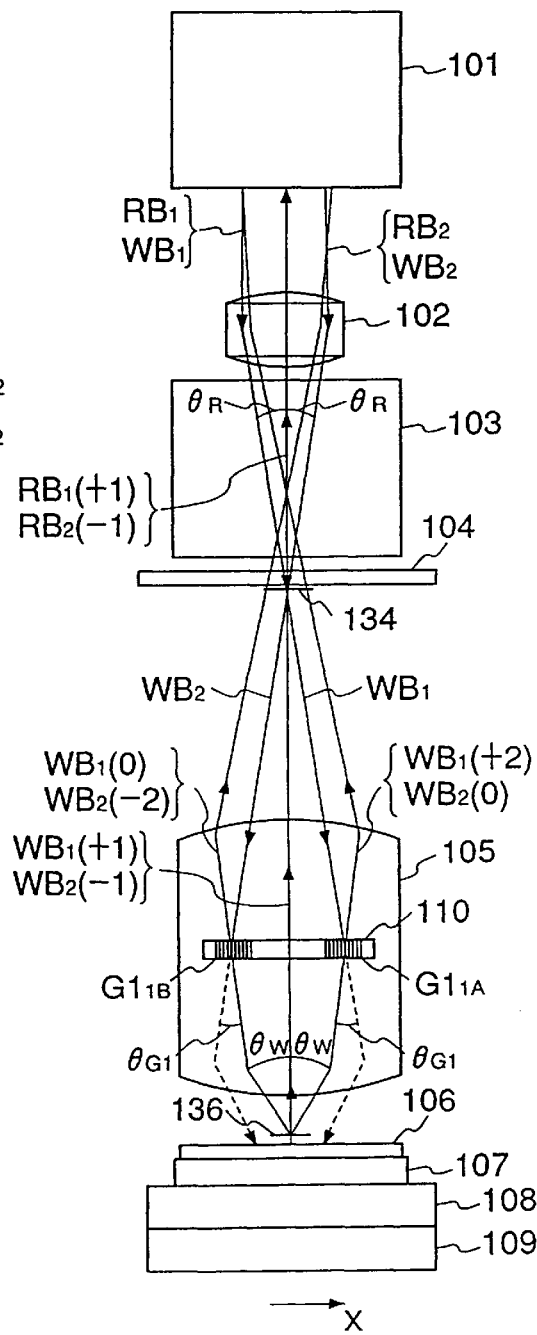

FIG. 29A
FIG. 29B
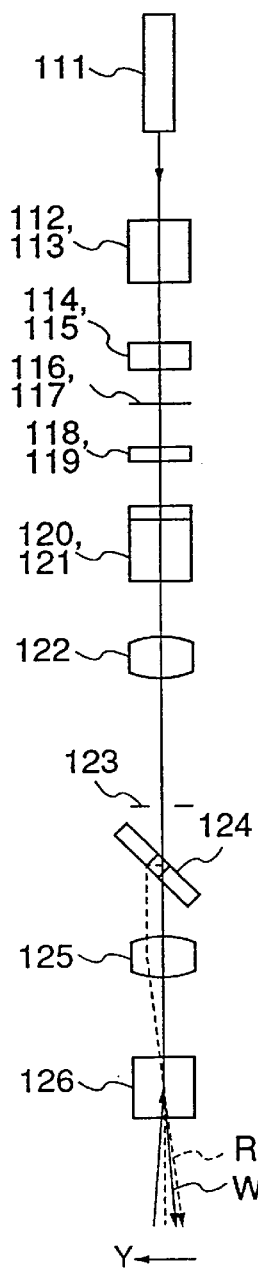
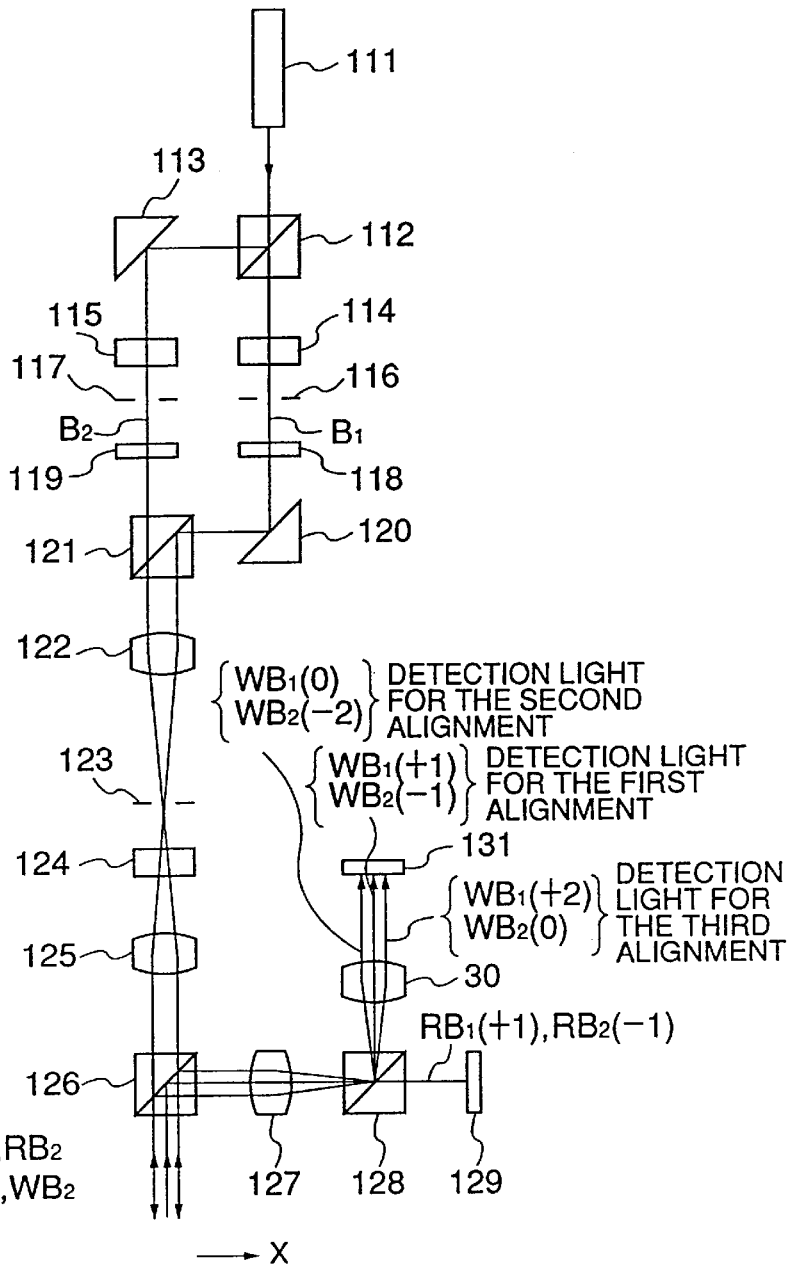
FIG. 29C
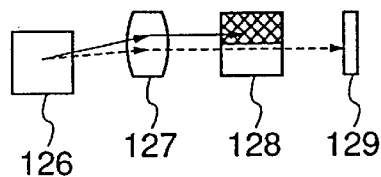

FIG. 32A
FIG. 32B
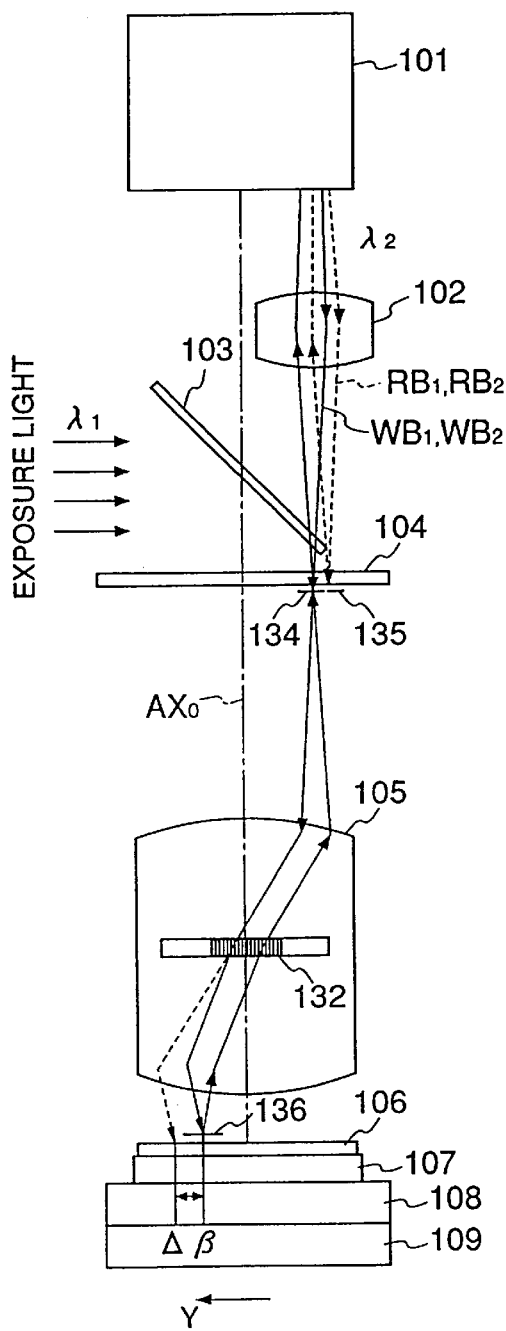
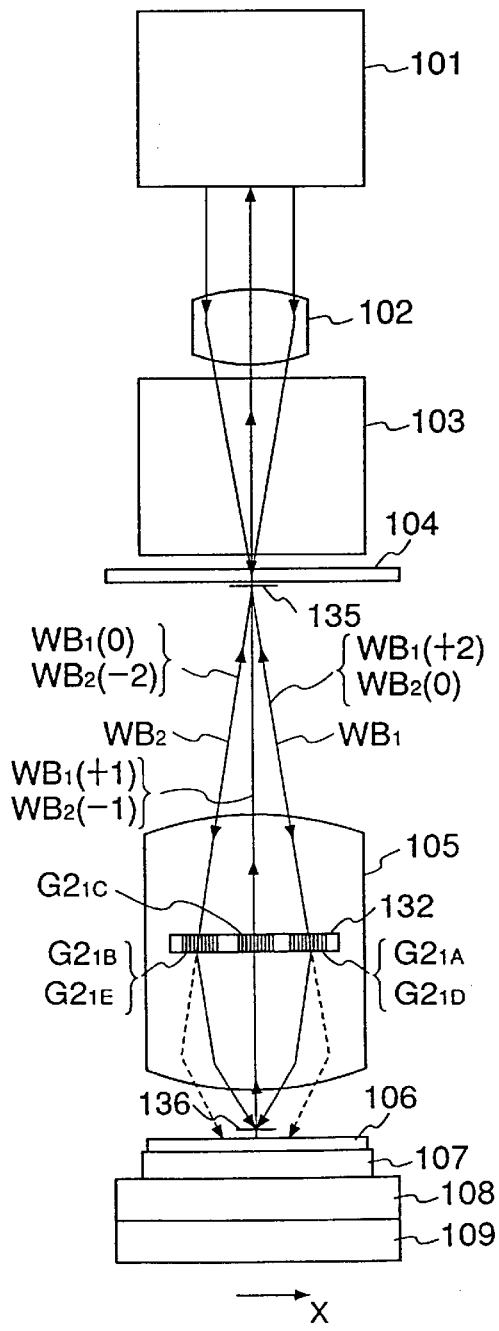

FIG. 34A
FIG. 34B
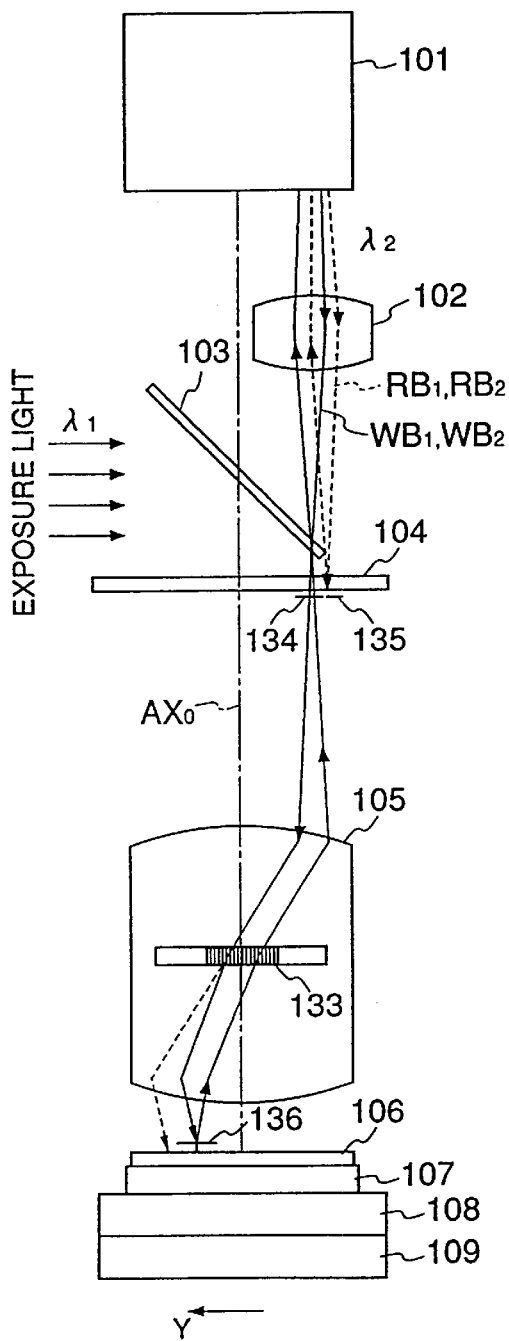
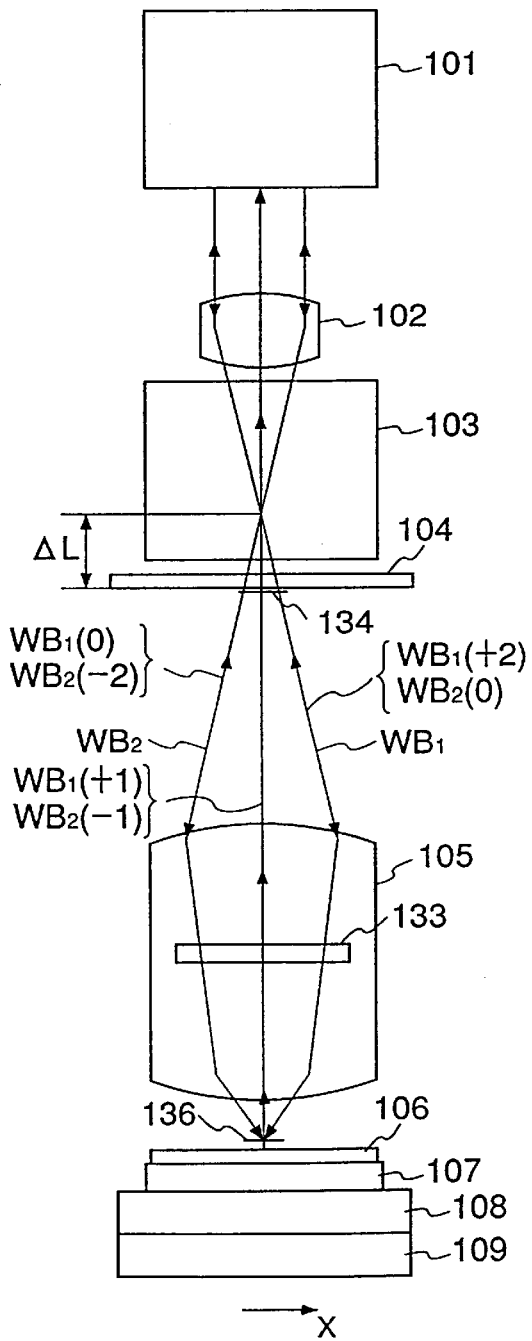

FIG. 36A
FIG. 36B
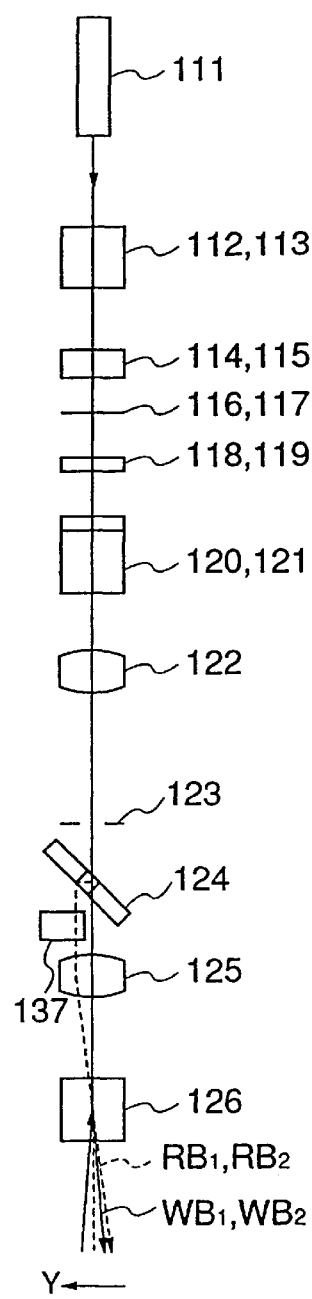
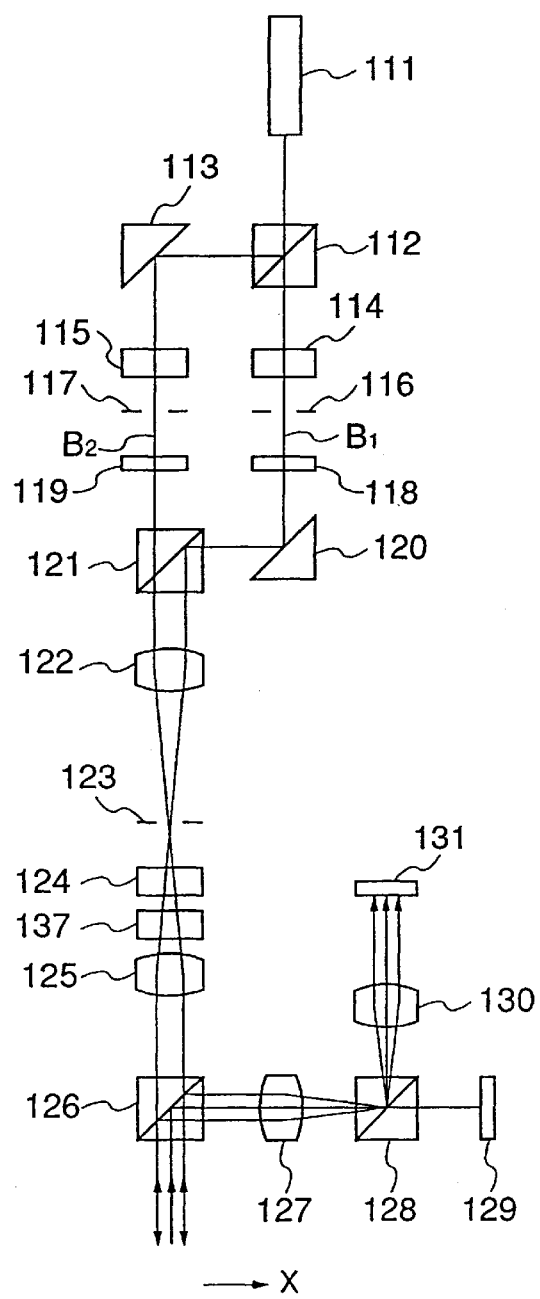
FIG. 36C
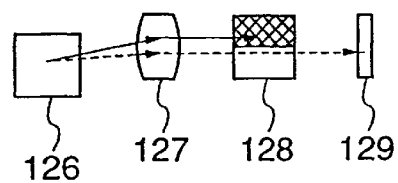

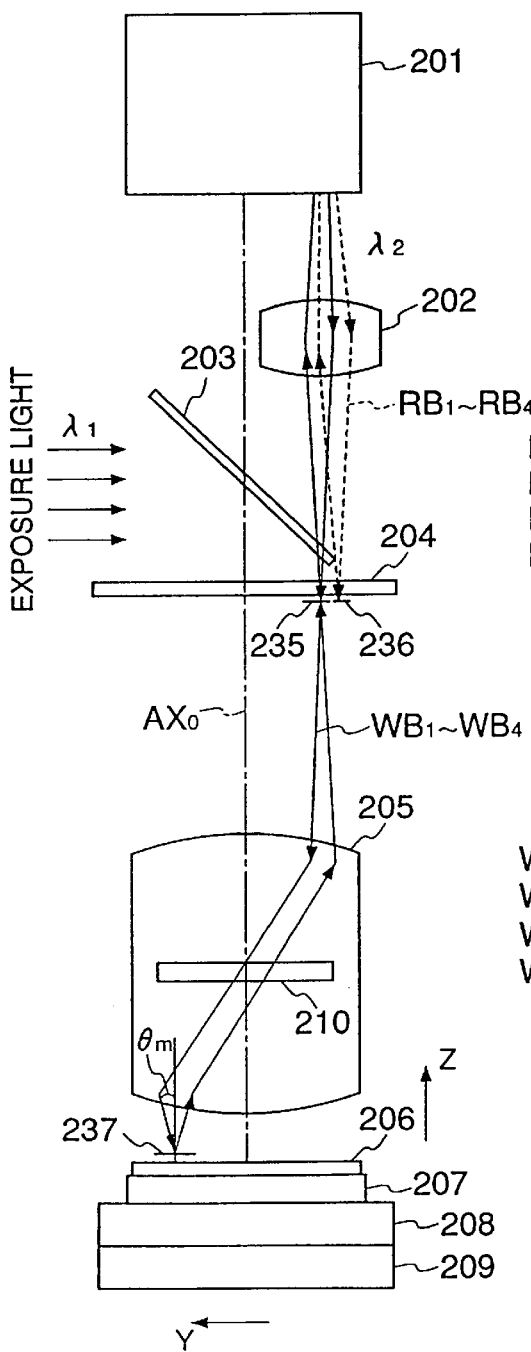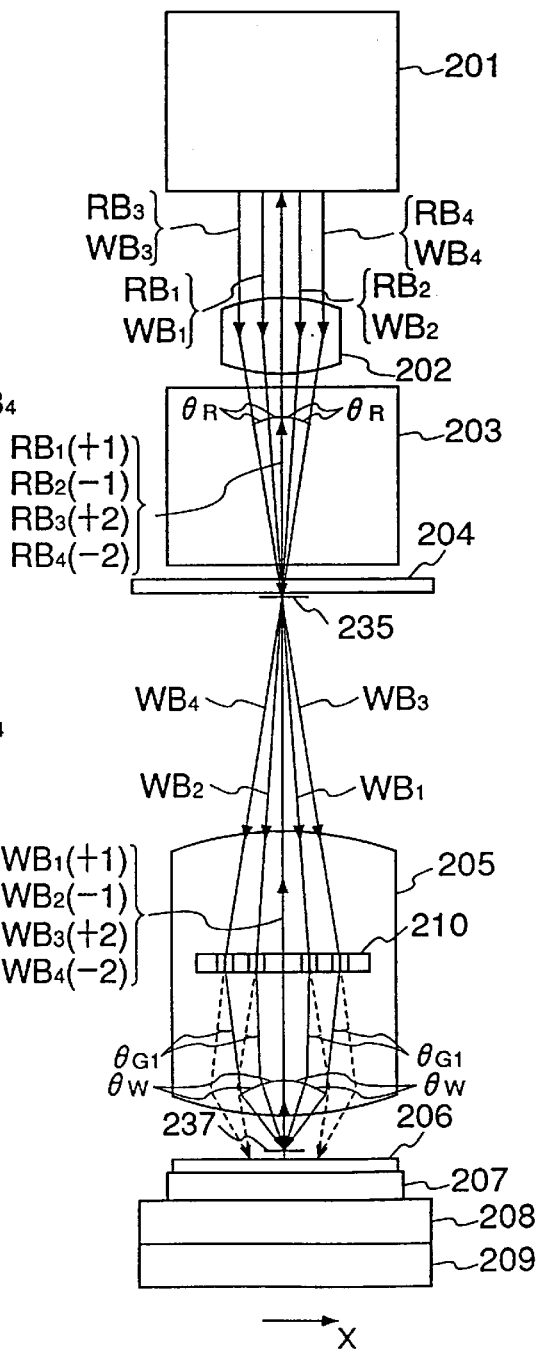

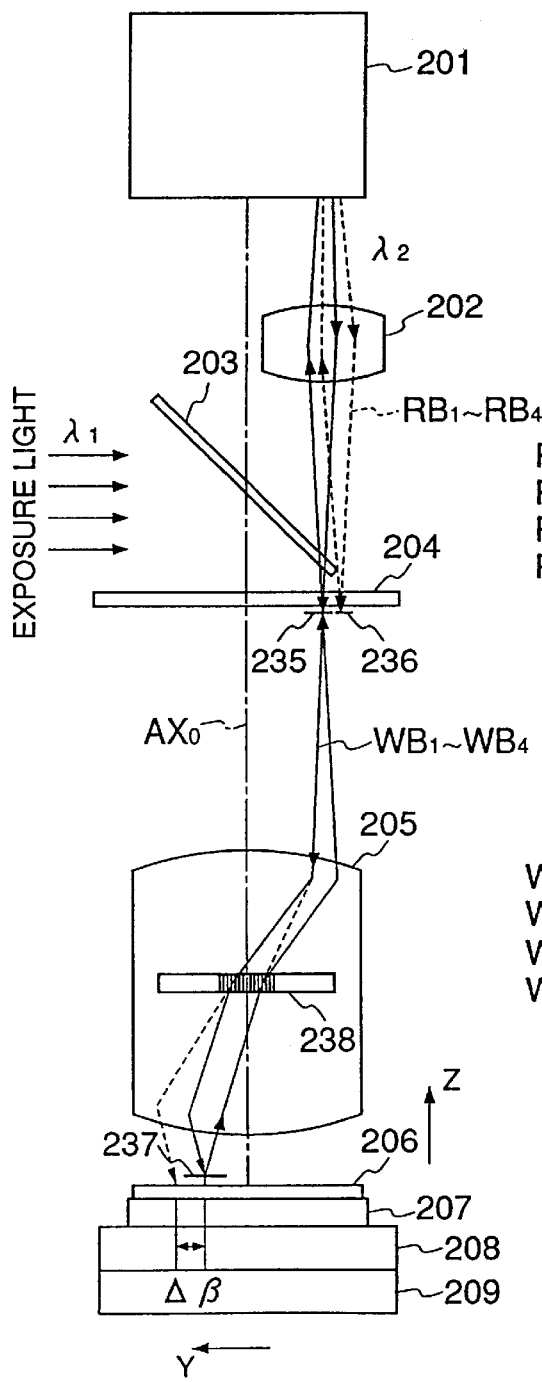
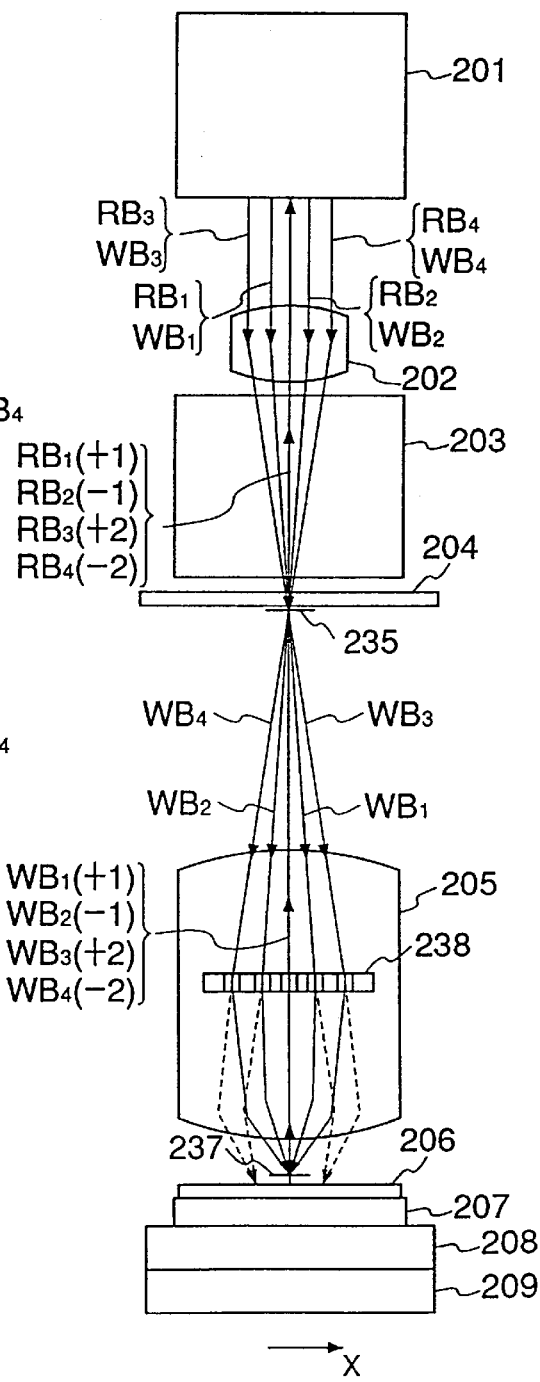

FIG. 49A
FIG. 49B
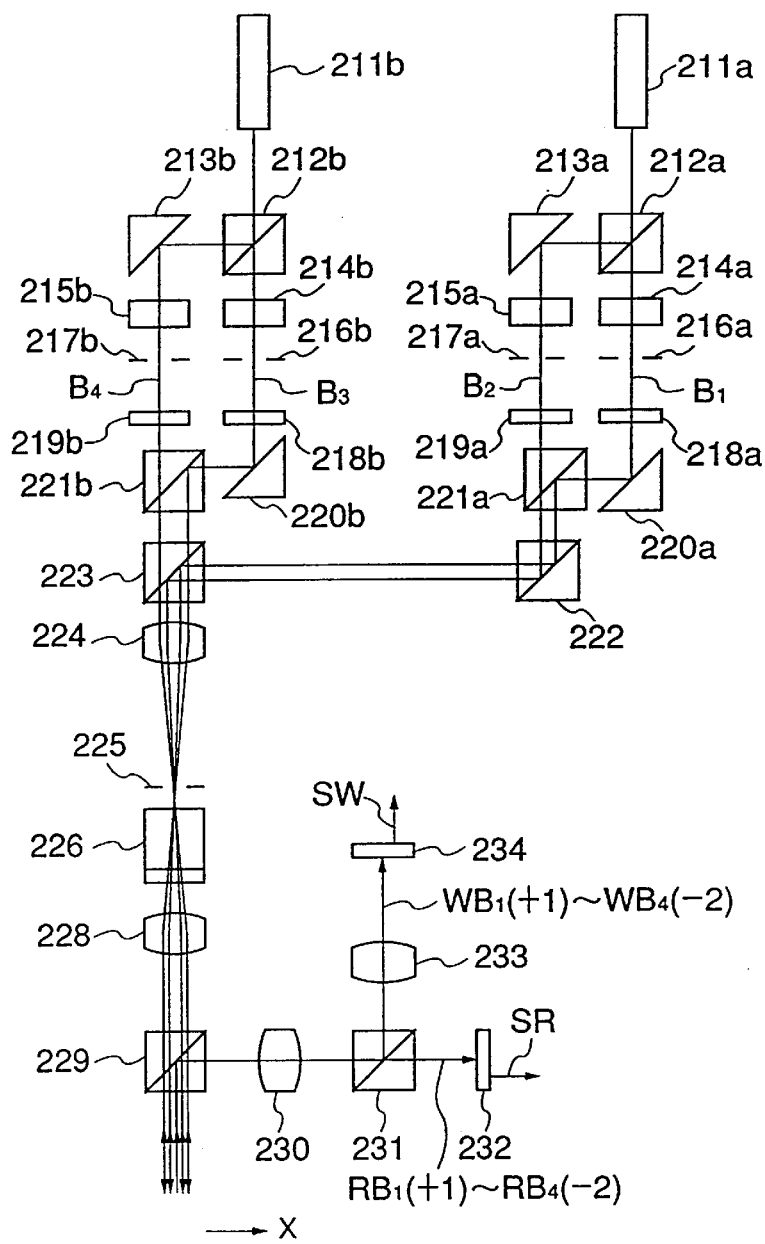
FIG. 49C
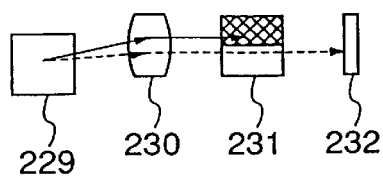

FIG. 53
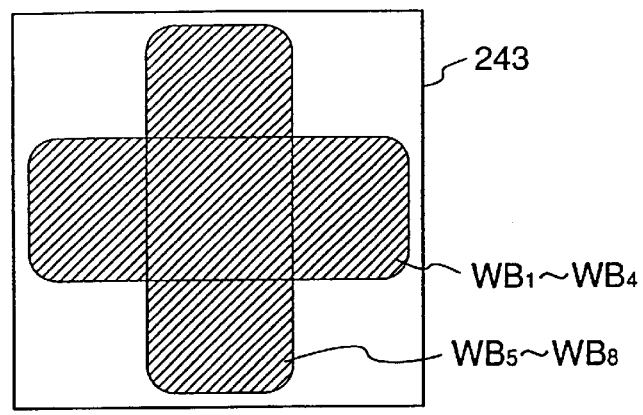
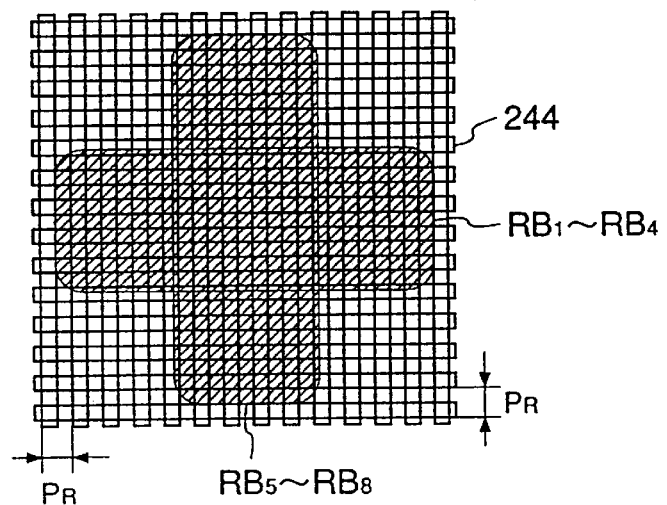
FIG. 54
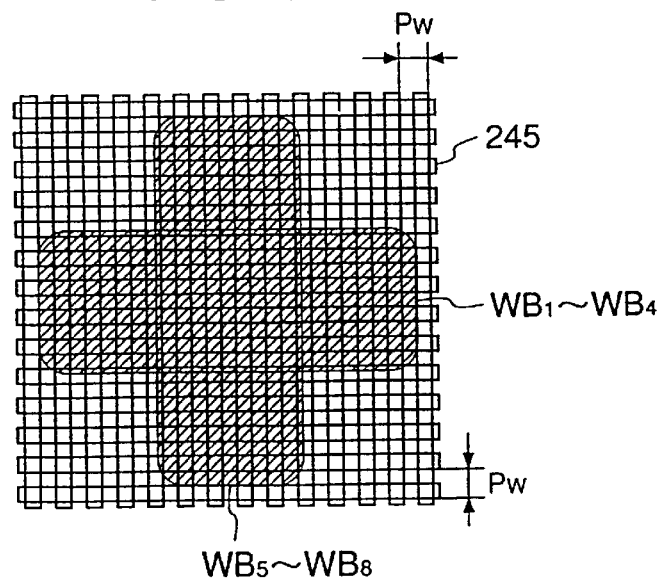

ALIGNMENT APPARATUS IN PROJECTION EXPOSURE APPARATUS

This is a continuation under 37 CFR § 1.53(b) of prior application Ser. No. 08/999,731 filed Oct. 3, 1997, abandoned which is a continuation of prior application Ser. No. 08/768,836, filed Dec. 19, 1996, abandoned which is in turn a continuation of Ser. No. 08/388,963 filed Feb. 15, 1995, abandoned which is a continuation application of application Ser. No. 08/198,077, filed Feb. 17, 1994 abandoned.

BACKGROUND OF THE INVENTION

1. Field of the Invention

The present invention relates to an alignment apparatus (positioning apparatus) arranged in a projection exposure apparatus which projects exposure light passing through a medium with projection information, such as a photomask or a reticle, onto a semiconductor wafer or a print-circuit board through a projection optical system to transfer the information thereon, for relative positioning of the photomask or the reticle at a transfer position with high precision with respect to the semiconductor wafer or print-circuit board.

2. Related Background Art

The projection exposure apparatus is used for fabrication of semiconductor elements or liquid crystal display devices, applying the photolithography technology. This projection apparatus supplies exposure light, which passes through a photomask or reticle and then irradiates a substrate (semiconductor wafer, glass plate, etc.) coated with a photosensitive material through a projection optical system to transfer projection information thereonto. For example in case of fabrication of semiconductor elements (IC, LSI, etc.), a plurality of exposure processes are conducted to form a plurality of layered or overlaid circuit patterns on a semiconductor wafer. Further, to produce semiconductor elements with high yield, it is necessary to control the overlay accuracy (positioning accuracy) within a certain permissible range between a circuit pattern in a previous layer formed on the semiconductor wafer and a next circuit pattern successively transferred. In order to improve the positioning accuracy, the projection exposure apparatus is provided with an alignment apparatus for relative alignment between the photomask or reticle and the semiconductor wafer.

Among conventional alignment apparatus, there is an apparatus expected as one capable of theoretically achieving the highest accuracy, which is of a TTR (through the reticle) type in which a relative position is directly adjusted between the reticle and the wafer through the projection optical system. The alignment apparatus must use alignment light with a wavelength different from that of the exposure light to avoid exposure of the coating photoresist on the wafer by the alignment light. However, in case the wavelength of alignment light is different from that of exposure light, the projection optical system causes chromatic aberration for the alignment light, which was a problem. Japanese Patent Publication No. 1-40490 and U.S. Pat. No. 5,100,237, U.S. Pat. No. 5,160,849, U.S. Pat. No. 5,204,535 disclose alignment apparatus arranged to correct the chromatic aberration.

First, the alignment apparatus as disclosed in U.S. Pat. No. 5,100,237 has a correction lens located at the center of optic axis and at the entrance pupil of projection optical system to correct the chromatic aberration between the wavelength of exposure light and the wavelength of alignment light. In such arrangement, alignment is carried out while detecting±first-order diffracted light from an alignment mark (wafer mark) on the wafer.

The alignment apparatus as disclosed in Japanese Patent Publication No. 1-40490 has a correction optical system located outside or inside an exposure light path between the reticle and the projection optical system to correct the chromatic aberration of alignment light as caused in passing through the projection optical system. The apparatus detects a wafer mark and an image of reticle mark (alignment mark on reticle) formed on the wafer through the projection optical system, whereby alignment is effected between the reticle and the wafer.

The above-described alignment apparatus as disclosed in U.S. Pat. No. 5,100,237 employs the correction lens for correction of chromatic aberration located at the center of entrance pupil of projection optical system and sized small enough to avoid an adverse effect on the exposure light. Meanwhile, there is a need to make finer the pitch of diffraction grating as the wafer mark to further improve the alignment accuracy. Then, decreasing the pitch of diffraction grating as the wafer mark results in increasing a separation between the±first-order diffracted light as detection light at the entrance pupil of projection optical system, which requires a larger correction lens. As a result, the influence of correction lens on the exposure light cannot be negligible and the apparatus is not then suitable for applications requiring higher accuracy of alignment.

Furthermore, depending upon steps in alignment mark or the conditions of duty ratio, the intensity of±first-order diffracted light becomes very low. In that case, use of higher-order diffracted light is effective. However, the size of correction lens must be increased to use the higher-order diffracted light and therefore the influence of the correction lens on the exposure light cannot be negligible. Therefore, the alignment apparatus as disclosed in U.S. Pat. No. 5,100,237 was unable to utilize the higher-order diffracted light.

The another alignment apparatus as disclosed in Japanese Patent Publication No. 1-40490 is theoretically capable of correcting the axial chromatic aberration of projection optical system by setting the correction optical system outside or inside the exposure light path between the reticle and the projection lens. The apparatus, however, had such a problem that an image of wafer mark dropped in the exposure area on reticle because of the lateral chromatic aberration of projection optical system when the image of wafer mark was seen through the projection optical system, because the wavelength of alignment light was longer than that of exposure light. It is conceivable in order to avoid this problem that a plane-parallel plate is arranged with an adjustable angle of inclination outside the exposure light path between the reticle and the projection optical system to correct the lateral chromatic aberration of projection optical system and to shift the image of wafer mark out of the exposure area. This method is not satisfactory in that the plane-parallel plate shields a part of exposure light.

Moreover, it is very difficult in respect of designing and production to achieve a projection optical system having no chromatic aberration (axial chromatic aberration and lateral chromatic aberration) for the both light beams (exposure light and alignment light) of different wavelengths in order to solve these problems. Especially, an exposure apparatus using an excimer laser source as the light source of exposure light has chromatic aberration several ten times greater than that in an exposure apparatus with exposure light which is a bright line (g-line, i-line, etc.) from a mercury lamp, because materials which can be used for the projection optical system are limited to quartz, fluorite or the like.

SUMMARY OF THE INVENTION

It is an object of the present invention, taking the above-described points into account, to provide a high-performance alignment apparatus which controls either the axial chromatic aberration or the lateral chromatic aberration of projection optical system, or the both at a time in a simple arrangement, which is simplified in arrangement of alignment optical system therein, and which minimizes loads on designing and production of projection optical system.

The lateral chromatic aberration (magnification chromatic aberration) as stated in the present invention is defined as a positional difference between a cross position where a principal ray of off-axial light with the same wavelength as that of exposure light, which forms an image on a Gaussian image plane after passing through a projection optical system, crosses the Gaussian image plane and a cross position where a principal ray of alignment light with a wavelength different from that of exposure light, which forms an image on the Gaussian image plane or, before or after the Gaussian image plane after passing through the projection optical system, crosses the Gaussian image plane.

An amount of lateral chromatic aberration $\Delta T$ is defined by the following equation:

$$\Delta T = |\delta_2 - \delta_1|,$$

where $\delta_1$ is a distance from the cross position where the principal ray of off-axial light with the same wavelength as that of exposure light, which forms an image on the Gaussian image plane after passing through the projection optical system, crosses the Gaussian image plane, to the optical axis of the projection optical system on the Gaussian image plane; and $\delta_2$ is a distance from the cross position where the principal ray of alignment light with the wavelength different from that of exposure light, which forms on or, before or after the Gaussian image plane, crosses the Gaussian image plane, to the optical axis of projection optical system on the Gaussian image plane.

An alignment apparatus according to the present invention is constructed for example as described in the first or the second embodiment (see FIGS. 1 to 23B) detailed hereinlater, which is arranged in an exposure apparatus provided with a projection optical system (3) which projects a predetermined pattern formed on a mask (2) onto a substrate (4) under exposure light, which performs relative positioning between the mask (2) and the substrate (4), which has light irradiating means (5A) for irradiating alignment light in a wavelength region different from that of exposure light onto an alignment mark ($WM_X$) formed on the substrate (4) through the projection optical system (3) and detecting means (5A) for detecting light from the alignment mark through the projection optical system (3), wherein, for alignment light as irradiation light traveling toward the alignment mark and alignment light as detection light from the alignment mark, there are provided correction optical elements for irradiation light and correction optical elements for detection light to cause axial chromatic aberration and magnification chromatic aberration in the opposite directions to axial chromatic aberration and magnification chromatic aberration of the projection optical system between the mask (2) and the substrate (4), wherein the alignment light is multi-colored light with a plurality of beams different in wavelength from each other in the wavelength region different from that of exposure light, and wherein the correction optical elements for irradiation light ($Ga_A$, $Ga_B$, $Gb_A$, $Gb_B$) or the correction optical elements for detection light ($Gc_A$, $Gc_B$) each are provided in correspondence with the plurality of beams different in wavelength.

In this case, an embodiment may be arranged such that a plurality of correction optical elements for irradiation light are provided to correct the magnification chromatic aberration of projection optical system (3) for the plurality of beams different in wavelength as the alignment light and a single correction optical element for detection light is provided for the plurality of beams different in wavelength as the alignment light.

It is preferred to set the correction optical elements for irradiation light and the correction optical element for detection light in a pupil plane of projection optical system (3).

In such arrangement of the invention, the alignment light including the multiple wave beams in the wavelength region different from that of exposure light is irradiated onto the alignment mark on the substrate through the projection optical system and the light from the alignment mark is detected through the projection optical system, causing axial chromatic aberration and magnification chromatic aberration in different degrees for the multiple wave beams in the projection optical system.

According to the present invention, with the irradiation light which is the alignment light irradiated onto the alignment mark and the detection light which is the alignment light from the alignment mark, there are provided independent of each other between the mask and the substrate, the correction optical elements for irradiation light for controlling the magnification chromatic aberration while correcting the axial chromatic aberration for the irradiation light and the correction optical elements for detection light for controlling the magnification chromatic aberration while correcting the axial chromatic aberration with necessity for the detection light for example. Conversely, there may be provided independent of each other, correction optical elements for detection light for controlling the magnification chromatic aberration while correcting the axial chromatic aberration for the detection light and correction optical elements for irradiation light for controlling the magnification chromatic aberration while correcting the axial chromatic aberration with necessity for the irradiation light for example. A correction optical element is provided in correspondence with a beam of each wavelength in the alignment light.

As so arranged, the projection optical system can be corrected in chromatic aberration for each wave beam in a relatively simple arrangement with correction optical elements even in case of multi-colored alignment light.

Also, the case that a plurality of correction optical elements for irradiation light are arranged to correct the magnification chromatic aberration of projection optical system for a plurality of beams different in wavelength constituting the alignment light and that a single correction optical element for detection light is arranged for the plurality of beams different in wavelength constituting the alignment light, means that the correction of chromatic aberration for the detection light including the plurality of beams different in wavelength is effected by a single correction optical element for detection light. This simplifies the arrangement.

The following relation is a condition for correction of chromatic aberration with a correction optical element for detection light including a plurality of beams different in wavelength in case the alignment mark is a mark of diffraction grating:

$$\Delta\lambda > (2P/W) \cdot \lambda_0,$$

where P is the pitch of gratings in the diffraction grating mark, W the width of the diffraction grating mark, $\lambda_0$ the center wavelength of the alignment light, and $\Delta\lambda$ the wavelength width of the alignment light.

The structure is simple if the correction optical elements for irradiation light and for detection light are set in the pupil plane of projection optical system.

Another alignment apparatus according to the present invention is arranged for example as shown in the third embodiment (see FIG. 24A to FIG. 31) as detailed later, which is arranged in a projection exposure apparatus for projecting a pattern formed on a mask (104) onto a substrate (106) on a stage (108, 109) two-dimensionally movable, through a projection optical system (105) under exposure light, which detects a relative positional deviation between the mask (104) and the substrate (106) with alignment light different in wavelength from the exposure light, and which has first light irradiating means (101) for irradiating in mutually different directions two coherent beams ($RB_1$, $RB_2$) different in frequency from each other as the alignment light onto a grating alignment mark (135) formed on the mask (104) and second light irradiating means (101) for irradiating in mutually different directions two coherent beams ($WB_1$, $WB_2$) different in frequency from each other as the alignment light onto a grating alignment mark (136) formed on the substrate (106) through the mask (104) and the projection optical system (105).

The apparatus according to the present invention further has irradiation light controlling means ($G1_{1A}$, $G1_{1B}$) located in regions where the two beams ($WB_1$, $WB_2$) from the second light irradiating means (101) pass on the pupil plane or on a plane in the vicinity thereof in the projection optical system (105), for controlling the axial chromatic aberration of projection optical system (105) for the beams from the second light irradiating means (101) to a predetermined value, first detecting means (101) for detecting one or more pairs of beams, each pair of beams being diffracted in the same direction by the alignment mark (135) on the mask (104), second detecting means (101) for detecting one or more pairs of beams, each pair comprising two beams diffracted in the same direction by the alignment mark (136) on the substrate (106), phase comparing means for comparing phases of detection signals obtained from the first detecting means (101) and from the second detecting means (101) to obtain a phase difference therebetween, and positional deviation detecting means for detecting a relative positional deviation amount between the mask (104) and the substrate (106), based on the phase difference obtained by the phase comparing means.

It is preferred in this case that the second detecting means (101) detects beams of zeroth-order diffracted light and second-order diffracted light diffracted in the same direction by the alignment mark (136) on the substrate (106).

In the alignment apparatus of the present invention, the two beams as the alignment light from the second light irradiating means (101) pass positions spatially separate from each other when passing through the pupil plane of projection optical system (105) or the plane close thereto. The separation increases as an angle $2\theta_W$ between the two beams becomes larger when they irradiate the alignment mark (136) on the substrate (106). Also, an angle of diffracted light emergent from the grating alignment mark (136) is proportional to the inverse of grating pitch $P_W$. For example, the following equation indicates the condition for obtaining±first-order diffracted light ($WB_1(+1)$, $WB_2(-1)$) of two beams emerging in a same direction with wavelength $\lambda$ of alignment light.

$$\sin(\theta_W) = \lambda/P_W$$

Accordingly, as the pitch of alignment mark (136) on the substrate (106) becomes finer to improve the alignment accuracy, the separation of two beams increases when they pass through the pupil plane of projection optical system (105) or the plane close thereto. Since the present invention employs the irradiation light controlling means for separately controlling the axial chromatic aberration for each of the two beams as the alignment light, the alignment accuracy can be improved without increasing the area occupied by the total irradiation light controlling means.

If the alignment apparatus excludes the correction of lateral chromatic aberration, the correction mechanism of chromatic aberration can be more simplified. Employing such simplified arrangement, a control is lost about the positions of regions where the beams entering or emerging from the alignment mark (136) on the substrate (106) pass through the mask (104). Then, a transmission window may be provided at the position determined by the lateral chromatic aberration of projection optical system (105). Similarly, the alignment apparatus omits the correction of axial chromatic aberration for the detection light from the alignment mark (136) on the substrate (106), which can be dealt with the transmission window on the mask (104) for example.

In case the second detecting means (101) detects beams composed of zeroth-order diffracted light and second-order diffracted light from the alignment mark (136) on the substrate (106), the position of alignment mark (136) can be accurately detected even if±first-order diffracted light is weak from the alignment mark (136) due to the process on the substrate (106).

Another alignment apparatus according to the present invention is arranged for example as shown in the fourth or the fifth embodiment (see FIG. 32A to FIG. 37) as detailed later, which is set in a projection exposure apparatus for projecting a pattern formed on a mask (104) onto a substrate (106) on a stage (108, 109) two-dimensionally movable, through a projection optical system (105) under exposure light, which detects a relative positional deviation between the mask (104) and the substrate (106) with alignment light of wavelength different from that of the exposure light, which has first light irradiating means (101) for irradiating in mutually different directions two coherent beams different in frequency from each other as the alignment light toward a grating alignment mark (135) formed on the mask (104), and second light irradiating means (101) for irradiating in mutually different directions two coherent beams different in frequency from each other as the alignment light toward a grating alignment mark (136) formed on the substrate (106) through the mask (104) and the projection optical system (105).

The apparatus of the invention further has irradiation light controlling means ($G3_{1A}$, $G3_{1B}$) located in regions where two beams from the second light irradiating means (101) pass on a pupil plane or a plane in the vicinity thereof in the projection optical system (105), for controlling the lateral chromatic aberration of projection optical system (105) for the beams from the second light irradiating means to a predetermined value, detection light controlling means ($G3_{1C}$, $G3_{1D}$, $G3_{1E}$) located in regions where one or more pairs of beams each pair composed of two beams diffracted in the same direction from the alignment mark (136) on the substrate (101) pass on the pupil plane or the plane close thereto in the projection optical system (105), for causing lateral chromatic aberration in a predetermined amount for the beams from the alignment mark (136) on the substrate (106), first detecting means (101) for detecting one or more pairs of beams each pair composed of two beams diffracted in the same direction by the alignment mark (135) on the mask (104), second detecting means (101) for detecting one or more pairs of beams each pair composed of two beams diffracted in the same direction by the alignment mark (136) on the substrate (106), phase comparing means for comparing phases of detection signals obtained from the first detecting means (101) and from the second detecting means (101) to obtain a phase difference therebetween, and positional deviation detecting means for detecting a relative positional deviation amount between the mask (104) and the substrate (106), based on the phase difference obtained by the phase comparing means.

It is preferable in this case that the irradiation light controlling means ($G3_{1A}$, $G3_{1B}$) also controls the axial chromatic aberration of projection optical system (105) for the beams from the second light irradiating means (101) to a predetermined value, that the detection light controlling means ($G3_{1C}$, $G3_{1D}$, $G3_{1E}$) also controls the axial chromatic aberration of projection optical system (105) for the beams from the alignment mark (136) on the substrate (106) to a predetermined value, and that the second detecting means (101) detects beams composed of zeroth-order diffracted light and second-order diffracted light diffracted in the same direction by the alignment mark (136) on the substrate (106).

Since this alignment apparatus is so arranged that the chromatic aberration controlling means is provided for controlling the lateral chromatic aberration for both the beams (irradiation light) irradiated toward the alignment mark (136) on the substrate (106) and the beams (detection light) emerging from the alignment mark (136), the position where the alignment light passes through the mask (104) can be set outside the exposure region and the position of alignment mark (136) on the substrate (106) can be set in the exposure area. This permits the mask (104) to have a shielding zone for preventing the exposure light from impinging on the alignment mark (136) on the substrate (106), and can reduce the number of changes of alignment mark for layers (circuit pattern layers) on the substrate (106).

Also, since a control amount of the lateral chromatic aberration is freely adjustable, loads can be relieved on designing and production of projection optical system (105).

Further, both the axial chromatic aberration and the lateral chromatic aberration can be controlled in the case in which the irradiation light controlling means ($G3_{1A}$, $G3_{1B}$) also controls the axial chromatic aberration of projection optical system (105) for the beams from the second light irradiating means (101) to a predetermined value, the detection light controlling means ($G3_{1C}$, $G3_{1D}$, $G3_{1E}$) also controls the axial chromatic aberration of projection optical system (105) for the beams from the alignment mark (136) on the substrate (106) to a predetermined value, and the second detecting means (101) detects the beams composed of zeroth-order diffracted light and second-order diffracted light diffracted in the same direction by the alignment mark (136) on the substrate (106).

Also, since the beams composed of zeroth-order diffracted light and second-order diffracted light are detected, the position of alignment mark (136) can be accurately detected even if the ±first-order diffracted light from the alignment mark (136) is weak due to the process on the substrate (106).

Another alignment apparatus according to the present invention is arranged for example as shown in the sixth embodiment (see FIG. 38A to FIG. 43) as detailed later, which is set in a projection exposure apparatus for projecting a pattern formed on a mask (204) onto a substrate (206) on a stage (208, 209) two-dimensionally movable, through a projection optical system (205) under exposure light, which detects a relative positional deviation between the mask (204) and the substrate (206) with alignment light of wavelength different from that of exposure light, which has first light irradiating means (201) for irradiating in mutually different directions two coherent beams ($RB_1$, $RB_2$) different $\Delta f_1$ in frequency from each other as the alignment light toward the grating alignment mark (236) formed on the mask (204), second light irradiating means for irradiating in mutually different directions two coherent beams ($RB_3$, $RB_4$) different $\Delta f_2$, which is different from $\Delta f_1$, in frequency from each other as the alignment light toward the grating alignment mark (236) formed on the mask (204), third light irradiating means (201) for irradiating in mutually different directions two coherent beams ($WB_1$, $WB_2$) different $\Delta f_1$ in frequency from each other as the alignment light toward a grating alignment mark (237) formed on the substrate (206) through the mask (204) and the projection optical system (205), fourth light irradiating means (201) for irradiating in mutually different directions two coherent beams ($WB_3$, $WB_4$) different $\Delta f_2$ in frequency from each other as the alignment light toward the grating alignment mark (237) formed on the substrate (206) through the mask (204) and the projection optical system (205).

The apparatus of the present invention further has irradiation light controlling means ($G1_{1A}$ to $G1_{1D}$) located in regions where the two beams from the third light irradiating means and the two beams from the fourth light irradiating means pass on the pupil plane or a plane in the vicinity thereof in the projection optical system (205), for controlling the axial chromatic aberration of projection optical system (205) for the beams from the third light irradiating means and the beams from the fourth light irradiating means to respectively predetermined values, first detecting means (201) for detecting two or more pairs of beams ($RB_1(+1)$, $RB_2(-1)$ and $RB_3(+2)$, $RB_4(-2)$) each pair composed of two beams diffracted in the same direction by the alignment mark (236) on the mask (204), second detecting means (201) for detecting two or more pairs of beams ($WB_1(+1)$, $WB_2(-1)$ and $WB_3(+2)$, $WB_4(-2)$) each pair composed of two beams diffracted in the same direction by the alignment mark (237) on the substrate (206), first phase comparing means (253) for comparing phases of components with frequency $\Delta f_1$ in detection signals obtained from the first detecting means and from the second detecting means with each other, second phase comparing means (254) for comparing phases of components with frequency $\Delta f_2$ in detection signals obtained from the first detecting means and from the second detecting means with each other, and positional deviation detecting means (257) for detecting a relative positional deviation amount between the mask (204) and the substrate (206), based on phase differences respectively obtained by the two phase comparing means.

In this case, the direction of measurement with two beams ($WB_1$, $WB_2$) irradiated from the third light irradiating means onto the alignment mark (237) on the substrate (206) may be set perpendicular to that with two beams ($WB_3$, $WB_4$) irradiated from the fourth light irradiating means onto the alignment mark (247) on the substrate (206).

In the alignment apparatus of the present invention as so arranged, two beams as one pair alignment light pass two different positions spatially separate from each other when passing the pupil plane of projection optical system (205) or the plane close thereto. The separation increases as an angle θ between the two beams increases upon irradiation onto the alignment mark (237) on the substrate (206). Also, an angle of diffracted light emerging from the grating alignment mark (237) changes in proportion with the inverse of the grating pitch P. For example, the following relation represents a condition of incident angle $\theta_1$ between the two beams for producing two beams of±first-order diffracted light emerging in the same direction with wavelength $\lambda$ of alignment light.

$$\sin(\theta_1/2) = \lambda/P$$

Further, the following relation represents the condition of incident angle $\theta_2$ between the two beams into the alignment mark (237) for producing two beams of±second-order diffracted light emerging in the same direction.

$$\sin(\theta_2/2) = 2\lambda/P$$

Therefore, the separation between the two beams is doubled when the two beams pass near the pupil plane of projection optical system (205). If a correction lens were used at the pupil plane, the diameter of lens must have been doubled as compared with that in case of detection only with±first-order diffracted light and the area could have been four times.

In contrast, since the chromatic aberration controlling means controls the chromatic aberration in the present invention, the number of chromatic aberration controlling means is just increased depending upon the number of pairs of alignment light ($WB_1$, $WB_2$ and $WB_3$, $WB_4$) each pair composed of two beams. Accordingly, each chromatic aberration controlling means has a same area, and then in case of two pairs of alignment light, the total area of chromatic aberration controlling means is only a double of that in case of one pair. In that arrangement, a first positional deviation is obtained between the mask (204) and the substrate (206) from a difference between a position of mask (204) detected with first mask-side double beams ($RB_1$, $RB_2$) and a position of substrate (206) detected with first substrate-side double beams ($WB_1$, $WB_2$), and a second positional deviation is obtained between the mask (204) and the substrate (206) from a difference between a position of mask (204) detected with second mask-side double beams ($RB_3$, $RB_4$) and a position of substrate (206) detected with second substrate-side double beams ($WB_3$, $WB_4$). Then the positional deviation detecting means calculates for example a weighted average of the thus obtained positional deviations, so that the positional deviation can be accurately obtained between the mask (204) and the substrate (206) even if the±first-order diffracted light is weak from the alignment mark (237) on the substrate (206).

Also, in case the direction of measurement on the substrate (206) with the first double beams ($WB_1$, $WB_2$) is perpendicular to that on the substrate (206) with the second double beams ($WB_3$, $WB_4$), just one alignment apparatus can detect both amounts of X-directional and Y-directional positional deviations at a time for example.

In this case, the axial chromatic aberration of projection optical system (205) can be controlled for alignment light irradiated toward the alignment mark on the substrate (206), so that many parts can be used in common to the light irradiating means for irradiating alignment light toward the alignment mark on the mask (204) and the light irradiating means for irradiating alignment light toward the alignment mark on the substrate (206).

Another alignment apparatus according to the present invention is arranged for example as shown in the eighth embodiment (see FIG. 48A to FIG. 51) as detailed later, which is set in a projection exposure apparatus for projecting a pattern formed on a mask (204) onto a substrate (206) on a stage (208, 209) two-dimensionally movable, through a projection optical system (205) under exposure light, which detects a relative positional deviation between the mask (204) and the substrate (206) with alignment light of wavelength different from that of exposure light, which has first light irradiating means (201) for irradiating in mutually different directions two coherent beams ($RB_1$, $RB_2$) different $\Delta f_1$ in frequency from each other as the alignment light toward a grating alignment mark (241) formed on the mask (204), second light irradiating means (201) for irradiating in mutually different directions two coherent beams ($RB_3$, $RB_4$) different $\Delta f_2$, which is different from $\Delta f_1$, in frequency from each other as the alignment light toward the grating alignment mark (241) formed on the mask (204), third light irradiating means (201) for irradiating in mutually different directions two coherent beams ($WB_1$, $WB_2$) different $\Delta f_1$ in frequency from each other as the alignment light toward a grating alignment mark (237) formed on the substrate (206) through the mask (204) and the projection optical system (205), and fourth light irradiating means (201) for irradiating in mutually different directions two coherent beams ($WB_3$, $WB_4$) different $\Delta f_2$ in frequency from each other as the alignment light toward the grating alignment mark (237) formed on the substrate (206) through the mask (206) and the projection optical system (205).

The apparatus of the present invention further has irradiation light controlling means ($G3_{1A}$ to $G3_{1D}$) located in regions where double beams from the third light irradiating means and double beams from the fourth light irradiating means pass on the pupil plane or on a plane in the vicinity thereof in the projection optical system (205), for controlling the lateral chromatic aberration of projection optical system (205) for the beams from the third light irradiating means and the beams from the fourth light irradiating means to respectively predetermined values, detection light controlling means ($G3_{1E}$) located in a region where two or more pairs of beams each pair comprised of double beams diffracted in the same direction from the alignment mark (235) on the substrate (206), for causing a predetermined amount of lateral chromatic aberration for each beam from the alignment mark (237) on the substrate (206), first detecting means (201) for detecting two or more pairs of beams ($RB_1(+1)$, $RB_2(-1)$ and $RB_3(+2)$, $RB_4(-2)$) each pair comprised of double beams diffracted in the same direction by the alignment mark (241) on the mask (204), second detecting means (201) for detecting two or more pairs of beams ($WB_1(+1)$, $WB_2(-1)$ and $WB_3(+2)$, $WB_4(-2)$) each pair composed of double beams diffracted in the same direction by the alignment mark (237) on the substrate (206), first phase comparing means for comparing phases of components with frequency $\Delta f_1$ in detection signals obtained from the first detecting means and from the second detecting means, second phase comparing means for comparing phases of components with frequency $\Delta f_2$ in detection signals obtained from the first detecting means and from the second detecting means, and positional deviation detecting means for detecting a relative positional deviation amount between the mask (204) and the substrate (206), based on phase differences obtained by the two phase comparing means.

It is preferable in this case that the irradiation light controlling means also controls the axial chromatic aberration of projection optical system (205) for the beams from the third light irradiating means and the beams from the fourth light irradiating means to respectively predetermined values, and the detection light controlling means also controls the axial chromatic aberration of projection optical system (205) for the beams from the alignment mark (237) on the substrate (206).

It is also possible that the direction of measurement with double beams irradiated from the third light irradiating means onto the alignment mark (237) on the substrate (206) is perpendicular to that with double beams irradiated from the fourth light irradiating means onto the alignment mark (237) on the substrate (206).

In this alignment apparatus, the means for controlling the lateral chromatic aberration of projection optical system (205) is provided both for the irradiation light toward the alignment mark on the substrate (206) and for the detection light from the alignment mark. Then, the point where the alignment light passes through the mask (204) can be set outside the exposure area and the alignment mark on the substrate (206) within the exposure area therein. This arrangement permits the mask (204) to have a shielding zone for preventing the exposure light from impinging on the alignment mark on the substrate (206), and the number of changes of alignment mark for layers on the substrate (206) can be reduced. Also, since a control amount of the lateral chromatic aberration is freely adjustable, a load may be relieved on designing of projection optical system.

In this case, if the apparatus is further provided with a function to control the axial chromatic aberration, many parts may be used in common to the optical system of alignment light for mask (204) and the optical system of alignment light for substrate (206).

Also in this case, if the direction of measurement on the substrate (206) with the first double beams ($WB_1$, $WB_2$) is perpendicular to the direction of measurement on the substrate (206) with the second double beams ($WB_3$, $WB_4$) one alignment apparatus can detect both amounts of X-directional and Y-directional positional deviations at a time for example.

The alignment apparatus of the present invention can be applied not only to the TTR method (which is a method for alignment with alignment light passing both through the reticle and the projection optical system) as shown in the first to ninth embodiments detailed below, but also to the TTL method (which is a method for alignment with alignment light passing only through the projection optical system) in a narrow sense as shown in the tenth embodiment as detailed below.

Also, the present invention will be described mainly with the embodiments of alignment apparatus utilizing the heterodyning technique, but the invention can be also applied to alignment apparatus employing the homodyne method.

Further, an optical element for chromatic aberration correction employed in the present invention is mainly described as a diffraction grating in the following embodiments, but it is not limited to the diffraction grating. Various optical elements may be employed as long as they can change (deflect) the traveling direction of incident light (alignment light).

BRIEF DESCRIPTION OF THE DRAWINGS

FIG. 24A is a scheme as seen along the X direction to show the construction of the third embodiment of the present invention;

FIG. 24B is a scheme as seen along the Y direction to show the construction of the third embodiment of the present invention;

FIG. 29A is a scheme as seen along the X direction to show the construction of alignment optical system in the third embodiment;

FIG. 29B is a scheme as seen along the Y direction to show the construction of alignment optical system in the third embodiment;

FIG. 29C is a scheme as seen from the bottom (along the Z direction) to show the major part of the alignment optical system shown in FIG. 29B;

FIG. 32A is a scheme as seen along the X direction to show the construction of the fourth embodiment of the present invention;

FIG. 32B is a scheme as seen along the Y direction to show the construction of the fourth embodiment of the present invention;

FIG. 34A is a scheme as seen along the X direction to show the construction of the fifth embodiment of the present invention;

FIG. 34B is a scheme as seen along the Y direction to show the construction of the fifth embodiment of the present invention;

FIG. 36A is a scheme as seen along the X direction to show the construction of alignment optical system in the fifth embodiment;

FIG. 36B is a scheme as seen along the Y direction to show the construction of alignment optical system in the fifth embodiment;

FIG. 36C is a scheme as seen from the bottom (along the Z direction) to show the major part of the alignment optical system shown in FIG. 36B;

FIG. 38A is a scheme as seen along the X direction to show the construction of the sixth embodiment of the present invention;

FIG. 38B is a scheme as seen along the Y direction to show the construction of the sixth embodiment of the present invention;

FIG. 46A is a scheme as seen along the X direction to show the construction of the seventh embodiment of the present invention;

FIG. 46B is a scheme as seen along the Y direction to show the construction of the seventh embodiment of the present invention;

FIG. 49A is a scheme as seen along the X direction to show the construction of an alignment optical system in the eighth embodiment;

FIG. 49B is a scheme as seen along the Y direction to show the construction of the alignment optical system in the eighth embodiment;

FIG. 49C is a scheme as seen from the bottom (along the Z direction) to show the major part of the alignment optical system shown in FIG. 49B;

FIG. 53 is an enlarged plan view of major part to show an example of shape of reticle mark and reticle window in the ninth embodiment, and an alignment light transmitting portion;

FIG. 54 is an enlarged plan view of major part to show an example of shape of wafer mark in the ninth embodiment, and an alignment light irradiating portion;

DESCRIPTION OF THE PREFERRED EMBODIMENTS

Embodiment 1

The first embodiment of alignment apparatus according to the present invention will be described referring to FIG. 1 to FIG. 11. The present invention is applied to an alignment system for projection exposure apparatus in this example. In this example, alignment light is formed as multi-colored light including two beams with respective wavelengths $\lambda_A$ and $\lambda_B$ in a wavelength range different from that of exposure light, and a chromatic aberration control plate is provided on the pupil plane (Fourier transform plane) of projection optical system and has correction optical elements therein for correcting both the magnification chromatic aberration and the axial chromatic aberration, or either one of them caused by the projection optical system for the two wave beams.

The present embodiment is an example provided with four alignment systems. Each alignment system is so arranged that each couple of two laser beams (double beams) are irradiated with a certain cross angle onto an alignment mark formed on a semiconductor wafer or the like and that interference light between diffracted light beams emerges in a nearly same direction from the alignment mark to be photoelectrically detected. Further, the above two laser beams in each couple have a predetermined frequency difference (for example about 50 kHz) therebetween, with which a positional deviation between a mask (or a reticle) and a wafer is detected by the so-called heterodyning technique.

Figure 1:
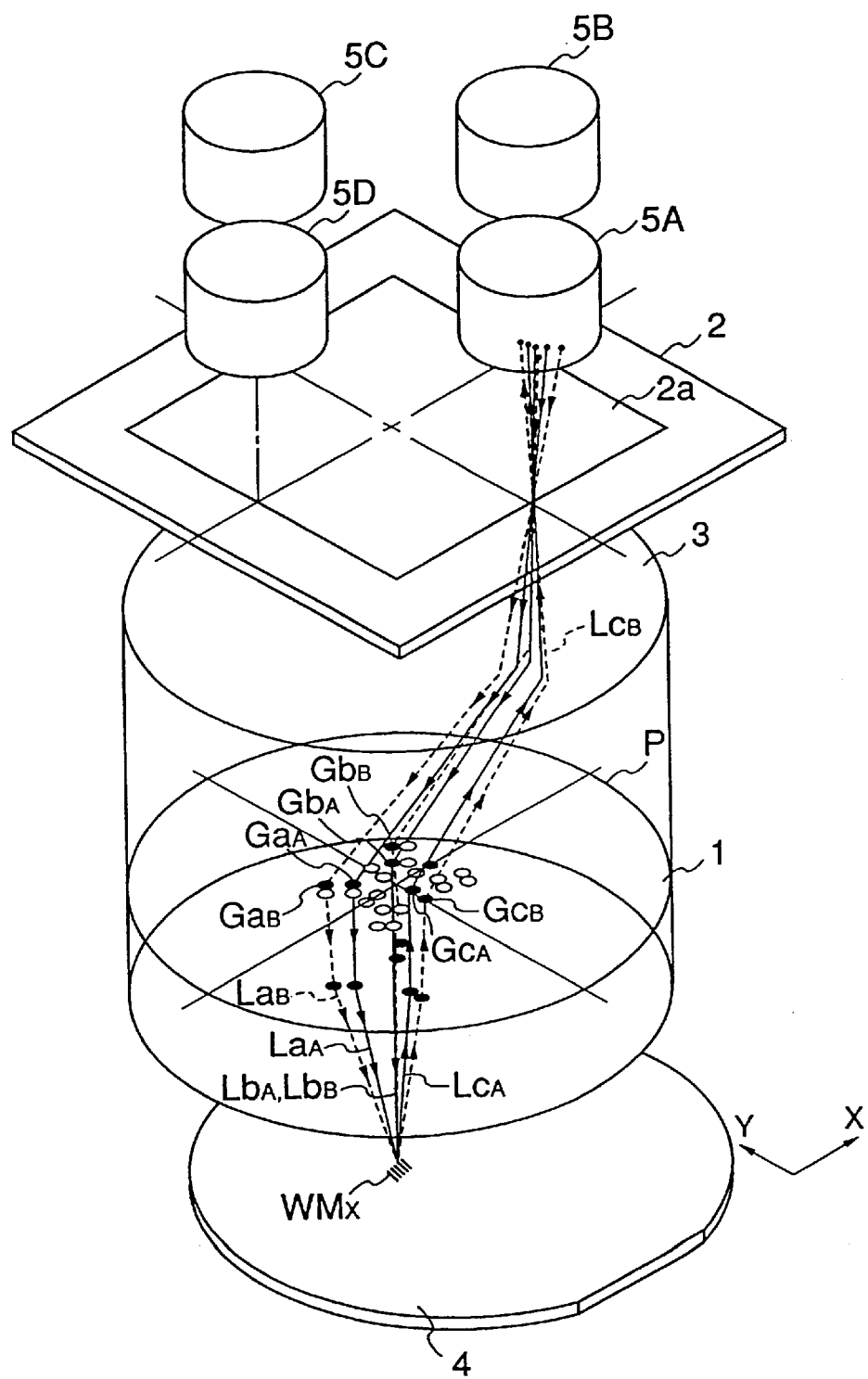
FIG. 1 is a scheme to show the structure of the first embodiment of the present invention.

FIG. 1 schematically shows the construction of alignment apparatus in the present embodiment together with an exposure apparatus. As described above, the present embodiment is provided with four sets of alignment systems consisting of four alignment optical systems 5A to 5D arranged perpendicular to each other on the XY coordinate plane and correction optical element groups for chromatic aberration correction (as detailed later) corresponding to the alignment optical systems 5A to 5D, respectively. Since the alignment systems have theoretically the same structure, only an alignment system related to the alignment optical system 5A is shown as representative.

First, the exposure apparatus guides exposure light emitted from an illumination optical system (not shown) to irradiate a pattern area 2a in a reticle 2 and further guides the exposure light (pattern light) passing through the pattern area 2a through a projection optical system 3 to project an image thereof onto a semiconductor wafer 4.

In case of multi-colored alignment light with two wavelength beams, the alignment optical system 5A produces beams for alignment detection (alignment light) from laser beams with predetermined wavelengths $\lambda_A$ and $\lambda_B$ different from each other (i.e., $\lambda_B \neq \lambda_A$). As detailed later, the laser beam with wavelength $\lambda_A$ is modified to provide two beams of alignment light (a pair of alignment light beams) different a predetermined frequency difference from each other, and the other laser beam with wavelength $\lambda_B$ another two beams of alignment light (another pair of alignment light beams) different another predetermined frequency difference from each other. Accordingly, in case the light beams with two wavelengths are multi-colored, four alignment beams are formed in total including the two alignment light beams (double beams) from the laser beam of wavelength $\lambda_A$ and the two alignment light beams (double beams) from the laser beam of wavelength $\lambda_B$.

While these alignment beams are irradiated onto the alignment mark formed at a predetermined position on the peripheral portion outside the pattern area 2a in reticle 2 (hereinafter referred to as a reticle mark), they are also irradiated onto an alignment mark on wafer 4 (hereinafter referred to as a wafer mark) through the projection optical system 3 as passing through a light transmission window portion (reticle window) as described below, which is also provided next to the reticle mark.

In FIG. 1, the alignment beams irradiated onto the reticle mark are omitted, whereas, among the alignment beams irradiated onto the wafer mark $WM_X$, the two beams of alignment light $La_A$ and $Lb_A$ represented by arrowed solid lines correspond to a pair of alignment light beams formed from the laser beam with wavelength $\lambda_A$ and the two beams of alignment light $La_B$ and $Lb_B$ represented by arrowed dot lines to another pair of alignment light beams formed from the laser beam with wavelength $\lambda_B$.

Further, the alignment optical system 5A receives interference light caused by diffraction and reflection on the reticle mark (not shown) (as will be referred to as reticle detection light) and interference light caused by diffraction and reflection on the wafer mark $WM_X$ (as will be referred to as wafer detection light), and analyzes a phase difference between the reticle detection light and the wafer detection light to obtain an amount of positional deviation between the reticle 2 and the wafer 4. In FIG. 1, an arrowed solid line $Lc_A$ represents the wafer detection light caused by diffraction and reflection on the wafer mark $WM_X$ from the alignment light beams $La_A$ and $Lb_A$, and an arrowed dot line $Lc_B$ the wafer detection light caused by diffraction and reflection on the wafer mark $WM_X$ from the alignment light beams $La_B$ and $Lb_B$.

Further, there are correction optical elements $Ga_A$, $Gb_A$ and $Ga_B$, $Gb_B$ set on the pupil plane P of projection optical system 3 and in respective optical paths of alignment light beams (wafer irradiation light) in order to correct both the magnification chromatic aberration and the axial chromatic aberration, or either one of them for the alignment light beams $La_A$, $Lb_A$ and $La_B$, $Lb_B$ (the alignment light irradiated onto the wafer mark will be called as wafer irradiation light). Similarly, there are correction optical elements $Gc_A$ and $Gc_B$ set on the pupil plane P and in respective optical paths of wafer detection light beams $Lc_A$ and $Lc_B$ in order to correct both the magnification chromatic aberration and the axial chromatic aberration, or either one of them for the wafer detection light beams $Lc_A$ and $Lc_B$. The correction optical elements $Ga_A$, $Gb_A$, $Ga_B$, $Gb_B$, $Gc_A$, $Gc_B$ are formed on a transparent plane plate glass to constitute a chromatic aberration control plate 1. The chromatic aberration control plate 1 is interposed at the pupil plane P to correct the above chromatic aberration.

Although FIG. 1 shows only the correction optical element group and the specific wafer mark $WM_X$ related to the alignment optical system 5A, the other alignment systems are similarly constructed with correction optical element groups and specific wafer marks respectively related to the remaining alignment optical systems 5B to 5D. In case more alignment systems are provided, each alignment system is also constructed in the same manner. Further, although the above example describes a case in which the alignment light is multi-colored with two beams of wavelengths $\lambda_A$ and $\lambda_B$, more beams with wavelengths $\lambda_A$, $\lambda_B$, $\lambda_C$, $\lambda_D$, . . . may also be employed while multi-colored by forming double beams of alignment light for each beam of wavelength.

Figure 2:
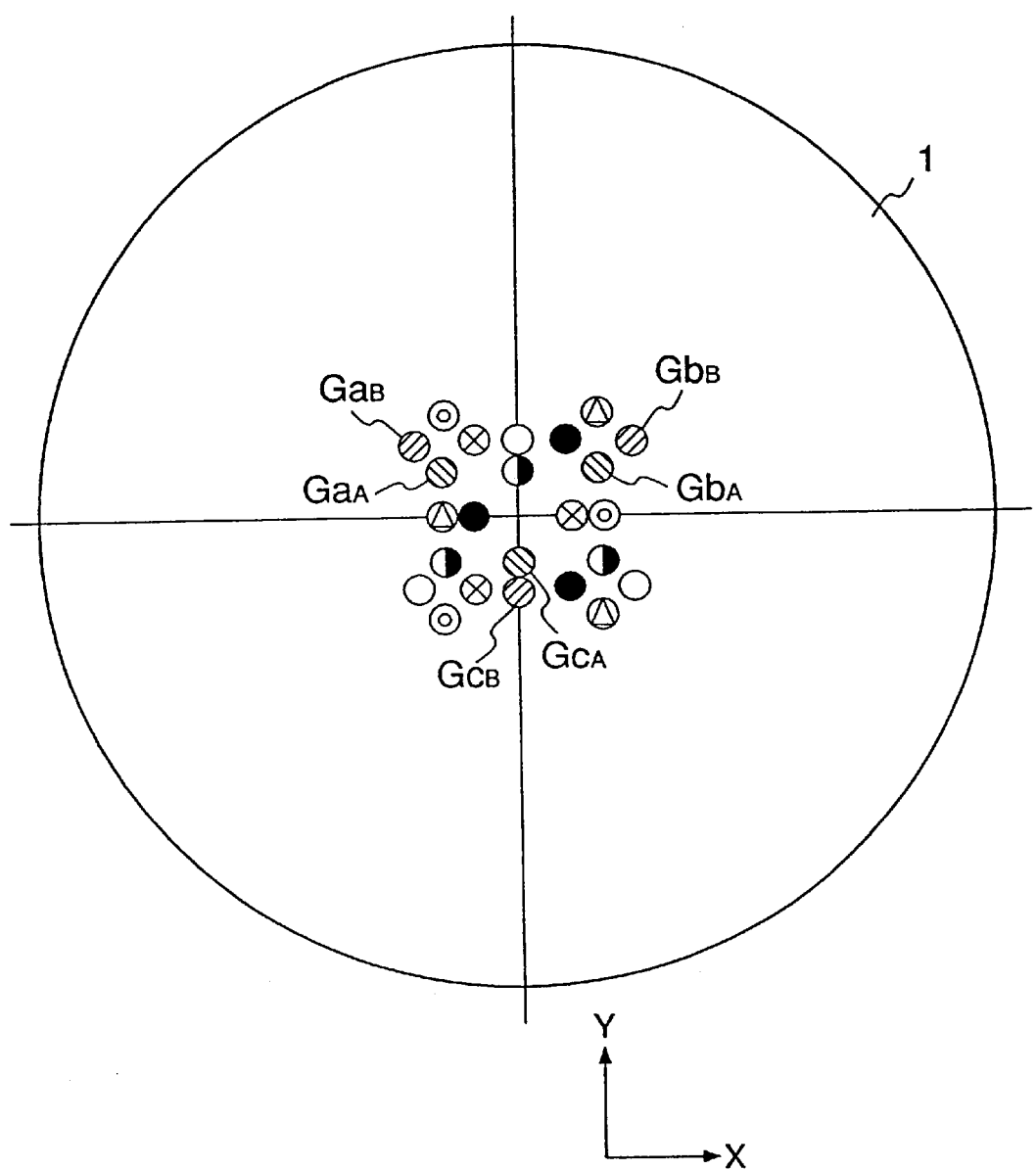
FIG. 2 is a plan view to show a layout of chromatic aberration correcting elements formed on a chromatic aberration control plate in the first embodiment.

FIG. 2 shows an example of layout of correction optical element groups in case of four sets of alignment systems, i.e., in case of the alignment optical systems 5A to 5D each employing alignment light multi-colored from beams with two wavelengths $\lambda_A$, $\lambda_B$. Accordingly, each alignment optical system forms four beams of alignment light from beams with two wavelengths $\lambda_A$, $\lambda_B$ and performs alignment based on two beams of detection light, so that each alignment system has a group of six correction optical elements for the six beams. Therefore, FIG. 2 shows an example in which the total number of correction optical elements is 6×4=24. This example is next described in detail.

In FIG. 2, twenty four small circular marks show the arrangement (positional) relation of correction optical elements for effecting correction of chromatic aberration for the alignment light (wafer irradiation light) irradiated from the projection optical system 3 onto the wafer mark on wafer 4 and for the alignment light (wafer detection light) diffracted by the wafer mark on wafer 4 to return to the projection optical system 3. These correction optical elements may be phase gratings.

These twenty four correction optical elements are assigned to the beams of two wavelengths $\lambda_A$ and $\lambda_B$ as twelve each. In the following description, subscript A is given to each of the twelve correction optical elements for wavelength $\lambda_A$ (as defined as A group) while subscript B to each of the twelve correction optical elements for wavelength $\lambda_B$ (as defined as B group), whereby the two groups of correction optical elements are discriminated from each other. In this example, an amount of magnification chromatic aberration by the correction optical elements in A group is different from that by those in B group. The alignment optical system 5A will be described as representative together with six correction optical elements employed in the alignment system corresponding thereto.

In FIG. 2, the correction optical elements $Ga_A$ and $Gb_A$ arranged symmetric with respect to the Y axis correct the chromatic aberration of two wafer irradiation beams with wavelength $\lambda_A$ irradiated onto the wafer mark on wafer, and the correction optical element $Gc_A$ on the Y axis corrects the chromatic aberration of a wafer detection light beam from the wafer mark (interference light between two diffracted beams). Also, the correction optical elements $Ga_B$ and $Gb_B$ arranged symmetric with respect to the Y axis and outside the correction optical elements $Ga_A$ and $Gb_A$ correct the chromatic aberration of two wafer irradiation light beams with wavelength $\lambda_B$ irradiated onto the wafer mark on wafer, and the correction optical element $Gc_B$ on the Y axis corrects the chromatic aberration of a wafer detection light beam from the wafer mark. Thus, the correction of chromatic aberration is effected by the six correction optical elements for the alignment light (irradiation light and detection light) on one wafer mark on the wafer.

Since there are the twenty four correction optical elements provided in this example, the chromatic aberration correction can be simultaneously effected on the alignment light for four wafer marks in total. Also, three correction optical elements denoted by the same symbol has a function of chromatic aberration correction corresponding to one wafer mark.

In FIG. 1, solid ellipses on the chromatic aberration control plate 1 represent the correction optical elements $Ga_A$, $Gb_A$, $Ga_B$, $Gb_B$, $Gc_A$, $Gc_B$ related to the alignment optical system 5A. Then, when the two beams of irradiation light $La_A$ and $Lb_A$ with wavelength $\lambda_A$ emitted from the alignment optical system 5A pass through the correction optical elements $Ga_A$ and $Gb_A$, respectively, they are corrected in chromatic aberration and thereafter irradiated onto the wafer mark $WM_X$. Two beams of diffracted light (for example±first-order diffracted light) emerge in a nearly same direction from the wafer mark $WM_X$ as forming detection light of wavelength $\lambda_A$, which is beat interference light between the two emergent beams. When the detection light passes through the correction optical element $Gc_A$, it is corrected in chromatic aberration then to return to the alignment optical system 5A. Similarly, while the two beams of irradiation light $La_B$ and $Lb_B$ with wavelength $\lambda_B$ emitted from the alignment optical system 5A are respectively corrected in chromatic aberration by the correction optical elements $Ga_B$ and $Gb_B$, they impinge on the wafer mark $WM_X$ to produce detection light of wavelength $\lambda_B$, which is beat interference light emergent from the wafer mark $WM_X$. The detection light is corrected in chromatic aberration by the correction optical element $Gc_B$ then to return to the alignment optical system 5A.

Figure 3A:
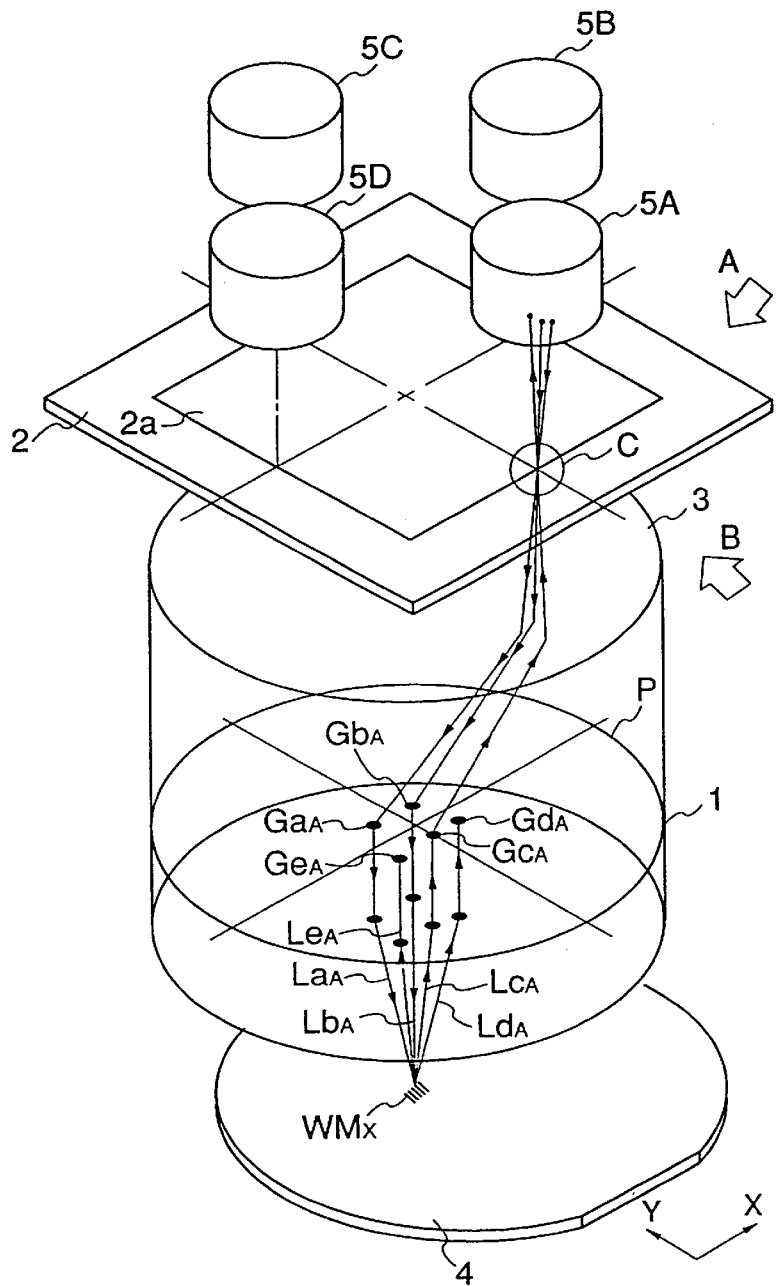
FIG. 3A is a scheme to further illustrate the structure of the first embodiment.
Figure 3B:
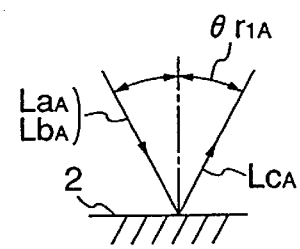
FIG. 3B is an illustration to illustrate a function of reticle mark in the first embodiment.
Figure 3C:
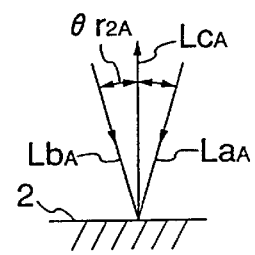
FIG. 3C is an illustration to further illustrate the function of reticle mark in the first embodiment.
Figure 3D:
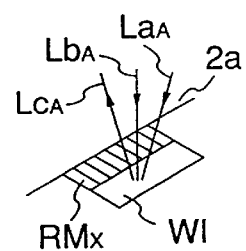
FIG. 3D is an illustration to illustrate an example of shape of reticle mark and reticle window in the first embodiment.

Next described referring to FIG. 3A to FIG. 3D is a state of inclination of the alignment light in FIG. 1. FIG. 3A representatively shows only optical paths for the alignment light of wavelength $\lambda_A$ in FIG. 1. The alignment light of wavelength $\lambda_B$ is the same in theory as the alignment light of wavelength $\lambda_A$ and therefore is omitted herein. There are juxtaposed a diffraction grating mark $RM_X$ as the reticle mark and a transmission window WI (hereinafter referred to as a reticle window) for permitting the irradiation beams $La_A$, $Lb_A$ toward the wafer mark $WM_X$ and the detection light $Lc_A$ from the wafer mark $WM_X$ to pass therethrough, as shown in FIG. 3D, in the region C in the vicinity of the pattern area 2a on reticle 2 below the alignment optical system 5A in FIG. 3A. The direction of position measurement is the sagittal direction of projection optical system 3. Similarly, a window and a reticle mark are formed on the reticle 2 below each of the other alignment optical systems 5B to 5D.

FIG. 3B shows a state of inclination of the alignment light (irradiation light and detection light) as seen in the direction of arrow A in FIG. 3A. As shown in FIG. 3B, the irradiation light beams $La_A$, $Lb_A$ outgoing from the alignment optical system 5A and the detection light beam $Lc_A$ going into the alignment optical system 5A are inclined at angle $\theta r_{1A}$ in the meridional direction of projection optical system 3. The angle $\theta r_{1A}$ is expressed by the following equation with a distance $M_A$ in unit of numerical aperture from the center of optical axis on the pupil plane (Fourier transform plane) P in projection optical system 3 (as called as pupil coordinates) and a demagnification $\alpha$ of the projection optical system 3.

$$\theta r_{1A} = \sin^{-1}(M_A/\alpha)$$

Also, FIG. 3C shows a state of inclination of alignment light as seen in the direction of arrow B in FIG. 3A. As shown in FIG. 3C, the irradiation light beams $La_A$, $Lb_A$ outgoing from the alignment optical system 5A are inclined at angle $\theta r_{2A}$ in the sagittal direction of projection optical system 3. The inclination angle $\theta r_{2A}$ in the sagittal direction is expressed by the following equation with grating pitch p of wafer mark $WM_X$ and wavelength $\lambda_A$ of alignment light.

$$\theta r_{2A} \times \alpha = \sin^{-1}(\lambda_A/P)$$

Further, there exists the following relation with a distance M' in unit of numerical aperture on the pupil plane between two correction optical elements $Ga_A$ and $Gb_A$ for the two irradiation beams.

$$M'/2 = \sin(\theta r_{2A} \times \alpha)$$

The other twelve correction optical elements in group B in FIG. 2 are the same in function as those in group A as described above, but the wavelength of alignment light (irradiation light and detection light) for group B is different from that for group A. Therefore, the grating pitch $P_R$ of the correction optical elements for group B is different from that for group A. As a result, the correction optical elements for group B (denoted with subscript B) are located at different positions from those for group A (denoted with subscript A) on the pupil plane, as shown in FIG. 2.

Then, beams of alignment light with wavelength $\lambda_B$ have inclination angle $\theta r_{2B}$ in the meridional direction different from that of the beams with wavelength $\lambda_A$. Since the wavelengths are different from each other as $\lambda_B$ and $\lambda_A$, the diffraction conditions are different between them on the diffraction grating mark of alignment mark $WM_X$ on wafer and the beams with wavelength $\lambda_B$ are also inclined at angle $\theta r_{2B}$ in the sagittal direction. The same relation as described above holds between the wavelength $\lambda_B$ and the inclination angle $\theta r_{2B}$.

The structure of alignment optical system in this example is now described in detail with reference to FIG. 4.

Figure 4:
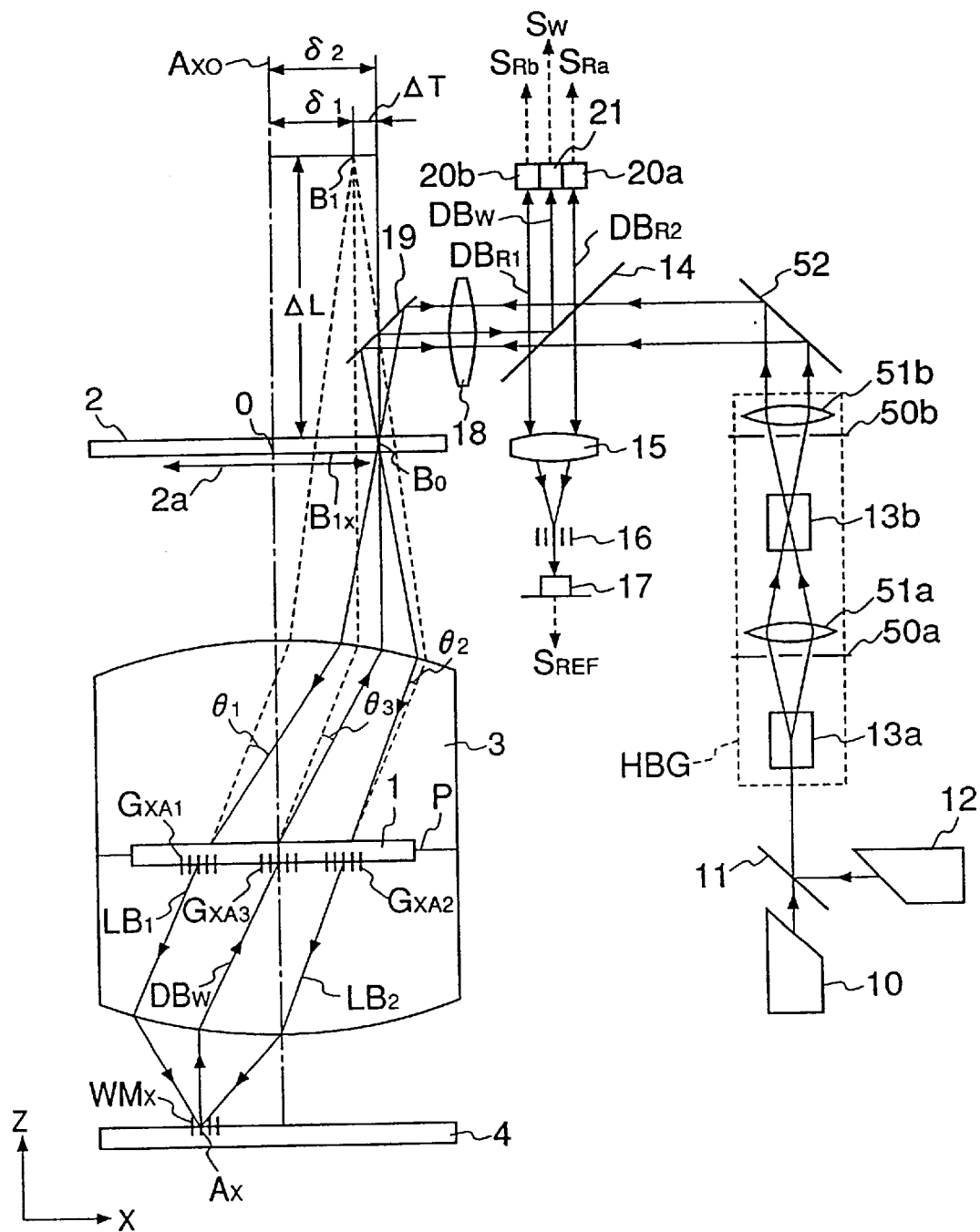
FIG. 4 is a scheme as seen along the Y direction to show the overall construction of the first embodiment including the construction of alignment optical system.

FIG. 4 shows the construction of projection optical system and one alignment optical system in the projection exposure apparatus in this example. In FIG. 4, the reticle 2 with a certain circuit pattern formed thereon and the wafer 4 are disposed conjugate with each other with respect to the projection optical system 3 under exposure light, and the reticle 2 and the wafer 4 each are held on an unrepresented stage two-dimensionally movable. An illumination optical system is set above the reticle 2 though not shown. The illumination optical system emits exposure light, for example an excimer laser beam (KrF laser beam with wavelength of 249 nm or ArF laser beam with wavelength of 193 nm) to uniformly illuminate the reticle 2, and the circuit pattern on the reticle 2 is transferred onto the wafer 4 through the projection optical system 1.

The projection optical system 3 is telecentric both on the reticle side and on the wafer side and is well corrected in chromatic aberration for the excimer laser beam as the exposure light. Diffraction grating marks $RM_X$ and $WM_X$ for alignment, which are the reticle mark and the wafer mark, respectively, are formed on the reticle and on the wafer 4, respectively.

The wafer 4 is fixed on the unrepresented stage two-dimensionally moving in the step-and-repeat method. After transfer exposure of reticle 2 is completed for one shot area (exposure area) on the wafer 4, the wafer 4 steps to a next shot position. Fixed on a part of the unrepresented reticle stage is a moving mirror for reflecting a laser beam from a laser beam interference distance-measuring device (hereinafter referred to as "interferometer") for detecting a position in the X direction, in the Y direction and in the rotational direction ($\theta$) in the horizontal plane of reticle 2. The interferometer uses three measurement laser beams for independently detecting X-directional, Y-directional and $\theta$-directional positions, which are omitted to show herein for simplicity of illustration. A movement stroke of the reticle stage is less than several millimeters, and the detection resolution of interferometer is set for example at about 0.01 $\mu$m.

Also fixed on a part of the unrepresented wafer stage is a moving mirror for reflecting a laser beam from an interferometer for detecting X-directional and Y-directional positions on the horizontal plane of wafer 4. This interferometer also uses two measurement laser beams for independently detecting X-directional and Y-directional positions, which are omitted to show herein for simplicity of illustration. The reticle stage is driven in the X direction, in the Y direction and in the $\theta$ direction by an unrepresented drive motor and the wafer stage is two-dimensionally moved by a drive motor independent of the drive motor for reticle stage.

The chromatic aberration control plate 1 is set on the pupil plane P of projection optical system 3 in this example and the twenty four correction optical elements shown in FIG. 2 are formed on the control plate 1. For convenience sake of description, FIG. 4 shows three sets of correction optical elements $G_{XA1}$ to $G_{XA3}$ representing the six correction optical elements for the alignment light (wavelengths $\lambda_A$, $\lambda_B$) for detecting the wafer mark $WM_X$ related to the alignment optical system 5A out of the twenty four correction optical elements. The correction optical element $G_{XA1}$ corresponds to the two correction optical elements $Ga_A$ and $Ga_B$ in FIG. 2, $G_{XA2}$ to $Gb_A$ and $Gb_B$, and $G_{XA3}$ to $Gc_A$ and $Gc_B$.

Next described is the alignment optical system in the exposure apparatus shown in FIG. 4. The irradiation light for alignment is supplied from two laser sources 10 and 12 emitting beams different in wavelength from the exposure light. These laser sources 10 and 12 are for example a He—Ne laser source emitting a beam with wavelength 633 nm and a laser diode (LD) emitting a beam with a wavelength in the range of 650 to 780 nm. Beams from the laser sources 10 and 12 are synthesized by a dichroic mirror 11 and thereafter the synthesized beam advances in the same optical path to enter a heterodyne beam generating optical system HBG.

In the heterodyne beam generating optical system HBG, the two incident laser beams enter an acousto-optic modulator (hereinafter referred to "AOM") 13a. The AOM 13a makes each of the two incident beams diffracted and frequency-modulated by the Raman-Nath diffraction. Two beams of ±first-order diffracted light emergent from the AOM 13a pass through a space filter 50a and a relay lens 51a then to enter an AOM 13b. The AOM 13b is driven by traveling waves in the opposite direction to those in the first AOM 13a. In the AOM 13b, the two incident beams are subjected to the acoustic Bragg diffraction and frequency modulation with slightly different frequencies in the opposite directions. Defining signs for each order of diffracted light with respect to the direction of traveling waves in the AOM 13a, 13b, out of+first-order diffracted light emerging from the AOM 13a by the Raman-Nath diffraction,-first-order diffracted light caused by the acoustic Bragg diffraction in the AOM 13b is directed to a space filter 50b, and similarly out of–first-order diffracted light emerging from the AOM 13a,+first-order diffracted light from AOM 13b is directed to the space filter 50b. The two beams with frequency difference of Δf therebetween emerging from the second AOM 13b then pass through the space filter 50b and a collimator lens 51b to be outgoing as parallel beams.

The frequency difference between the two beams (beat frequency) Δf (for example about 50 kHz) is expressed by Δf=2($f_1$-$f_2$), where $f_1$ is a drive frequency of AOM 13a and $f_2$ a drive frequency of AOM 13b. The detailed structure of the heterodyne beam generating optical system HBG is disclosed in U.S. application Ser. No. 91,501 filed on Jul. 14, 1993, for example. The two beams emerging from the heterodyne beam generating optical system HBG each are composed of light with wavelengths $\lambda_A$ and $\lambda_B$, and the beams each composed of the light with two wavelengths will be called as beams $LB_1$ and $LB_2$.

The two beams $LB_1$, $LB_2$ with frequency difference (beat frequency) Δf emergent from the heterodyne beam generating optical system HBG are reflected by a mirror 52 and thereafter split respectively into transmission light and reflection light by a semitransparent mirror 14. The beams $LB_1$, $LB_2$ reflected by the semitransparent mirror 14 are condensed by a condenser lens 15. Located at a condensing position of the condenser lens 15 is a base diffraction grating 16 for reference having the pitch direction parallel to the plane of FIG. 4. The two beams $LB_1$, $LB_2$ with relative frequency difference of Δf produce flowing interference fringes on the diffraction grating 16. Then the diffracted light through the diffraction grating 16 is photoelectrically detected by a photoelectric detector 17. The thus detected reference signal (base signal) $S_{REF}$ is a sinusoidal alternate current signal (optical beat signal) depending upon a period of change in brightness of the flowing interference fringes formed on the diffraction grating 16.

Another pair of two beams $LB_1$, $LB_2$ passing through the semitransparent mirror 14 go through an alignment objective lens 18 and via a mirror 19 to be focused on the reticle mark $RM_X$ provided outside the exposure area in the reticle 2. Then the beams $LB_1$, $LB_2$ with frequency difference Δf form flowing interference fringes on the reticle mark $RM_X$.

Figure 5:
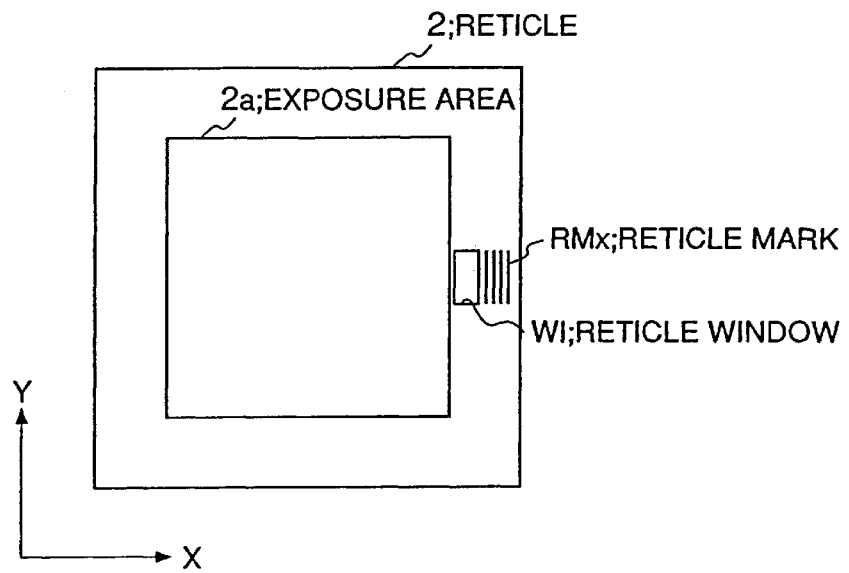
FIG. 5 is a plan view to show an example of shape of reticle mark and reticle window in the first embodiment.

The reticle mark $RM_X$ is a diffraction grating disposed outside the pattern forming area (exposure area) 2a in the reticle 2 and having the pitch in the X direction (direction of measurement), as shown in FIG. 5. Also a transmission window WI (reticle window) is formed at a position adjacent to the reticle mark $RM_X$.

Accordingly, the beams (to be the irradiation light) $LB_1$, $LB_2$ are focused on the reticle 2 by the objective lens 18 in the alignment optical system such that they are incident in two directions with a certain cross angle to cover not only the reticle mark $RM_X$ but also the reticle window WI. Incidentally, in case the irradiation light is composed of a plurality of beams with different wavelengths, the cross angle changes depending upon the wavelength. However, FIG. 4 and FIG. 6 (as described below) show optical paths as in case of single wavelength for brevity of illustration.

Figure 6:
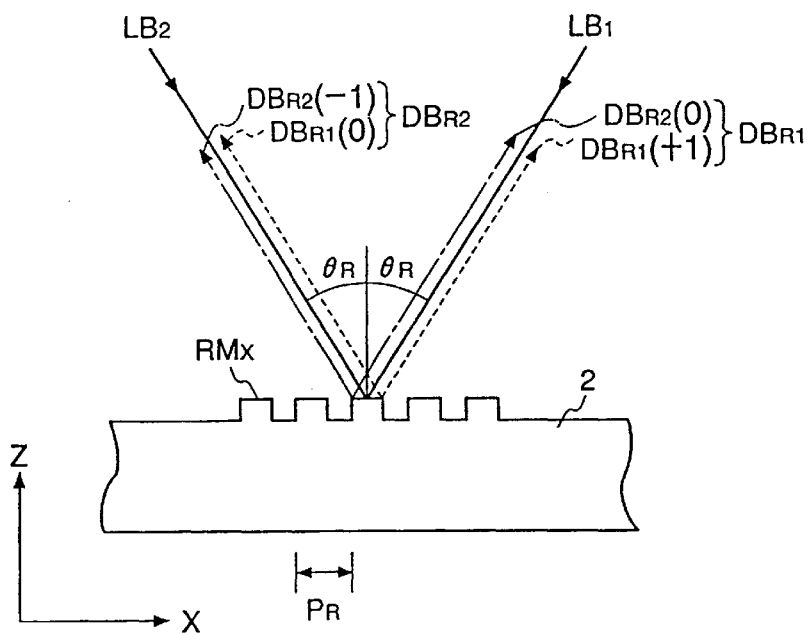
FIG. 6 is an illustration to illustrate a function of wafer mark in the first embodiment.

Assuming single wavelength light is employed, described referring to FIG. 6 are the beams (irradiation light) $LB_1$, $LB_2$ illuminating the reticle mark $RM_X$ at a predetermined cross angle. When the beam $LB_1$ obliquely irradiates the reticle mark $RM_X$, zeroth order light $DB_{R1}$ (0) of beam $LB_1$ emerges as shown by the dotted line in the direction tracing back along the optical path of beam $LB_2$ and first order light $DB_{R1}$ (+1) of beam $LB_1$ emerges as shown by the dotted line in the direction tracing back along the optical path of beam $LB_1$.

On the other hand, when the beam $LB_2$ obliquely irradiates the reticle mark $RM_X$, zeroth order light $DB_{R2}$ (0) of beam $LB_2$ emerges as shown by the alternate long and short dash line in the direction tracing back along the optical path of beam $LB_1$ (in the direction of regular reflection) and–first order light $DB_{R2}$ (–1) of beam $LB_2$ emerges as shown by the alternate long and short dash line in the direction tracing back along the optical path of beam $LB_2$. Here, the pitch $P_R$ of reticle mark $RM_X$ is set to satisfy the relation of sin $2\theta_R = \lambda/P_R$, where $2\theta_R$ is a cross angle and $\lambda$ is the wavelength of irradiation light $LB_1$, $LB_2$. Accordingly, in case of beams with a plurality of wavelengths as in the present embodiment, the cross angle $2\theta_R$ changes depending upon the wavelength.

Figure 7:
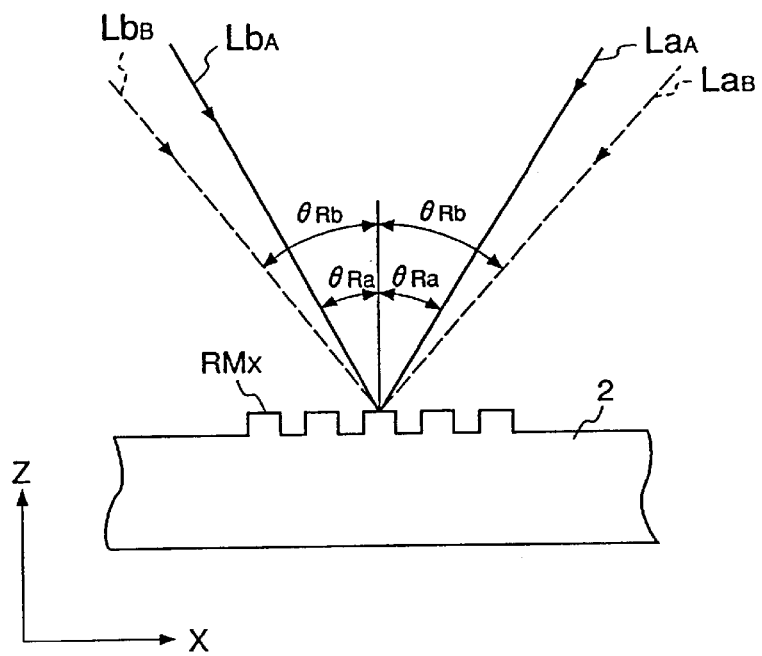
FIG. 7 is an illustration to further illustrate the function of wafer mark in the first embodiment.

FIG. 7 shows the case adapted to the present embodiment. In this case, the reticle mark $RM_X$ on reticle 2 is irradiated by beams $La_A$, $La_B$ and beams $Lb_A$, $Lb_B$ with wavelengths different from each other as the cross angle is $2\theta_{Ra}$ between the beam $La_A$ and the beam $Lb_A$ and the cross angle $2\theta_{Rb}$ between the beam $La_B$ and the beam $Lb_B$. Also in FIG. 4 and FIG. 6, the beams of zeroth order light $DB_{R2}$ (0) and+first order light $DB_{R1}$ (+1) are shown as the detection light $DB_{R1}$ and similarly the beams of zeroth order light $DB_{R1}$ (0) and–first order light $DB_{R2}$ (–1) as the detection light $DB_{R2}$.

Therefore, the beam $LB_1$ in FIG. 4 represents the beams $La_A$, $La_B$ and the beam $LB_2$ does the beams $Lb_A$, $Lb_B$.

Returning to FIG. 4, the detection light $DB_{R1}$ (first order light $LB_{R1}$ (+1) and zeroth order light $LB_{R2}$ (0)) tracing back along the optical path of beam $LB_1$ goes again via the mirror 19, the objective lens 18 and the semitransparent mirror 14, and then reaches a photoelectric detector 20a disposed at a position conjugate with the pupil of objective lens 18. The photoelectric detector 20a detects and outputs a reticle detection signal (optical beat signal) $S_{Ra}$ from the reticle mark $RM_X$. At the same time, the wafer detection light $DB_{R2}$ (–first order light $DB_{R2}$ (–1) and zeroth order light $DB_{R1}$ (0)) tracing back along the optical path of beam $LB_2$ goes again via the mirror 19, the objective lens 18 and the semitransparent mirror 14 and then reaches a photoelectric detector 20b disposed at a position conjugate with the pupil of objective lens 18. The photoelectric detector 20b detects a position signal (optical beat signal) $S_{Rb}$ from the reticle mark $RM_X$.

The position signals $S_{Ra}$, $S_{Rb}$ of reticle 2 detected and output by the photoelectric detectors 20a, 20b each are a sinusoidal alternate current signal (optical beat signal) according to the period of change in brightness of flowing interference fringes formed on the reticle mark $RM_X$.

Next described are the beams (irradiation light) $LB_1$, $LB_2$ irradiating the reticle window WI adjacent to the reticle mark $RM_X$ in the two directions with the predetermined cross angle. The beams $LB_1$, $LB_2$ irradiating the reticle window WI in the two directions with the predetermined cross angle $\theta_R$ pass through the reticle window WI as they are and enter the projection optical system 3 at positions off the axis $A_{X0}$, as shown in FIG. 4.

The projection optical system 3 is fully corrected in chromatic aberration for the exposure light, but is not corrected in chromatic aberration for the alignment light (irradiation light and detection light) with wavelengths different from that of exposure light. Thus, the chromatic aberration control plate 1 with the three sets of correction optical elements $G_{XA1}$ to $G_{XA3}$ formed thereon is located on the plane of pupil (entrance pupil) P of projection optical system 3.

Figure 8:
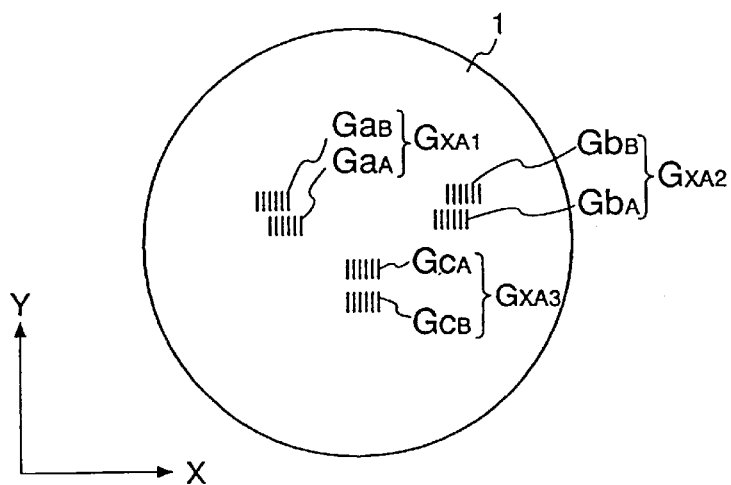
FIG. 8 is a plan view to illustrate a layout and a function of chromatic aberration correcting elements formed on a chromatic aberration controlling plate in the first embodiment.

FIG. 8 shows a layout of the three sets or six correction optical elements on the chromatic aberration control plate 1. As shown in FIG. 8, there are provided correction optical elements $Ga_A$ to $Gc_A$ and correction optical elements $Ga_B$ to $Gc_B$, each group being composed of three diffraction gratings with pitches different from each other, extending along the measurement direction (in the X direction) passing through the center of optical axis $A_{X0}$ of projection optical system 3 on the chromatic aberration control plate 1. Here, the subscripts A and B correspond to the wavelengths $\lambda_A$ and $\lambda_B$ different from each other in the alignment light. The following description uses the three sets of correction optical elements $G_{XA1}$ to $G_{XA3}$ if the description is common to the beams with different wavelengths.

As seen in FIG. 4, the correction optical element $G_{XA3}$ is disposed on a line symmetric with the correction optical elements $G_{XA1}$ and $G_{XA2}$ with respect to the X axis passing through the optical axis $A_{X0}$ of projection optical system 3, and the correction optical elements $G_{XA1}$ and $G_{XA2}$ are symmetric with respect to the diffraction grating $G_{XA3}$ (present on the projection optical system 3 in FIG. 4). The correction optical elements $G_{XA1}$ to $G_{AX3}$ are arranged along the measurement direction (in the X direction) in such a manner that the pitch of the diffraction gratings becomes finer in the order of $G_{XA2}$, $G_{XA3}$ and $G_{XA1}$. The specific structure and function of the correction optical elements $G_{XA1}$ to $G_{XA3}$ in the present embodiment will be described in detail below. As shown in FIG. 8, the correction optical elements $Ga_A$ to $Gc_A$ and the correction optical elements $Ga_B$ to $Gc_B$ are shifted from each other with respect to the X axis to avoid overlap between the correction optical elements for the beams of wavelengths $\lambda_A$ and $\lambda_B$. This means that the telecentricity of projection optical system 3 is shifted in the non-measurement direction (in the meridional direction), which will not affect the measurement accuracy.

Figure 9:
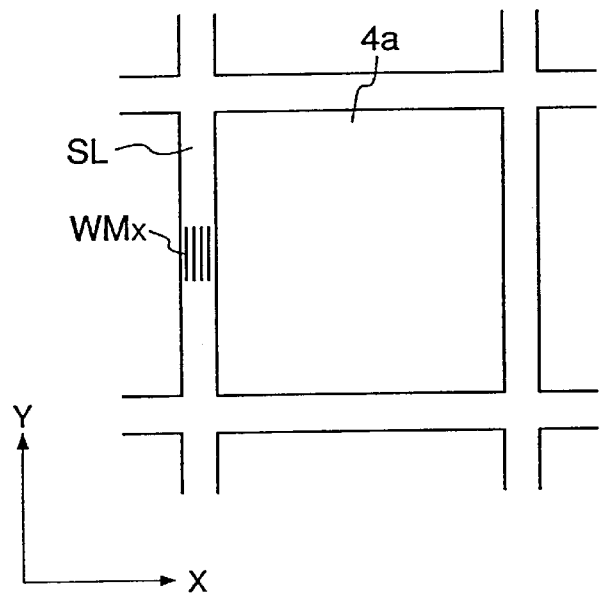
FIG. 9 is a plan view to show an example of shape of wafer mark in the first embodiment.

In FIG. 4, when the irradiation beams $LB_1$, $LB_2$ enter the projection optical system 3 at the positions off the axis and reach the pupil (entrance pupil) of projection optical system 3, they are deflected (diffracted) for correction by respective correction angles $\theta_1$, $\theta_2$ by the correction optical elements $G_{XA1}$ and $G_{XA2}$ for chromatic aberration correction of irradiation light. The thus corrected beams irradiate the wafer mark $WM_X$ formed on the wafer 4 in two directions with a predetermined cross angle. Then flowing interference fringes are formed on the wafer mark $WM_X$. Here, the wafer mark $WM_X$ is a diffraction grating with the pitch in the X direction (measurement direction) on a street line SL outside one shot area 4a, as shown in FIG. 9.

Figure 10:
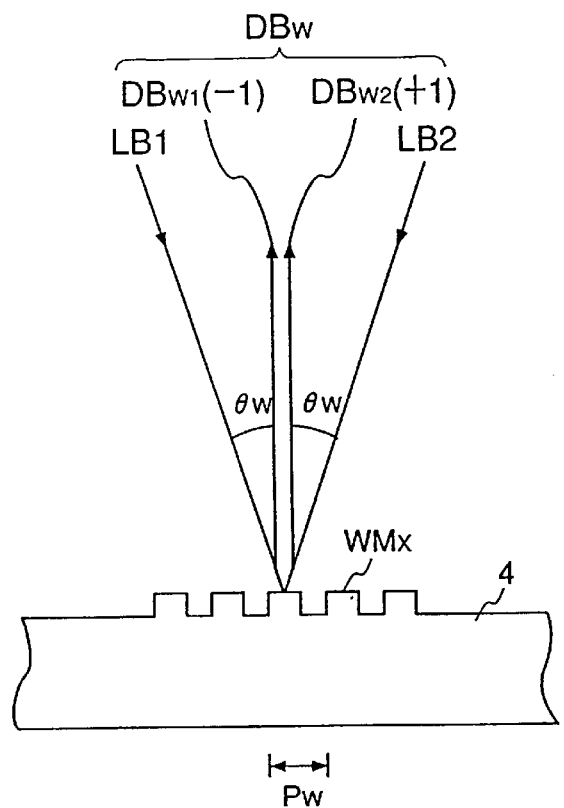
FIG. 10 is an illustration to show a relation between irradiation light and detection light in the first embodiment.

FIG. 10 shows the beams of irradiation light $LB_1$, $LB_2$ irradiated onto the wafer mark $WM_X$. When the irradiation beams $LB_1$, $LB_2$ are irradiated at a predetermined cross angle onto the wafer mark $WM_X$,–first order light $DB_{W1}$ (−1) of irradiation beam $LB_1$, and+first order light $DB_{W2}$ (+1) of irradiation beam $LB_2$ emerge in the normal direction to the surface of wafer 4 (in the direction parallel to the optical axis of projection optical system 3).

Here, the pitch $P_W$ of wafer mark $WM_X$ is set to satisfy the relation of $\sin\theta_{W=\lambda/PW}$, where $\lambda$ is the wavelength of alignment light and $2\theta_W$ is the cross angle between the irradiation beams $LB_1$ and $LB_2$. In FIG. 4 and in FIG. 10, the beam of−first order light $DB_{W1}$ (−1) and the beam of+first order light $DB_{W2}$ (+1) are shown as the detection light $DB_W$. Therefore, in case of beams with a plurality of different wavelengths, the cross angle $2\theta_W$ changes depending upon the wavelength.

Figure 11:
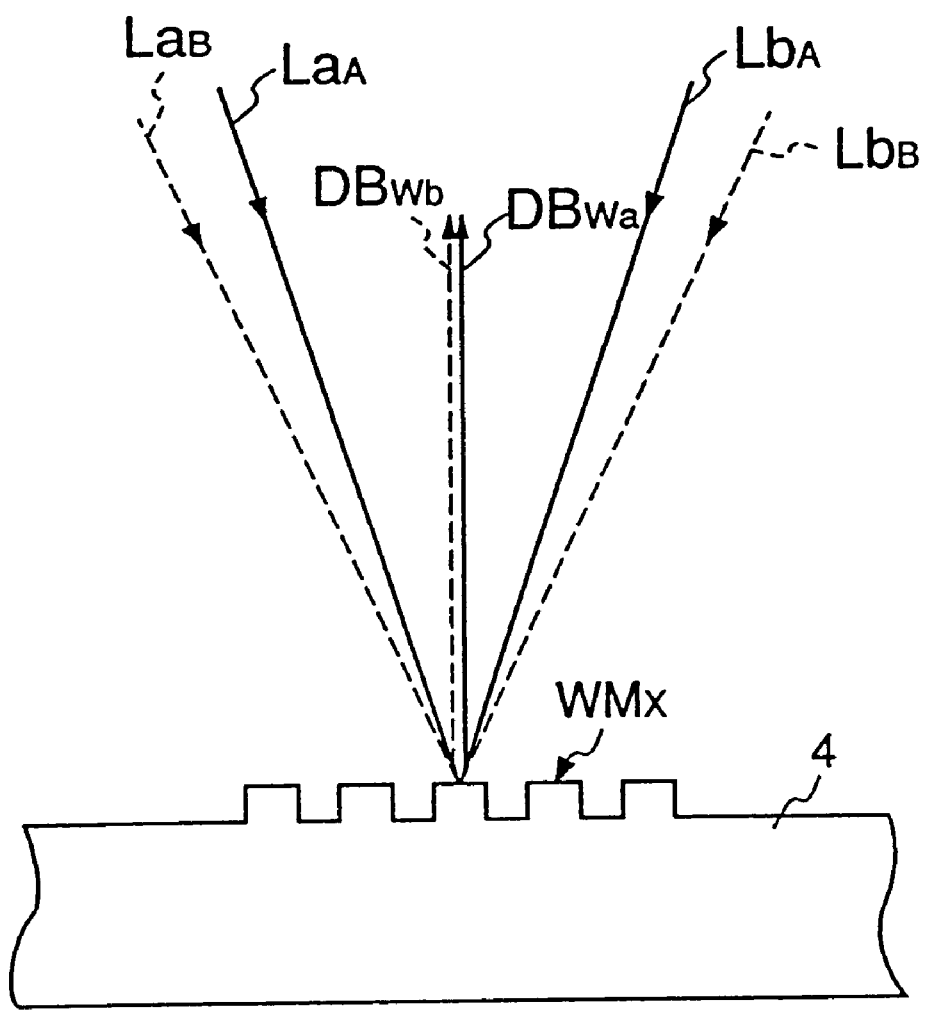
FIG. 11 is an illustration to further show the relation between irradiation light and detection light in the first embodiment.

FIG. 11 shows a state that a plurality of beams of irradiation light with plural wavelengths, that is, beams $La_A$, $La_B$ and beams $Lb_A$, $Lb_B$ are irradiated onto the wafer mark $WM_X$ on wafer 4. FIG. 11 illustrates in detail the irradiation light $LB_1$, $LB_2$ irradiated onto the wafer mark $WM_X$ and the detection light therefrom. Those beams are irradiated at a cross angle between the beam $La_A$ and the beam $Lb_A$ and at a cross angle different from the former between the beam $La_B$ and the beam $Lb_B$. This difference of cross angles is caused because the correction optical elements $Ga_A$ and $Gb_A$ and the correction optical elements $Ga_B$ and $Gb_B$ in FIG. 8 are positioned apart from each other in the X direction.

Returning to FIG. 4, the detection light $DB_W$ (−first order light $LBW_1$ (−1) and+first order light $LBW_2$ (+1)) emerging in the normal direction to the wafer mark $WM_X$ proceeds along the optical path of principal ray in the projection optical system 3 and is then deflected (diffracted) by a correction angle $\theta_3$ by the correction optical element $G_{XA3}$ provided at the center of pupil plane P of projection optical system 3 (as seen along the Y direction). Then the detection light advances again through the reticle window WI, via the mirror 19, the objective lens 18 and the semitransparent mirror 14 to reach a photoelectric detector 21. The photoelectric detector 21 is located at a position conjugate with the pupil of objective lens 18 (or the projection optical system 3) similarly as the above-described photoelectric. detectors 20a, 20b. The photoelectric detector 21 outputs a wafer position signal $S_W$.

By the basic structure in the first embodiment of the present invention, as described above, the apparatus detects the reference signal $S_{REF}$ obtained by the photoelectric detector 17, the reticle position signals $S_{Ra}$, $S_{Rb}$ with position information of reticle 2 obtained by the photoelectric detectors 20a, 20b, and the wafer position signal $S_W$ with position information of wafer 4 obtained by the photoelectric detector 21. These photoelectric detectors 17, 20a, 20b, 21 detect the information of all wavelengths at the same time.

Next described is the theory of relative positional deviation detection and positioning between the reticle 2 and the wafer 4. An unrepresented phase detection system detects a phase difference $\Phi_r$ of photoelectric signals (sinusoidal alternate current signals) $S_{Ra}$, $S_{Rb}$ of interference light between the zeroth-order and the first-order diffracted light from the reticle mark $RM_X$, obtained by the photoelectric detectors 20a, 20b, with respect to the reference signal of photoelectric signal (sinusoidal alternate current signal) $S_{REF}$ from the photoelectric detector 17. Similarly, the phase detection system also detects a phase difference $\Phi_W$ between the reference signal $S_{REF}$ and the photoelectric signal $S_W$ of interference light between the±first-order diffracted light from the wafer mark $WM_X$, obtained by the photoelectric detector 21. A direction and an amount of deviation between the reticle 2 and the wafer 4 are obtained by calculating a difference $\Phi_r$−$\Phi_W$ between the phase differences $\Phi_r$ and $\Phi_W$. This detection method is so called as the optical heterodyne method. Employing the heterodyne method, a positional deviation can be detected with high resolution even in a stationary state as long as the reticle 2 and the wafer 4 are located within the range of positional error defined within a pitch of reticle mark and within a half pitch of wafer mark. This method is convenient for position servo of closed loop to suppress a fine positional deviation while the transfer pattern on reticle 2 is printed onto the surface of photoresist on the wafer 4. In this detection method, the reticle 2 or the wafer 4 is moved or adjusted to nullify the difference $\Phi_r$−$\Phi_W$ (or to keep it at a certain value) to complete alignment. After that, servo lock may be subsequently effected to keep the reticle 2 and the wafer 4 at the alignment position as restricting relative movement therebetween.

In the present embodiment, the wafer stage is moved to each shot area (exposure area) on the wafer during exposure in the step-and-repeat method, based on values measured by the interferometers. After the wafer mark $WM_X$ is positioned with an accuracy of ±½ pitch in the irradiation area of the two beams $LB_1$, $LB_2$, the reticle stage or the wafer stage can be servo-controlled by an unrepresented servo system, based on only the information from the unrepresented phase detection system. The servo system may be so arranged that the reticle stage and the wafer stage each are driven by a DC motor, a D/A converter produces an analogue voltage corresponding to the phase difference $\Phi_r-\Phi_W$, and the analogue voltage is directly applied as a deviation voltage to servo circuits for DC motors. This servo is continued up to the end of exposure of the shot area.

Since the above arrangement is not the servo depending upon values measured by the interferometers, it is possible to reduce fine fluctuations of stages, which could be caused by fluctuations of air density in beam paths in interferometers. For that purpose, when servo-controllable phase difference information is obtained from the unrepresented phase detection system, measurement values of wafer-stage-side interferometer are separated from the wafer-stage-side servo system, an applied voltage to the wafer-stage motor is set to zero, and the above-described analogue voltage is applied to the reticle-stage-side servo system.

This arrangement can suppress fine fluctuations especially on the wafer stage side during exposure operation, achieving gentle drift-like fine motion. The relative positional deviation between the reticle 2 and the wafer 4 can be kept nearly zero by trace-moving the reticle stage at high speed. Therefore, extremely loyal transfer can be achieved without thickening of line width of exposed pattern nor reduction in resolution.

Since the two alternate current signals $S_{Ra}$, $S_{Rb}$ with the frequency of interference beat signal obtained by the photoelectric detectors 20a, 20b are identical to each other in respect of characteristics of signals, either one of them may be arranged to be transmitted to the unrepresented phase detection system. However, since the optical information from the reticle 2 in the present embodiment is produced by interference between zeroth-order diffracted light and first-order diffracted light of the beams $LB_1$, $LB_2$, offset would occur in measurement of phase difference if a light intensity (quantity of light) of zeroth order light is greatly different from that of first order light. It is thus preferred that an analogue circuit is used to calculate a sum (or a difference) of the two signals $S_{Ra}$, $S_{Rb}$ from the photoelectric detectors 20a, 20b and then a phase difference $\Phi_r$ is measured with respect to the reference signal $S_{REF}$ from the photoelectric detector 17. The apparatus may employ a method of change-over to use either one selected from the two signals $S_{Ra}$, $S_{Rb}$ from the photodetectors 20a, 20b and a signal obtained by synthesizing the two signals $S_{Ra}$, $S_{Rb}$.

Next described is the specific structure and function of the correction optical elements $G_{XA1}$ to $G_{XA3}$ which is characteristic in the first embodiment of the present invention.

As shown in FIG. 4, the correction optical elements $G_{XA1}$ to $G_{XA3}$ of diffraction gratings are arranged along the measurement direction (X direction) at the position of pupil P of projection optical system 3. Let us consider a case in which the diffraction gratings $G_{XA1}$ to $G_{XA3}$ are absent.

The projection optical system 3 is corrected in chromatic aberration for the exposure light, whereas it is not corrected in chromatic aberration for the alignment light (irradiation light) from the laser sources 10, 12 emitting beams with wavelengths different from that of exposure light. A relation of image formation to the projection optical system 3 is first described of the beams $LB_1$, $LB_2$ irradiating the position $A_X$ on the wafer mark $WM_X$ at a predetermined cross angle in two directions.

Now consider a hypothetical image at the position $A_X$ on the wafer mark $WM_X$, which is projected backward toward the reticle by the projection optical system 3 under the alignment light. Rays proceeding backward along the optical paths of irradiation beams $LB_1$, $LB_2$ and a ray proceeding along the optical path $DB_W$ of detection light (diffracted light) obtained from the irradiation beams $LB_1$, $LB_2$ cross each other at the position $B_1$ above the reticle 2 because of the chromatic aberration in the projection optical system 3, as shown by the dotted lines. The hypothetical image at the position $A_X$ on the wafer mark $WM_X$ is focused on this cross position.

On the other hand, an image at the position $A_X$ on the wafer mark $WM_X$ is projected backward toward the reticle by the projection optical system 3 under the exposure light and then is focused at the position $B_0$ on the reticle 2.

Accordingly, the axial chromatic aberration of projection optical system 3 (hereinafter referred to simply as "axial chromatic aberration") $\Delta L$ occurs in the Z direction (in the direction of optical axis of projection optical system 3) with respect to the focused position $B_0$ of the image on the wafer mark $WM_X$ by the exposure light. Further, the magnification chromatic aberration of projection optical system 3 (hereinafter referred to simply as "magnification chromatic aberration") $\Delta T$ occurs on the exposure area side in the X direction (in the direction perpendicular to the optical axis $A_{X0}$ of projection optical system 3).

The magnification chromatic aberration amount (lateral chromatic aberration amount) $\Delta T$ is defined by $\Delta T=|\delta_2-\delta_1|$, where $\delta_2$ is a distance from the cross position $B_0$, where principal rays of off-axial light with the same wavelength as that of the exposure light are focused on the Gaussian image plane (reticle 2) through the projection optical system 3 to cross each other on the Gaussian image plane (reticle 2), to the optical axis position O of projection optical system 3 on the Gaussian image plane (reticle 2), and $\delta_1$ is a distance from the cross position $B_1$, where principal rays of alignment light with a wavelength different from that of exposure light focused on or, before or after the Gaussian image plane (reticle 2) through the projection optical system 3 cross each other on the Gaussian image plane (reticle 2), to the optical axis position O of projection optical system 3 on the Gaussian image plane (reticle 2), as shown in FIG. 4.

Accordingly, the axial chromatic aberration intensifies vibration or inclination of alignment optical system to result in large detection error, hindering achievement of high-accuracy and stable alignment. In addition, the reticle window WI next to the reticle mark $RM_X$ must be enlarged. Also, since the position $B_1$ is shifted by $\Delta T$ to the left (toward the exposure area) with respect to the position $B_0$ because of the magnification chromatic aberration, the cross position $B_1$ is within the exposure area on the reticle when seen immediately above the reticle 2. Consequently, the alignment light cannot be taken out from the wafer mark $WM_X$.

The present embodiment solved the above problem. In detail, first, the correction optical elements $G_{XA1}$, $G_{XA2}$, having a function to correct both the axial chromatic aberration $\Delta L$ and the magnification chromatic aberration $\Delta T$ for the irradiation light $LB_1$, $LB_2$ at a time, are located symmetric with each other with respect to the center (optical axis) of the plane of pupil (entrance pupil) P of projection optical system. The correction optical elements $G_{XA1}$, $G_{AX2}$ are formed to have respective pitches different from each other. Thus, the irradiation light $LB_1$ proceeding to the wafer mark $WM_X$ is deflected by a correction angle $\theta_1$ as diffracted by the correction optical element $G_{XA1}$, while the irradiation light $LB_2$ proceeding to the wafer mark $WM_X$ is similarly deflected by a correction angle $\theta_2$ as diffracted by the diffraction grating $G_{XA2}$. The correction angles are kept in the relation of $\theta_2 < \theta_1$.

As a result, the optical paths of irradiation light $LB_1$ and irradiation light $LB_2$ are corrected, so that the irradiation light beams $LB_1$, $LB_2$ cross each other at a predetermined cross angle on the wafer mark $WM_X$ as on the reticle window WI. Accordingly, the conjugate relation between the reticle 2 and the wafer 4 appears maintained for the irradiation beams $LB_1$, $LB_2$ with wavelengths different from that of exposure light with respect to the projection optical system 3.

Also, the detection light $DB_W$ proceeding to the reticle window WI after diffracted by the wafer mark $WM_X$ is deflected by a correction angle $\theta_3$ by the correction optical element $G_{XA3}$ located in the projection optical system 3, so that the magnification chromatic aberration $\Delta T$ of the detection light $DB_W$ may be corrected. Namely, since the optical path of detection light $DB_W$ is corrected, the detection light $DB_W$ enters the reticle window WI perpendicular thereto as maintaining the telecentricity. Then the detection light passes through the cross position of the irradiation beams $LB_1$, $LB_2$ in the reticle window WI and proceeds along the optical axis of alignment objective 18 to reach the photoelectric detector 21 finally. The correction angles are kept in the relation of $\theta_2 < \theta_3 < \theta_1$.

As described above, utilizing the diffraction effect of the correction optical elements $G_{XA1}$ to $G_{XA3}$ of diffraction gratings, the optical paths of the alignment light are deflected by the predetermined angles (correction angles) $\theta_1$, $\theta_2$, $\theta_3$ to suitably correct the chromatic aberration (axial chromatic aberration and magnification chromatic aberration) of projection optical system 3. This can solve the problems in the conventional apparatus, that is, the problem that the alignment light drops in the exposure area of reticle 2 due to the magnification chromatic aberration of projection optical system 3 or the problem due to the axial chromatic aberration. Therefore, a high-performance alignment apparatus can be attained, which is easy in designing and producing the projection optical system 3 and which can remarkably increase the degree of freedom as to the arrangement of alignment optical system. Incidentally, the correction amounts depend upon the wavelength of alignment light, and are values specific for each wavelength independent of other it wavelengths. Therefore, the following values for correction elements depend upon the wavelength.

Let $P_{XA1}$, $P_{XA2}$, $P_{XA3}$ be pitches of correction optical elements $G_{XA1}$ to $G_{XA3}$ which are diffraction gratings, and $\lambda$ be the wavelength of alignment light. Then there hold the following relations between the correction angles and the pitches of diffraction gratings.

$$P_{XA1} = m\lambda/\sin\theta_1 \tag{1}$$

$$P_{XA2} = m\lambda/\sin\theta_2 \tag{2}$$

$$P_{XA3} = m\lambda/\sin\theta_3 \tag{3}$$

In the above equations, m represents the order (integer) of diffracted light.

As apparent from FIG. 4, the correction angles $\theta_1$, $\theta_2$, $\theta_3$ by the correction optical elements $G_{XA1}$ to $G_{XA3}$ are kept in the relation of $\theta_2 < \theta_3 < \theta_1$. From the above relations of Equations (1) to (3), the pitches of correction optical elements $G_{XA1}$ to $G_{XA3}$ are kept in the relation of $P_{XA2} > P_{XA3} > P_{XA1}$ accordingly. Therefore, the present embodiment is so arranged that the grating pitches become finer in the order of the correction optical elements $G_{XA2}$, $G_{XA3}$, $G_{XA1}$, as shown in FIG. 5.

Also, the correction optical elements $G_{XA1}$ to $G_{XA3}$ formed on the disk chromatic aberration control plate 1 are constructed as phase diffraction gratings by etching a substrate of a material such as quartz glass. In order to increase the diffraction efficiency of m-th-order diffracted light to deflect an alignment optical path, the step d of phase diffraction grating is preferably set to satisfy the following relation:

$$d = (2m+1)\lambda/2(n-1) \tag{4}$$

where $\lambda$ is the wavelength of alignment light, n an index of refraction of the substrate 1 for the light of alignment wavelength, and m an integer.

In this case, the diffraction grating has diffraction effect also on the exposure light, which could adversely affect the focusing function of projection optical system 3. It is thus more preferable that a thin film (dichroic film or the like) with a wavelength discriminating function to reflect the exposure light but transmit the alignment light is formed on the correction optical elements as the diffraction gratings by vapor deposition or other technique.

Alternatively, with a slight reduction in diffraction efficiency for the alignment light, the step d of phase diffraction grating may be set to satisfy the following relation to keep the diffraction efficiency for the exposure light nearly zero:

$$d = \lambda m/(n_e - 1) \tag{5}$$

where $\lambda_e$ is the wavelength of exposure light, $n_e$ an index of refraction of the substrate for the exposure light and m is an integer.

In the first embodiment according to the present invention as described above, there are disposed on the same plane at or near the pupil position of projection optical system 3, the correction optical elements $G_{XA1}$, $G_{XA2}$ for correcting the axial chromatic aberration and the magnification chromatic aberration of projection optical system 3 for the irradiation beams $LB_1$, $LB_2$ irradiating the wafer mark $WM_X$ in two directions, and the correction optical element $G_{XA3}$ for correcting the magnification chromatic aberration of projection optical system 3 for the detection light $DB_W$ from the wafer mark $WM_X$.

Therefore, the irradiation beams $La_1$, $LB_2$ for alignment and the detection light $DB_W$ from the wafer mark $WM_X$ can be always kept theoretically unchanged at positions where they pass through the pupil plane P of projection optical system, even in the case that the alignment optical system is moved in the Y direction to change one wafer mark $WM_X$ to another while shifting the position of wafer mark $WM_X$ in the direction (Y direction) perpendicular to the measurement direction (X direction), or in the case that another reticle with different size of exposure area is used with reticle mark $RM_X$ and reticle window WI on reticle being shifted in the measurement direction (X direction). Consequently, the correction optical elements $G_{XA1}$ to $G_{XA3}$ in the present embodiment are fully applicable to the case of change of wafer mark $WM_X$ or the case of use of reticles with different sizes.

It suffices for the correction optical elements $G_{XA1}$ to $G_{XA3}$ to cover only the portions where the irradiation beams $LB_1$, $LB_2$ and the detection beam $DB_W$ pass through the pupil plane P of projection optical system. It is, therefore, theoretically possible to minimize the ratio occupied by the diffraction gratings $G_{XA1}$ to $G_{XA3}$ as the correction optical elements on the pupil plane of projection optical system to the extent that their influence on the exposure light can be negligible.

Further, if the pitch of wafer mark $WM_X$ (diffraction grating) is made finer in order to achieve alignment with higher accuracy, the cross angle increases between the irradiation beams $LB_1$, $LB_2$ irradiating the reticle mark $RM_X$ and the wafer mark $WM_X$ in two directions. In this case, the cross angle can be made variable as follows. A plane-parallel plate is set as cross angle changing means at a variable angle of inclination in the optical path of irradiation beam $LB_1$ between the objective lens 18 and the AOM 13a in the alignment optical system, while another plane-parallel plate is set as cross angle changing means at a variable angle of inclination in the optical path of irradiation beam $LB_2$ between the objective lens 18 and the AOM 13b in the alignment optical system. The cross angle may be changed by changing the inclination angles of the plane-parallel plates. In this arrangement, the positions of beams $LB_1$, $LB_2$ passing through the pupil plane P of projection optical system 3 change in the measurement direction (X direction) in FIG. 4, and therefore another transparent chromatic aberration control plate having correction optical elements matching the change may be set interchangeably. Alternatively, the area occupied by each correction optical element (diffraction grating) may be preliminarily enlarged, taking the influence on the exposure light into consideration.

The present embodiment showed an example of alignment in the X direction for simplicity of illustration. Alignment in the Y direction is also possible of course by the following arrangement. A reticle mark having the pitch in the Y direction and a reticle window adjacent thereto are arranged in a non-exposure region next to the non-exposure region where the reticle mark $RM_X$ and the reticle window WI are set. Further, a second alignment optical system is provided above the reticle mark and the reticle window for Y direction in correspondence therewith. In this arrangement, the correction optical elements of diffraction gratings may be arranged in the Y direction similarly as the above-described correction optical elements $G_{XA1}$ to $G_{XA3}$.

Further, the correction optical elements $G_{XA1}$ to $G_{XA3}$ are provided corresponding to the irradiation beams $LB_1$, $LB_2$ and the detection beam $DB_W$ in the present embodiment, but such an arrangement may be employed that each diffraction grating has a pitch gradually changing along the pitch direction to make the irradiation beams $LB_1$, $LB_2$ and the detection beam $DB_W$ each converged at the position conjugate with the reticle. This arrangement can be also employed in each of the following embodiments.

Further, the present embodiment achieves the alignment using the alignment light multi-colored with beams of wavelengths different from each other, having the following advantage as compared with alignment using monochromatic alignment light. In case of an alignment apparatus employing monochromatic light as the alignment light, there could occur a case that the diffraction efficiency of alignment light changes due to conditions such as the step difference between recesses and protrusions in wafer mark or the thickness of resist layer so as to lower the intensity of wafer detection light, which makes alignment difficult. Another problem is asymmetry of wafer mark, which is liable to adversely affect the monochromatic light.

In contrast, the present embodiment employs the multi-colored alignment light as described above. Even if a beam of one wavelength is affected to lower the intensity of detection light, another beam of a wavelength different from that wavelength can be used for alignment. Then, the damage of alignment information can be compensated for and the negative influence due to asymmetry of wafer mark can also be reduced. However, if the alignment light is simply multi-colored, the magnification chromatic aberration occurs for each of the beams with different wavelengths constituting the alignment light, depending upon the wavelength. The point is that the chromatic aberration is corrected in an as simple mechanism as possible. The present embodiment can provide a high-performance alignment apparatus with chromatic aberration correction elements corresponding to respective beams in alignment light, which is relatively simple in structure, which can totally control the axial chromatic aberration and the magnification chromatic aberration of projection optical system, which enables easy arrangement of alignment optical system, and which can facilitate designing and production of projection optical system.

Embodiment 2

Figure 12A:
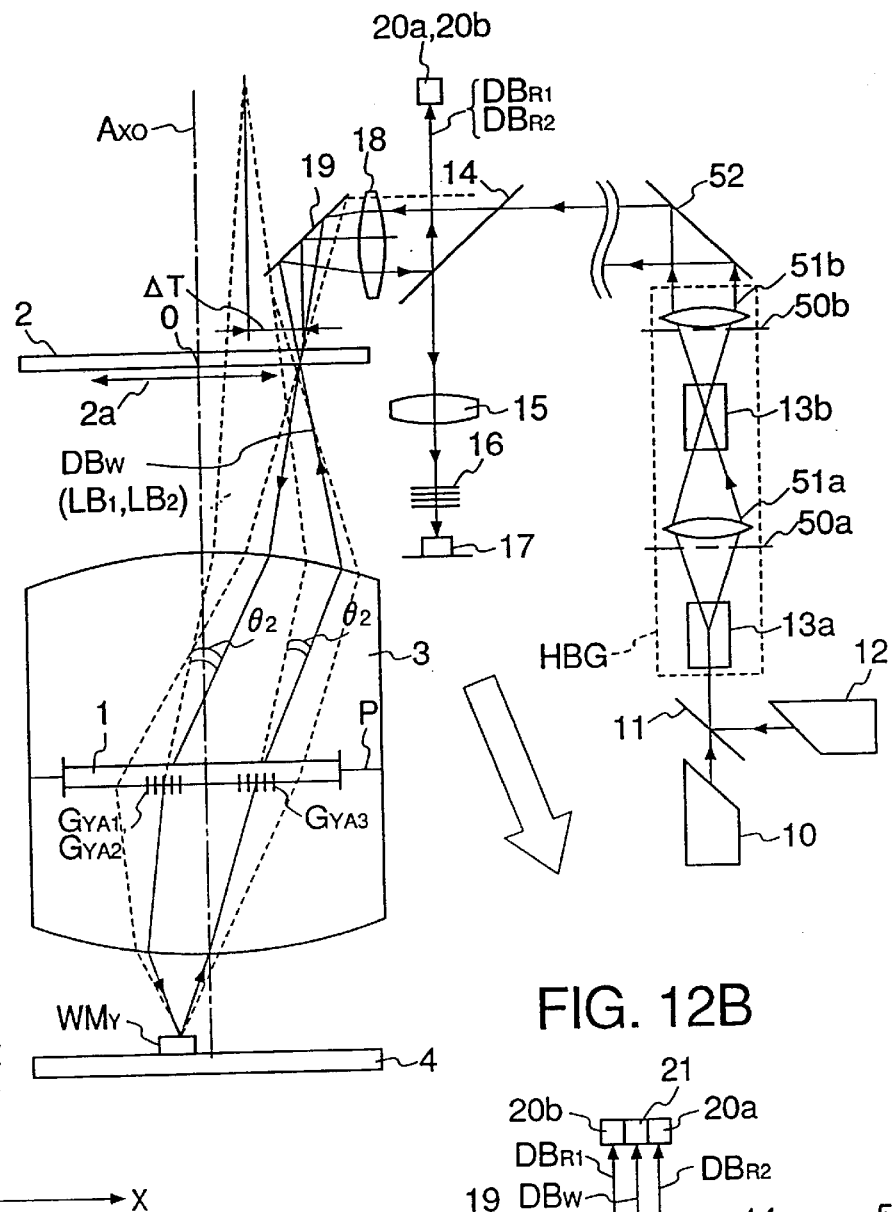
FIG. 12A is a scheme as seen along the Y direction to show the overall construction of the second embodiment of the present invention including an alignment optical system.
Figure 12B:
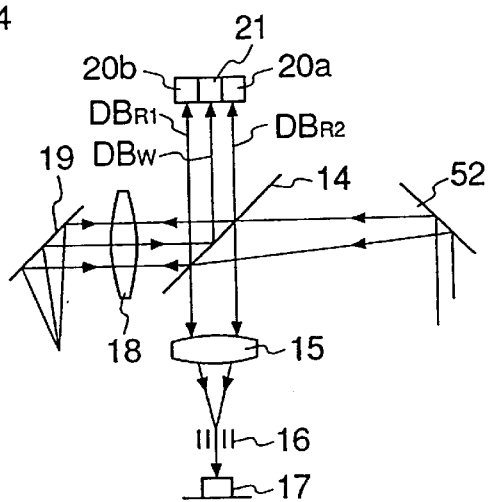
FIG. 12B is an illustration to show the major construction of alignment optical system in the second embodiment.
Figure 13:
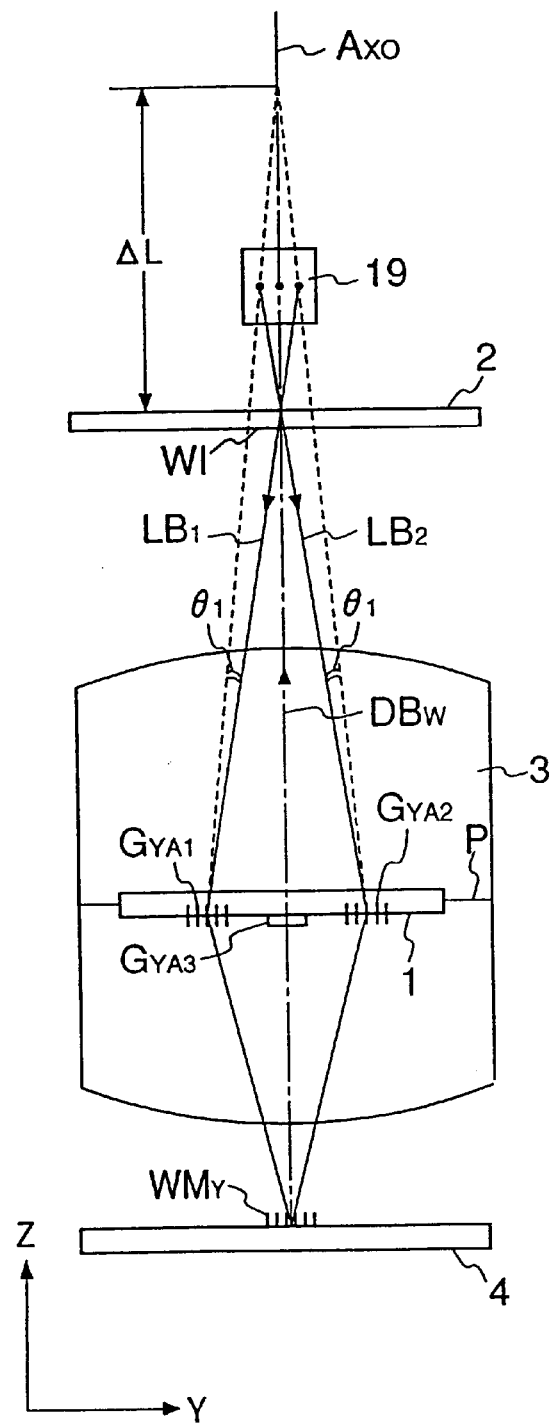
FIG. 13 is a scheme as seen along the X direction including a projection optical system to illustrate an alignment inspection function in the second embodiment.

The second embodiment according to the present invention is next described referring to FIGS. 12A and 12B and other drawings. This embodiment also employs multi-colored alignment light with beams of plural wavelengths. In FIGS. 12A, 12B and 13, elements corresponding to those in FIG. 4 are denoted by the same reference numerals and symbols and omitted to explain herein. These drawings also show a plurality of wave paths as represented by a single optical path in the same manner in the first embodiment, for brevity of illustration. FIG. 12A shows a state of alignment light through the projection optical system 3 as seen facing the XZ plane parallel to the X direction (meridional direction). FIG. 12B shows the detailed structure around a semitransparent mirror 14 in FIG. 12A. FIG. 13 shows a state of alignment light through the projection optical system 3 as seen facing the YZ plane parallel to the direction perpendicular to FIG. 12A, that is, parallel to the measurement direction (Y direction or sagittal direction).

Figure 14:
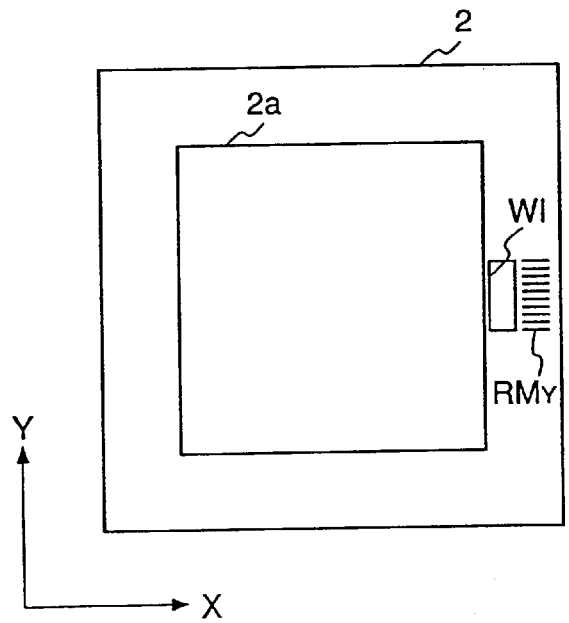
FIG. 14 is a plan view to show an example of shape of reticle mark and reticle window in the second embodiment.

FIG. 14 shows a wafer mark $WM_Y$ of diffraction grating and a reticle window WI adjacent thereto on a reticle 2 in the second embodiment. In the second embodiment the wafer mark $WM_Y$ and the reticle window WI are also located outside an exposure area 2a similarly as in the first embodiment, but the arrangement direction of diffraction grating (pitch direction) is the Y direction perpendicular to that in the first embodiment. In other words, the present embodiment shows an example in which the Y direction (meridional direction of projection optical system 3) is the direction of measurement.

In FIG. 12A, an alignment optical system constructed in the same manner as in the first embodiment is provided above the reticle 2 for irradiating and detecting the reticle mark $RM_Y$ and the wafer mark $WM_Y$. Also, a chromatic aberration control plate 1 is located on the pupil plane P of projection optical system 3 and correction optical elements composed of numerous phase diffraction gratings are formed on the control plate 1. The second embodiment is also arranged in the same manner as in the first embodiment in that a heterodyne beam generating optical system HBG produces two beams different in frequency by a combination of the Raman-Nath diffraction and the acoustic Bragg diffraction using two AOMs 13a, 13b.

Figure 15:
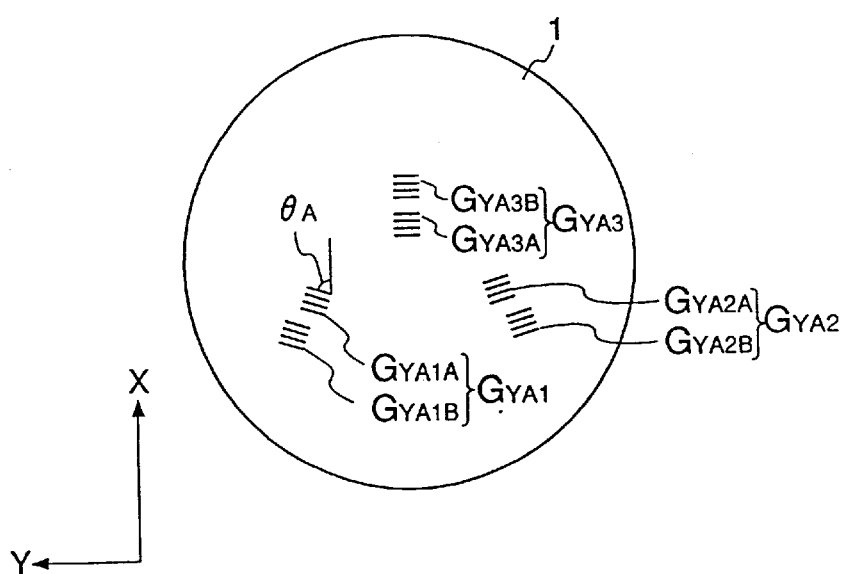
FIG. 15 is a plan view to illustrate a layout and a function of chromatic aberration correcting elements formed on a chromatic aberration control plate in the second embodiment.

FIG. 15 shows a layout of six correction optical elements for correcting irradiation light toward the wafer mark $WM_Y$ and detection light from the wafer mark $WM_Y$, out of all correction optical elements formed on the chromatic aberration control plate 1 in FIG. 12A. In FIG. 15, there are provided correction optical elements $G_{YA1A}$, $G_{YA2A}$, $G_{YA3A}$ of diffraction gratings for light with wavelength $\lambda_A$ and correction optical elements $G_{YA1B}$, $G_{YA2B}$, $G_{YA3B}$ for light with wavelength $\lambda_B$ on the chromatic aberration control plate 1. In the following description, the correction optical elements $G_{YA1A}$, $G_{YA1B}$ are represented by a correction optical element set $G_{YA1}$, the correction optical elements $G_{YA2A}$, $G_{YA2B}$ by a correction optical element set $G_{YA2}$, and the correction optical elements $G_{YA3A}$, $G_{YA3B}$ by a correction optical element set $G_{YA3}$.

In this case, the correction optical elements $G_{YA1}$, $G_{YA2}$ for irradiation light are formed to be inclined in the opposite directions with the pupil center (the center $AX_0$ of pupil plane P) inbetween along the measurement direction (Y direction), while the correction optical element $G_{YA3}$ for detection light is formed with the pitch in the non-measurement direction (X direction). The irradiation of alignment light onto the reticle mark $RM_Y$ and onto the wafer mark $WM_Y$ and the detection of diffracted light therefrom are the same as those in the first embodiment, and therefore omitted to explain herein.

Figure 16:
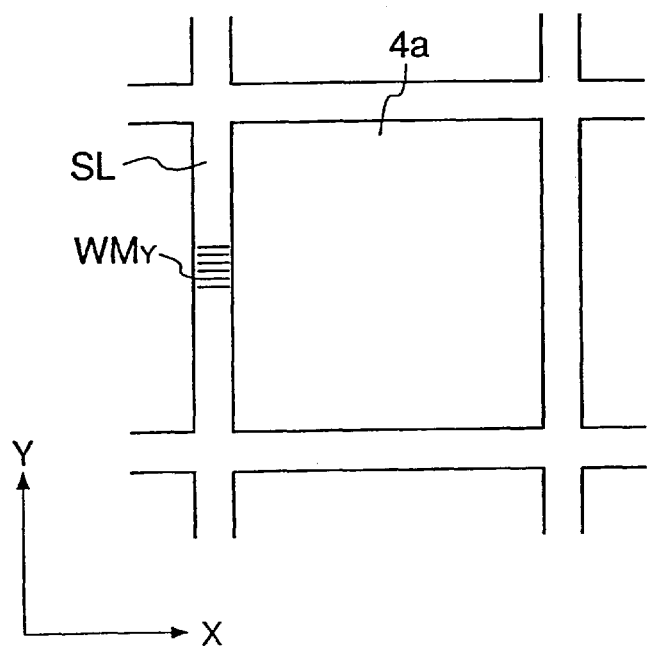
FIG. 16 is a plan view to show an example of shape of wafer mark in the second embodiment.

In the present embodiment, as shown in FIG. 13, when the two irradiation beams $LB_1$, $LB_2$ from the alignment optical system are irradiated onto the reticle window WI in two directions with a predetermined cross angle, they are deflected by a correction angle $\theta_1$ in the opposite directions to each other by the diffraction effect of the diffraction gratings $G_{YA1}$, $G_{YA2}$ formed on the chromatic aberration control plate 1 on the pupil plane P of projection optical system 3 so as to irradiate the wafer mark $WM_Y$ in two predetermined directions. The wafer mark $WM_Y$ is formed on a street line SL outside one shot area 4a on the wafer and has the pitch in the Y-direction to measure the Y-directional position of wafer 4, as shown in FIG. 16.

Diffracted light $DB_W$ emerges in the normal direction to the wafer mark $WM_Y$ and passes through the correction optical element $G_{YA3}$ located in the pupil plane P of projection optical system and then through the reticle window WI to reach a detection system in the alignment optical system as shown in FIG. 4.

When seen in the direction perpendicular to FIG. 13, as shown in FIG. 12A, the two irradiation beams $LB_1$, $LB_2$ from the alignment optical system appear proceeding along the same optical path to enter the projection optical system 3 at a position off the axis thereof and to reach the pupil plane P of projection optical system 3. At this position, the correction optical elements $G_{YA1}$, $G_{YA2}$, $G_{YA3}$ are so arranged that the correction optical elements $G_{YA1}$, $G_{YA2}$ and the correction optical element $G_{YA3}$ are symmetrically shifted on the Y coordinate in the measurement direction (Y direction). Accordingly, although the irradiation beams $LB_1$, $LB_2$ look symmetric with respect to the principal ray in the non-measurement direction in FIG. 12A, they are deflected by a correction angle $\theta_2$ by the correction optical elements $G_{YA1}$, $G_{YA2}$ to normally irradiate the wafer mark $WM_Y$ set off the axis. The wafer detection light $DB_W$ diffracted in the normal direction from the wafer mark $WM_Y$ is again deflected by a correction angle $\theta_2$ by the correction optical element $G_{YA3}$ located in the pupil plane P of projection optical system 3 then to pass through the reticle window WI and finally to reach the detection system in the unrepresented alignment optical system.

Thus, when seen facing the YZ plane parallel to the measurement direction (Y direction), the correction optical elements $G_{YA1}$, $G_{YA2}$ for irradiation light deflect the irradiation beams $LB_1$, $LB_2$ by the correction angle $\theta_1$, and when seen facing the XZ plane parallel to the X direction, they deflect the irradiation beams $LB_1$, $LB_2$ by the correction angle $\theta_2$. This means that the correction optical elements $G_{YA1}$, $G_{YA2}$ deflect the irradiation beams $LB_1$, $LB_2$ by the correction angle $\theta_1$ in the Y direction (measurement direction) to correct the axial chromatic aberration amount $\Delta L$ of projection optical system 3 and deflect the irradiation beams $LB_1$, $LB_2$ by the correction angle $\theta_2$ in the X direction at the same time to correct the magnification chromatic aberration amount $\Delta T$ of projection optical system 3.

Also, the correction optical element $G_{YA3}$ deflects the detection light $DB_W$ by the correction angle $\theta_2$ in the X direction to correct the magnification chromatic aberration amount $\Delta T$ of projection optical system 3 for the detection light $DB_W$.

Next described is a layout of correction optical elements $G_{YA1}$, $G_{YA2}$, $G_{YA3}$ of diffraction gratings in the present embodiment. The correction optical elements $G_{YA1}$, $G_{YA2}$, $G_{YA3}$ in the present embodiment are different from those in the first embodiment first in that they are arranged in the Y direction and further in that the correction optical elements $G_{YA1}$, $G_{YA2}$ for irradiation light have the same pitch and have gratings arranged as inclined in two different directions opposite to each other. This arrangement is for deflecting the irradiation beams $LB_1$, $LB_2$ by the correction angle $\theta_1$ in the mutually opposite directions in the Y direction (measurement direction) and by the correction angle $\theta_2$ in the X direction.

The following relations hold between the correction angles and the pitches of the diffraction gratings:

$$\tan \theta_4 = \sin \theta_2 / \sin \theta_1 \quad (6)$$

$$P_{YA1} = P_{YA2} = m\lambda_A \cos \theta_4 / \sin \theta_1 \quad (7)$$

$$P_{YA3} = m\lambda_A / \sin \theta_2 \quad (8)$$

where $P_{YA1}$, $P_{YA2}$, $P_{YA3}$ are the pitches of correction optical elements $G_{YA1}$ to $G_{YA3}$, respectively, $\lambda_A$ the wavelength of alignment light, $\theta_4$ the inclination of diffraction gratings $G_{YA1}$, $G_{YA2}$ with respect to the X direction, and m the order of diffraction (integer).

In the present embodiment, the correction optical elements $G_{YA1}$ to $G_{YA3}$ are set on the plane P of pupil (entrance pupil) of projection optical system 3 similarly as in the first embodiment, so that they may be formed in very small size as compared with the area of the pupil plane P. Therefore, their influence on the exposure light can be negligible, but it is preferable that the steps of gratings satisfy the relation of conditional Equation (4) or the relation of conditional Equation (5) as described in the first embodiment.

As described above, the second embodiment can independently control the optical paths of irradiation light and detection light to correct the chromatic aberration (axial chromatic aberration and magnification chromatic aberration) of projection optical system 3 in the same manner as in the first embodiment, achieving the same effect as in the first embodiment.

Although the second embodiment shows an example in which the alignment is effected in the Y direction for brevity of illustration, the alignment can be of course effected in the X direction by such an arrangement that a reticle mark having the pitch in the X direction and a reticle window adjacent thereto are provided in a non-exposure area next to the non-exposure area where the reticle mark $RM_Y$ and the reticle window WI are located and that a second alignment optical system is arranged above them. In this case, correction optical elements of diffraction gratings may be diffraction gratings arranged along the X direction similar to those $G_{YA1}$ to $G_{YA3}$ as described above.

Figure 21:
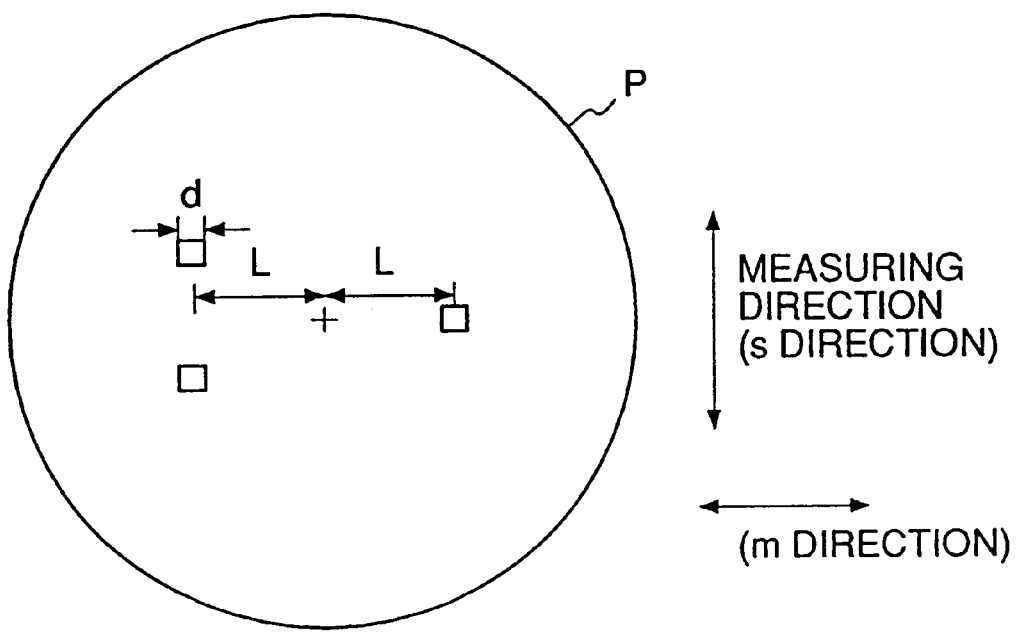
FIG. 21 is an illustration to show chromatic aberration correcting elements on the pupil plane of projection optical system in order to illustrate a breaking amount of telecentricity.
Figure 22A:
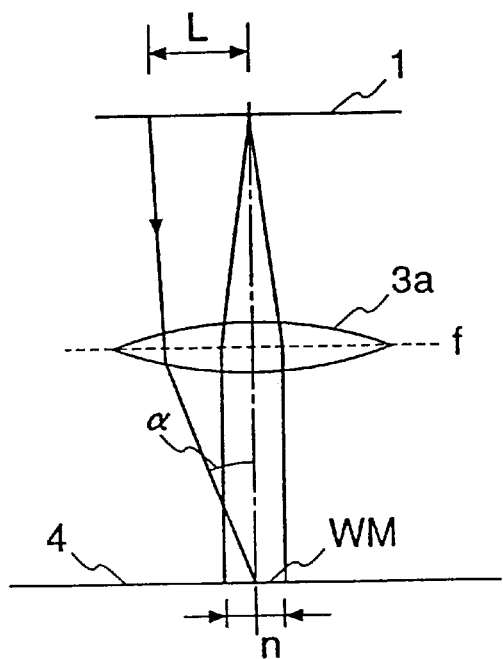
FIG. 22A is an illustration to show a projection optical system as a side view to illustrate a breaking amount of telecentricity.
Figure 22B:
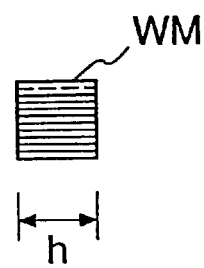
FIG. 22B is an illustration to show a wafer mark in order to illustrate a breaking amount of telecentricity.

Now described with FIG. 21 and FIGS. 22A, 22B is the relation between the layout of axial chromatic aberration correction optical elements formed on the pupil plane P of projection optical system 3 and the breaking degree of telecentricity (hereinafter referred to as "m-tele-breakage"). Suppose L is a distance from the center of pupil plane P of projection optical system to a correction optical element and d is the width of spread of alignment light (probe light) on the pupil plane. The following equation stands with numerical aperture NA of projection optical system, pattern length h (in the non-measurement direction) of wafer mark WM on wafer, and focal length f of rear lens group 3a in the projection optical system 3.

$$NA=h/(2f)$$

Letting λ be the wavelength of alignment light, an amount of spread of alignment light is 1.22λ/NA in diameter and the following relation stands.

$$d>2\lambda f/h$$

Also, since L>d/2 must be satisfied, the following relation holds.

$$L>\lambda f/h \tag{9}$$

Then letting α be an angle of m-tele-breakage as shown in FIG. 22A, ξ=sin α and the following relation holds. Here, the correction optical elements are formed on the chromatic aberration control plate 1.

$$L=\xi f$$

Substituting this relation into Equation (9), the following relation holds.

$$\xi f>\lambda f/h$$

Thus, the following relation holds as to the m-tele-breakage.

$$\xi>\lambda/h \tag{10}$$

The above study is for a couple of monochromatic beams. The first embodiment of the present invention employs the correction elements arranged in correspondence to the irradiating system and the light receiving system for plural wavelengths and therefore, together with the above conditions, the meridional angle and the sagittal angle must be set to avoid interference between beams in the alignment light. Also, since the second embodiment has the common light receiving system, consideration only of the sagittal angle is sufficient. Further, in case of use of higher-order light, the same argument can hold though being more complicated. For example, in case of use of zeroth order light and second order light, which could interfere with each other, one in the X direction and the other in the Y direction, the arrangement is adjusted in the direction to exceed Equation (10) by increasing or decreasing the amount of m-tele-breakage.

Incidentally, each of the first and second embodiments employs six correction optical elements for a single alignment optical system. Therefore, for example if the chromatic aberration is corrected for four alignment optical systems at a time, it is necessary without any device for numerous correction optical elements, i.e., 24 elements to be set on the chromatic aberration control plate 1 at the pupil. Then described below is a method for reducing the total number of correction optical elements by commonly using some of them.

Let us first consider making common the correction optical element $G_{XA3}$ (actually including two diffraction gratings) in FIG. 4 or the correction optical element $G_{YA3}$ in FIG. 12A in the first embodiment or in the second embodiment. In this case, the correction optical elements for chromatic aberration correction for the wavelengths must be located without being shifted in the non-measurement direction. For that, the correction optical elements $G_{XA1}$ and $G_{XA2}$ in FIG. 4 or the correction optical elements $G_{YA1}$ and $G_{YA2}$ in FIG. 12A must be apart to some extent as to the positions for the wavelengths in the measurement direction. The second embodiment will be detailed as representative.

Figure 17:
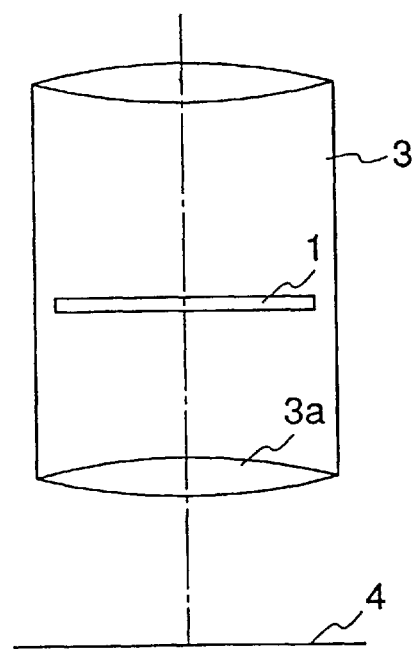
FIG. 17 is an illustration to show a positional relation between a projection optical system and a chromatic aberration control plate in the second embodiment.
Figure 18:
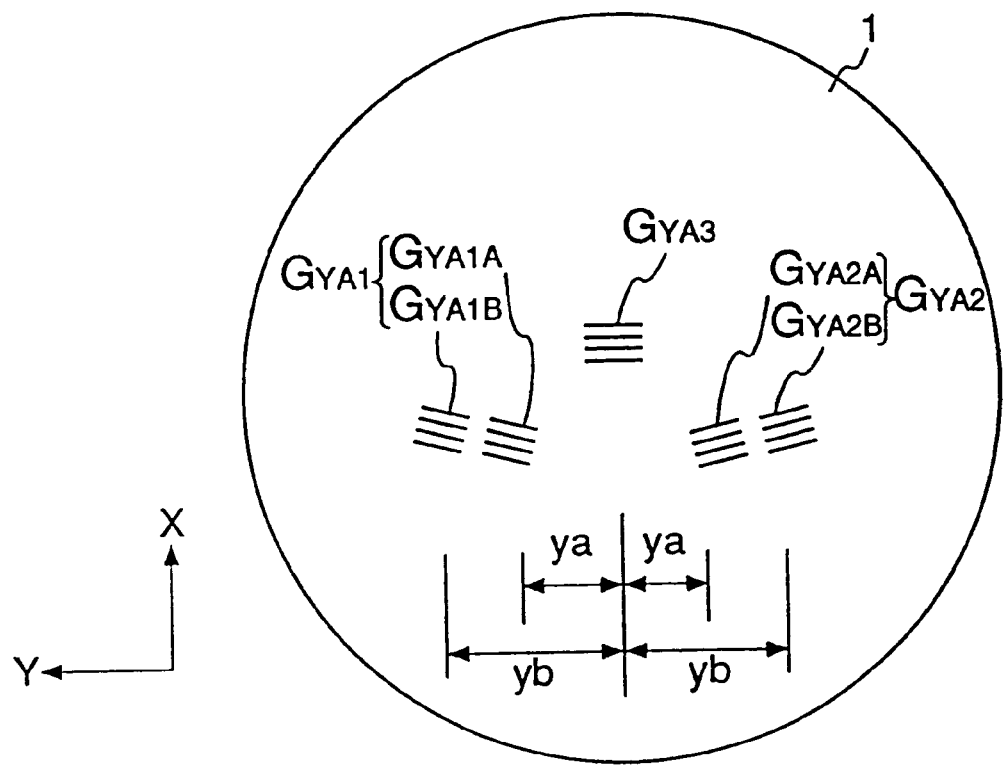
FIG. 18 is a plan view to further illustrate a layout and a function of chromatic aberration correcting elements formed on a chromatic aberration control plate in the second embodiment.

FIG. 17 shows the projection optical system 3 in the second embodiment and FIG. 18 a case in which the correction optical elements $G_{YA3B}$ and $G_{YA3A}$ in FIG. 15 are made common to each other. Letting $f_A$ be a focal length of lens 3a before the pupil of projection optical system 3, as shown in FIG. 17, the following equations express distances $y_a$ and $y_b$ in the Y direction from the optical axis to the correction optical elements for the wavelengths $\lambda_A$ and $\lambda_B$ in $G_{YA1}$ or $G_{YA2}$ in FIG. 18.

$$y_a=f_A\cdot\lambda_A/P$$

and $$y_b=f_A\cdot\lambda_B/P$$

Also, the beams with wavelengths $\lambda_A$ and $\lambda_B$ have respective spreads $\Phi_a$ and $\Phi_b$ on the chromatic aberration control plate 1 with the width (=w) of alignment mark, which are expressed by the following equations.

$$\Phi_a=2f_A\cdot\lambda_A/w$$

and $$\Phi_b=2f_A\cdot\lambda_B/w$$

To arrange the correction optical elements $G_{YA1A}$, $G_{YA1B}$ and $G_{YA2A}$, $G_{YA2B}$ in the measurement direction as separated from each other, the following relation must be satisfied.

$$y_a-y_b<\Phi_a, \Phi_b \tag{11}$$

In this case, letting Δλ stand for $(\lambda_A-\lambda_B)$ and $2f_A\cdot\lambda_0/w$ stand for $(\Phi_a+\Phi_b)/2$, the wavelength $\lambda_0$ is an average wavelength of the wavelengths $\lambda_A$ and $\lambda_B$. Then from Equation (11), the following condition must be satisfied as to the average wavelength $\lambda_0$.

$$\Delta\lambda>2P\cdot\lambda_0/w \tag{12}$$

This gives a common correction optical element $G_{YA3}$ for the alignment light including beams with different wavelengths, and there is no need to arrange two correction optical elements shifted in the non-measurement direction (X direction) in the correction optical elements $G_{YA1}$ and $G_{YA2}$, as shown in FIG. 18, which is convenient. With the correction optical elements as shown in FIG. 18, an amount of meridional telecentricity breakage (a breaking amount of telecentricity) of projection optical system 3 for light with wavelength $\lambda_A$ is the same as that for the light with wavelength $\lambda_B$.

Figure 19:
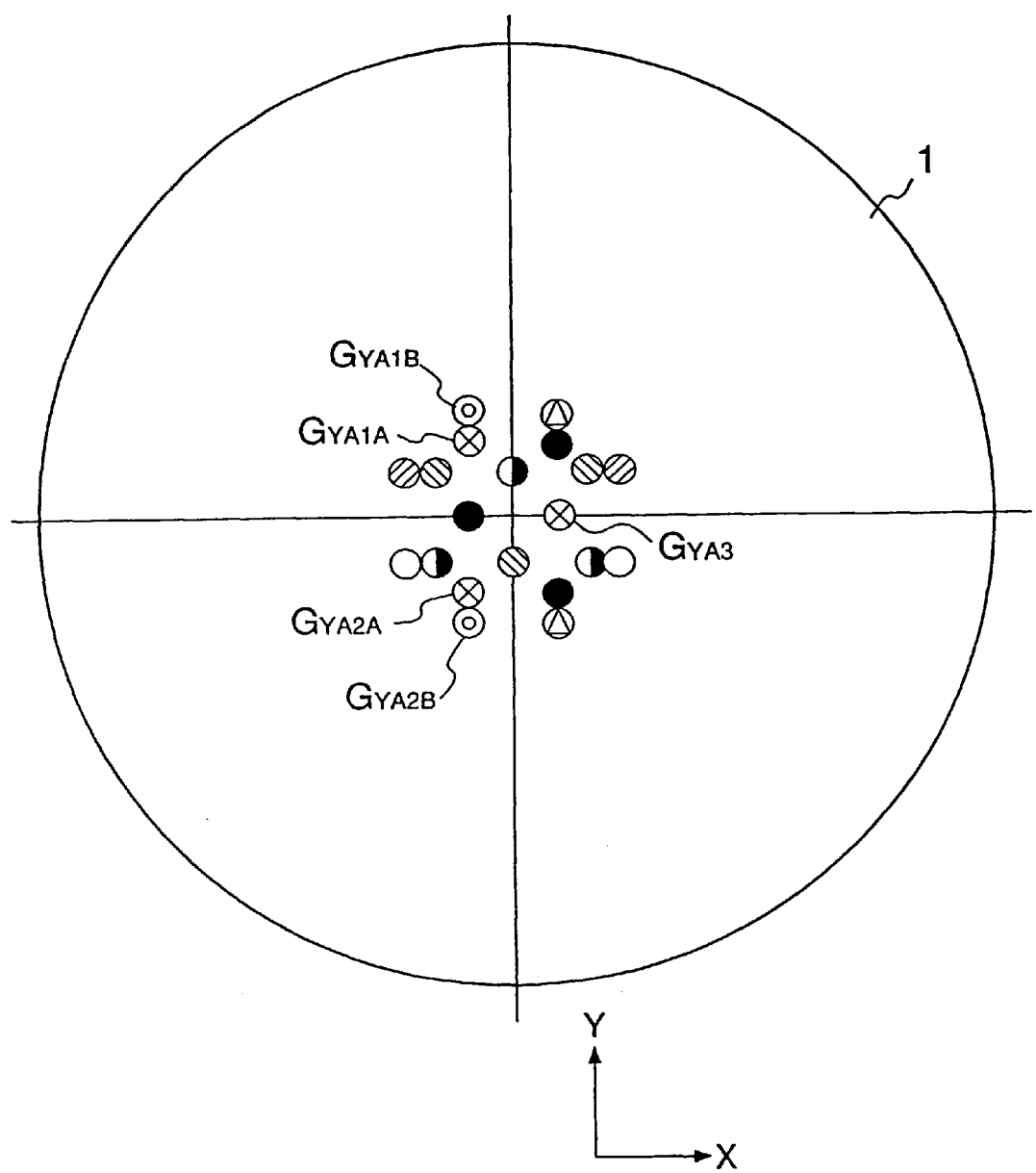
FIG. 19 is a plane view to show a modification of chromatic aberration control plate in the second embodiment.

FIG. 19 shows an example in which the common correction optical element $G_{YA3}$ as so arranged is employed for each of four alignment systems and the four correction optical elements are arranged on a transparent substrate 1. In FIG. 19, the chromatic aberration is corrected for the alignment light with two wavelengths $\lambda_A$, $\lambda_B$ toward one wafer mark $WM_Y$ by five correction optical elements $G_{YA1B}$, $G_{YA1A}$, $G_{YA2A}$, $G_{YA2B}$, $G_{YA3}$. Chromatic aberration of three other alignment systems is similarly corrected by other correction optical elements of 15 (=5×3) arranged as not interfering with each other. Accordingly, the example in FIG. 19 requires twenty correction optical elements in total, which are less than the twenty four correction optical elements in FIG. 2.

The above embodiment showed an example in which the chromatic aberration correction for the light with plural wavelengths was effected by the common correction optical element for the alignment light (detection light) from the wafer mark, but the chromatic aberration correction for the light with plural wavelengths may be effected by a common correction optical element for alignment light (irradiation light) toward the wafer mark in the same manner.

Incidentally, the second embodiment as shown in FIGS. 12A and 12B is so illustrated for convenience of illustration that two couples of double beams emerging from the heterodyne beam generating optical system HBG, that is, two beams $La_A$, $Lb_A$ with wavelength $\lambda_A$ and two beams $La_B$, $Lb_B$ with wavelength $\lambda_B$ enter the mirror 52 from the bottom of the figure and are reflected to the left. Actually, the light sources 10, 12 and the heterodyne beam generating optical system HBG are arranged in the direction perpendicular to the plane of figure, and thus FIGS. 12A, 12B show for convenience that the two pairs of double beams reflected by the mirror 52 and directed to the semitransparent mirror 14 are superimposed on each other in the plane of figure. Further, the two pairs of double beams entering the reticle 2 are inclined at a certain angle with respect to the meridional direction. That is, to break the telecentricity in the meridional direction, the two pairs of double beams are set eccentric to the optical axis of alignment optical system (objective lens 18). An amount of eccentricity of the two pairs of double beams, which pass through a plane in the alignment optical system conjugate with the pupil plane P of projection optical system 3 (which is a plane present between the collimator lens 51b and the objective lens 18 in FIGS. 12A and 12B and will be called simply as pupil conjugate plane), from the optical axis is uniquely determined by the m-tele-breaking amount (as in Equation (10)) as described above. In order to make the alignment beams eccentric to the optical axis in the pupil conjugate plane for the aforementioned m-tel-breakage, the beams emitted from the light sources 10, 12 are inclined by an amount corresponding to the above eccentricity amount to enter the AOM 13a for example. Thus, the light sources 10, 12 are simply arranged as inclined to the AOM 13a. In this case, the beams from the light sources 10, 12 are inclined with compressional waves formed in the AOM 13a as the center. Alternatively, a plane-parallel plate may be located as capable of being inclined at the aforementioned pupil conjugate plane or in the vicinity thereof for each of the two pairs of double beams so that the m-tele-breakage may be effected by inclining the plane-parallel plates.

Figure 23A:
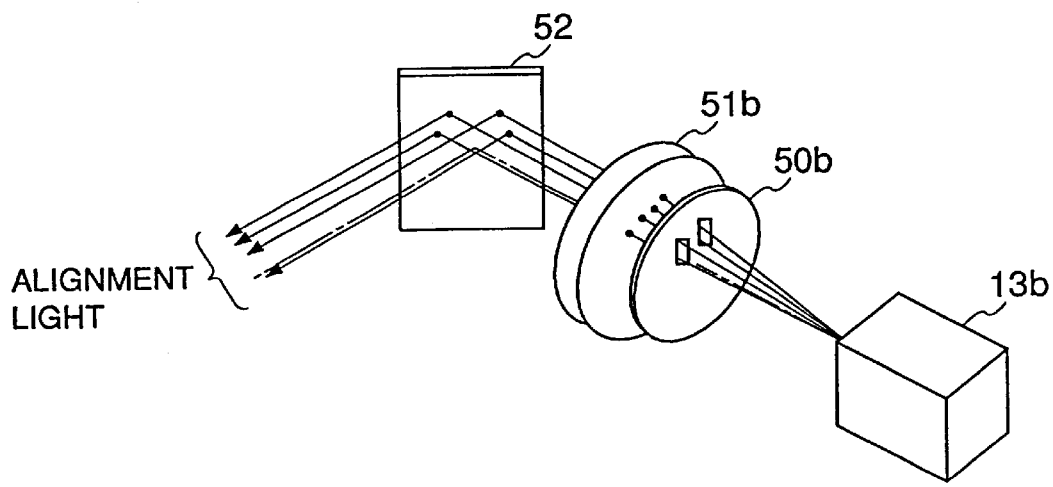
FIG. 23A is a perspective view to show the major construction of a heterodyne beam generating optical system in application of the chromatic aberration control plate shown in FIG. 15.
Figure 23B:
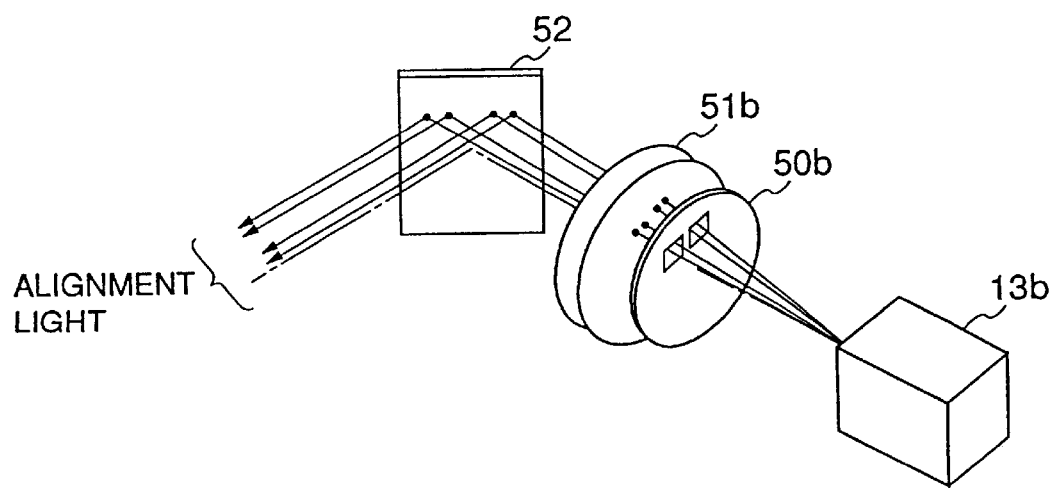
FIG. 23B is a perspective view to show the major construction of a heterodyne beam generating optical system in application of the chromatic aberration control plate shown in FIG. 18.

Assuming the m-tele-breakage is executed as described above, the breaking way of telecentricity is different in the meridional direction between the case using the chromatic aberration control plate shown in FIG. 15 and the case using the chromatic aberration control plate shown in FIG. 18. In more detail, the control plate in FIG. 15 must be so arranged that, among the two pairs of double beams, the two beams $La_A$, $Lb_A$ (solid lines) with wavelength $\lambda_A$ are guided through the reticle window WI to enter the correction optical elements $G_{YA1A}$, $G_{YA2A}$ while the two beams $La_B$, $Lb_B$ (dotted lines) with wavelength $\lambda_B$ through the reticle window WI to enter the correction optical elements $G_{YA1B}$, $G_{YA2B}$ outside the correction optical elements $G_{YA1A}$, $G_{YA2A}$, as shown in FIG. 12A. Accordingly, the incident angle into the reticle 2, that is, the m-tele-braking angle of the two beams $La_A$, $Lb_A$ with wavelength $\lambda_A$ is different from that of the two beams $La_B$, $Lb_B$ with wavelength $\lambda_B$. Thus, if the control plate in FIG. 15 is employed, the inclination angle of beam incident into AOM 13a is made different between the light sources 10 and 12 for example. In contrast, in case of the control plate in FIG. 18, the two beams $La_A$, $Lb_A$ with wavelength $\lambda_A$ and two beams $La_B$, $Lb_B$ with wavelength $\lambda_B$ respectively enter the correction optical elements $G_{YA1A}$, $G_{YA2A}$ and the correction optical elements $G_{YA1B}$, $G_{YA2B}$ even with the same m-tele-breaking angle. Then, in case the control plate in FIG. 18 is employed, the beams from the light sources 10, 12 entering the AOM 13a are inclined at the same angle for example. As described above, the incident angle or m-tele-breaking angle of the two pairs of double beams irradiating the reticle 2 must be adjusted in the meridional direction (direction perpendicular to the period direction of reticle mark) depending upon the type of control plate (or the layout of correction optical elements) applied to the projection optical system 3. This is the case in the first embodiment. The major structure of heterodyne beam generating optical system HBG is for example as shown in FIG. 23A for the case employing the chromatic aberration control plate in FIG. 15 while as shown in FIG. 23B for the case employing the chromatic aberration control plate in FIG. 18.

The above embodiments showed examples in which the position detection of wafer mark was carried out using interference beat light of±first-order diffracted light from the wafer mark, but the present invention also involves modifications in which the position detection is carried out using interference beat light between zeroth-order diffracted light and second-order diffracted light from the wafer mark. This will be described in detail with reference to FIG. 3A to FIG. 3D.

In these drawings, the beams $La_A$ and $Lb_A$ with wavelength $\lambda_A$ are irradiated onto the wafer mark $WM_X$, and, in addition to the interference beat light $Lc_A$ composed of the+first-order diffracted light of beam $La_A$ and the−first-order diffracted light of beam $Lb_A$, interference beat light $Ld_A$ composed of zeroth-order diffracted light of beam $La_A$ and −second-order diffracted light of beam $Lb_A$ and interference beat light $Le_A$ composed of+second-order diffracted light of beam $La_A$ and zeroth-order diffracted light of beam $Lb_A$ emerge from the wafer mark $WM_X$. Since each of these beams of interference beat light $Ld_A$ and $Le_A$ also has position information of wafer mark $WM_X$, the position detection can be performed with higher accuracy also utilizing these beams of interference beat light. Particularly, the interference beat light $Ld_A$ and $Le_A$ permits accurate position detection of wafer mark $WM_X$ even in the case that the wafer mark $WM_X$ can supply the interference beat light $Lc_A$ composed of±first-order diffracted light with low intensity because of the shape thereof for example.

Figure 20A:
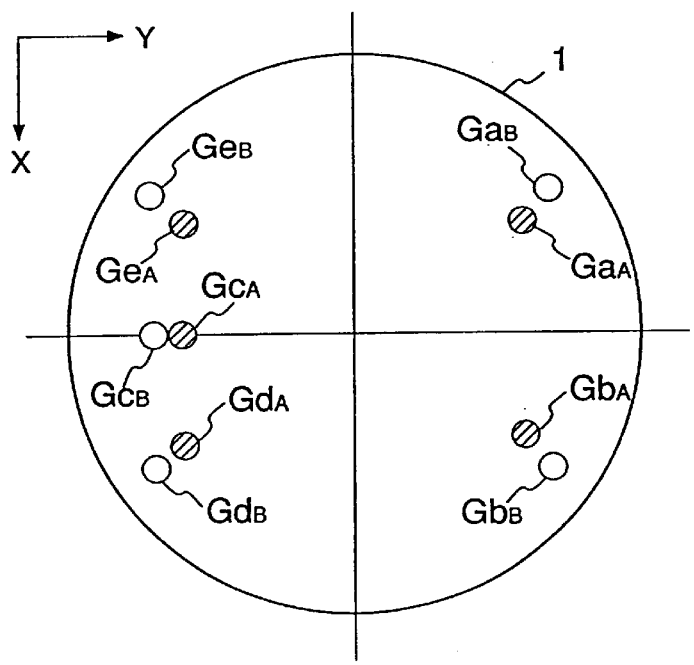
FIG. 20A is a plane view to show another modification of chromatic aberration control plate in the second embodiment.

In this case, there are correction optical elements $Gd_A$ and $Ge_A$ formed on the chromatic aberration control plate 1 in FIG. 3A to correct the chromatic aberration for the interference beat light $Ld_A$ and $Le_A$. Also, if correction optical elements are similarly formed for the alignment light with wavelength $\lambda_B$, the correction optical elements should be arranged in the layout shown in FIG. 20A. In FIG. 20A, the correction optical elements $Gd_A$ and $Ge_A$ correct the chromatic aberration for the interference beat light $Ld_A$ and $Le_A$ each composed of zeroth order light and second order light with wavelength $\lambda_A$ while the correction optical elements $Gd_B$ and $Ge_B$ correct the chromatic aberration for the interference beat light each composed of zeroth-order diffracted light and second-order diffracted light with wavelength $\lambda_B$. As for the three other alignment systems, ten correction optical elements for each alignment system are formed so as not to interfere with the ten correction optical elements shown in FIG. 20A.

Figure 20B:
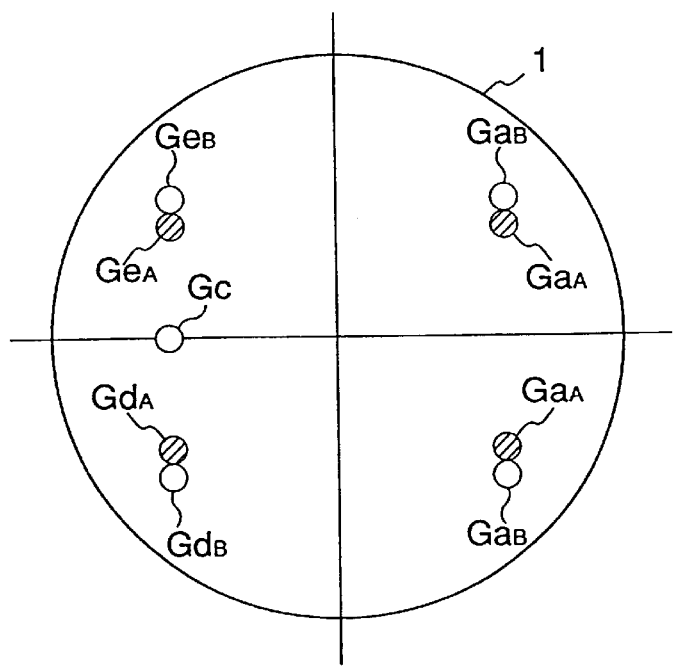
FIG. 20B is a plane view to show still another modification of chromatic aberration control plate in the second embodiment.

In the case of FIG. 20A, a part of correction optical elements can be used in common in the same manner as in the example of FIG. 18. Specifically, FIG. 20B shows an example in which the two correction optical elements $Gc_A$ and $Gc_B$ in FIG. 20A are substituted by a single correction optical element Gc. In FIG. 20B the correction optical elements for two different wavelengths (for example $Ga_A$ and $Ga_B$ are located at the same position in the non-measurement direction or in the Y direction. The common use of correction optical elements can be achieved by such arrangement.

In the apparatus as described above in the first embodiment or in the second embodiment (FIG. 4, FIGS. 12A and 12B), the dichroic mirror 11 coaxially synthesizes the laser beams emitted from the two light sources 10, 12 and the synthesized beam enters the AOM 13a. Optionally, a diffraction grating plate, a space filter and a lens system may be arranged in an optical path between the dichroic mirror 11 and the AOM 13a, for example as shown in Japanese Patent Application No. 4-187198. When a laser beam from the light source 10 is incident into the diffraction grating plate in such arrangement, diffracted light of various orders emerge from the diffraction grating plate. The space filter transmits only±first-order diffracted light out of beams emerging from the diffraction grating plate, and the±first-order diffracted light enters the AOM 13a through the lens system. Similarly, ±first-order diffracted light of a laser beam from the light source 12 also enters the AOM 13a, and has a slightly different angle of diffraction on the diffraction grating plate.

Embodiment 3

The third embodiment will be described with FIG. 24A to FIG. 31. This embodiment is an example in which only the axial chromatic aberration of projection optical system is controlled for the alignment light irradiated onto an alignment mark on wafer (wafer mark) but neither the lateral chromatic aberration for the alignment light irradiated onto the wafer mark nor the chromatic aberration for the alignment light returning from the wafer mark is corrected. Further, the first or second embodiment mainly utilizes±first-order diffracted light of alignment light, whereas the present embodiment also takes use of other order diffracted light into consideration.

FIG. 24A shows the main part of a projection exposure apparatus in the present embodiment and FIG. 24B is a right side view of the apparatus shown in FIG. 24A, in which, in the plane perpendicular to the optical axis of projection optical system 105, the Y axis is defined in parallel with the plane of FIG. 24A and the X axis is in parallel with the plane of FIG. 24B. In FIG. 24A, a dichroic mirror 103 is set as inclined at an inclination angle of 45 ° above a reticle 104. The dichroic mirror 103 reflects exposure light with wavelength $\lambda_1$ from an unrepresented illumination optical system to illuminate transfer circuit patterns on the reticle 104 with uniform illuminance. Under irradiation of the exposure light with wavelength $\lambda_1$, an image of circuit patterns on the reticle 104 is demagnified at 5:1 by a projection optical system 105 to be transferred onto a wafer 106 coated with a photoresist. The wafer 106 is set on a Z stage 107 which can be vertically moved in the Z direction parallel, to the optical axis $AX_0$ of projection optical system 105. The Z stage 107 is mounted on an X stage 108 which can be moved in the X direction perpendicular to the optical axis $AX_0$. The X stage 108 is mounted on a Y stage 109 which can be moved in the Y direction perpendicular to the optical axis $AX_0$ and to the X direction.

In FIG. 24A and FIG. 24B the alignment apparatus in the present embodiment is provided with an alignment optical system 101, an objective lens 102 and a chromatic aberration control plate 110 placed on the pupil plane of projection optical system 105. The detailed structure of alignment optical system 101 is shown in FIG. 24A and FIG. 24B. Actually, there are four alignment optical systems provided above the dichroic mirror 103, but the following description representatively concerns only a certain specific alignment optical system 101.

The alignment optical system 101 emits two beams of reticle alignment irradiation light $RB_1$, $RB_2$ with frequency difference $\Delta f$ (=50 kHz) (as shown by the broken line in FIG. 24A) and two beams of wafer alignment irradiation light $WB_1$, $WB_2$ also with frequency difference $\Delta f$ (=50 kHz). Also, the irradiation light has an average frequency of $\lambda_2$, which is different from the wavelength $\lambda_1$ of the exposure light. Among them, the reticle alignment irradiation light (hereinafter referred to as reticle irradiation light) $RB_1$, $RB_2$ is guided through the objective lens 102 and the dichroic mirror 103 to be focused on the reticle 104.

Figure 25:
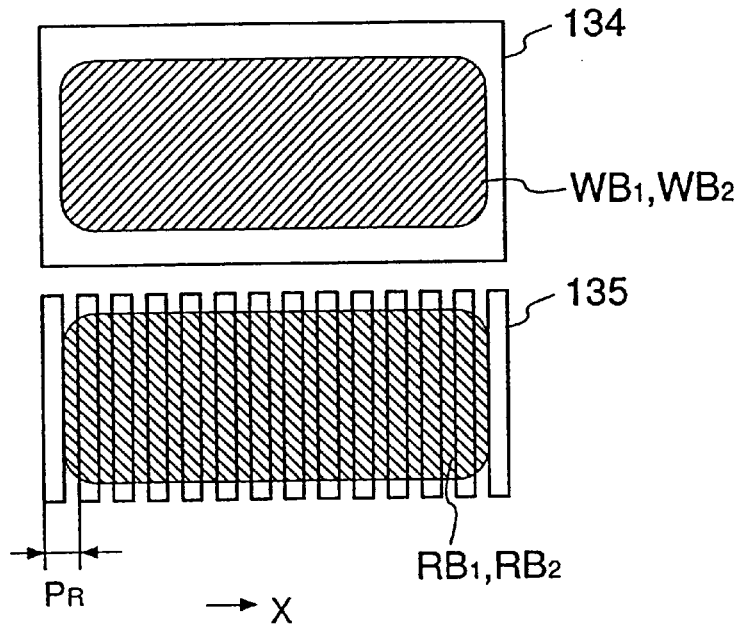
FIG. 25 is an enlarged plan view of major part to show an example of shape of reticle mark and reticle window in the third embodiment and a portion where the alignment light passes or is irradiated.

FIG. 25 shows an area near the circuit pattern area on the reticle 104. As shown in FIG. 25, formed near the circuit pattern area on the reticle 104 is a reticle mark 135 which is a diffraction grating with grating pitch $P_R$ in the X direction. A reticle window 134 of light-transmitting portion is formed near the reticle mark 135. In FIG. 24B, the reticle irradiation beams $RB_1$, $RB_2$ are irradiated at respective incident angles $-\theta_R$ and $\theta_R$ onto the reticle mark 135. Since the grating pitch $P_R$ of reticle mark 135 satisfies the following relation of Equation (13),+first-order diffracted light $RB_1$ (+1) of irradiation beam $RB_1$ and–first-order diffracted light $RB_2$ (−1) of irradiation beam $RB_2$ emerges vertically upward from the mark toward the alignment optical system 101.

$$\sin(\theta_R) = \lambda_2 / P_R \tag{13}$$

On the other hand, the wafer alignment irradiation light (hereinafter referred to as wafer irradiation light) $WB_1$, $WB_2$ is guided through the objective lens 102 and the dichroic mirror 103, as shown in FIG. 24A, and then passes through the reticle window 134 on the reticle 104 to reach the chromatic aberration control plate 110 in the projection optical system 105.

Figure 27:
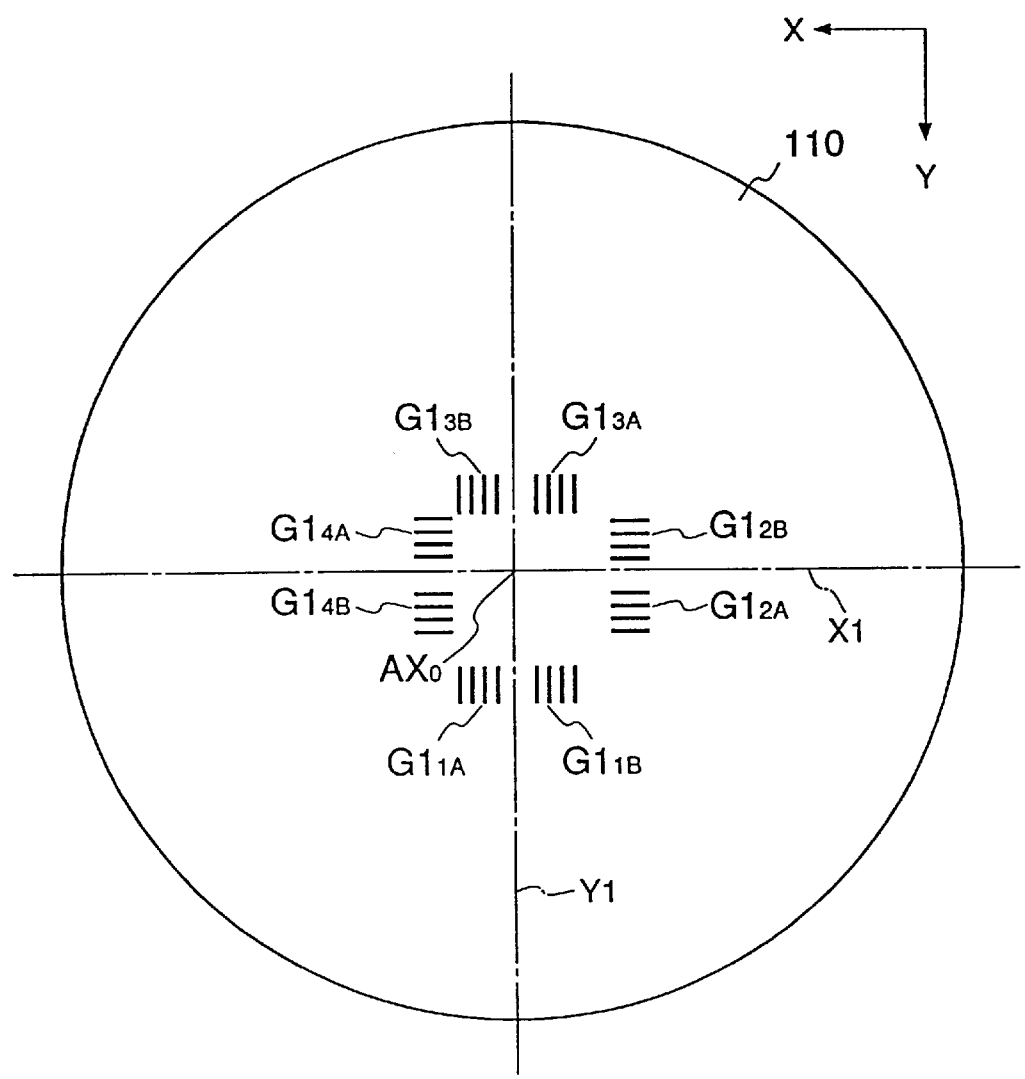
FIG. 27 is a plan view to illustrate a layout and a function of chromatic aberration correcting elements formed on a chromatic aberration control plate in the third embodiment.

FIG. 27 shows the shape of chromatic aberration control plate 110. As shown in FIG. 27, a pair of axial chromatic aberration control elements $G1_{1A}$, $G1_{1B}$ of diffraction gratings are formed in axial symmetry with each other with respect to a line Y1 parallel to the Y axis through the optical axis $AX_0$ on the chromatic aberration control plate 110 of transparent substrate. In the present embodiment, the axial chromatic aberration control elements $G1_{1A}$, $G1_{1B}$ correct the axial chromatic aberration for the two beams irradiated onto a wafer mark on the wafer 106. Also, the present embodiment is so arranged that there are 8 (=2×4) axial chromatic aberration control elements in total provided on the chromatic aberration control plate 110 in order to detect positions of four different wafer marks in the exposure area of projection optical system 105. In more detail, a pair of axial chromatic aberration control elements $G1_{3B}$, $G1_{3A}$ of diffraction gratings are formed on the other side of and at a distance different from the axial chromatic aberration control elements $G1_{1A}$, $G1_{1B}$ with respect to the line X1 parallel to the X axis through the optical axis $AX_0$, and two pairs of axial chromatic aberration control elements $G1_{2A}$, $G1_{2B}$ and $G1_{4B}$, $G1_{4A}$ are formed in axial symmetry with each other with respect to the line X1.

In FIG. 24B the irradiation beams $WB_1$, $WB_2$ are incident into the axial chromatic aberration control elements $G1_{1B}$, $G1_{1A}$, respectively, on the chromatic aberration control plate 110 and their paths are bent by respective angles $-\theta_{G1}$ and $\theta_{G1}$. Then the irradiation beams $WB_1$, $WB_2$ are irradiated at respective incident angles $-\theta_W$ and $\theta_W$ onto the wafer mark 136 on wafer 106.

Figure 26:
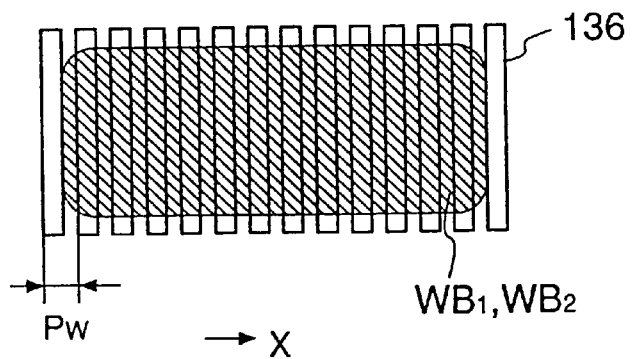
FIG. 26 is an enlarged plan view of major part to show an example of shape of wafer mark in the third embodiment and a portion where alignment light is irradiated.

FIG. 26 shows the wafer mark 136 on the wafer 106. As shown in FIG. 26, the wafer mark 136 is a diffraction grating formed at the grating pitch $P_W$ in the measurement direction (X direction). Since the grating pitch $P_W$ of wafer mark 136 satisfies the following relation of Equation (14),+first-order diffracted light $WB_1$ (+1) of irradiation beam $WB_1$ and –first-order diffracted light $WB_2$ (−1) of irradiation beam $WB_2$ emerges vertically upward, as shown in FIG. 24B to be alignment detection light (hereinafter referred to as first alignment detection light).

$$\sin(\theta_W) = \lambda_2/P_W \qquad (14)$$

Also, second order diffracted light $WB_1$ (+2) of irradiation beam $WB_1$ and zeroth-order diffracted light $WB_2$ (0) of irradiation beam $WB_2$ emerges at diffraction angle $\theta_W$ in parallel to be alignment detection light (hereinafter referred to as second alignment detection light) and zeroth-order diffracted light $WB_1$ (0) of irradiation beam $WB_1$ and −second-order diffracted light $WB_2$ (−2) of irradiation beam $WB_2$ emerges at diffraction angle $-\theta_W$ in parallel to be alignment detection light (hereinafter referred to as third alignment detection light). Since the irradiation beams toward the wafer mark 136 are incident into the wafer mark 136 as inclined at an angle $\theta_m$ with respect to the normal line to the wafer 106 in the non-measurement direction (Y direction), as shown in FIG. 24A, the above three pairs of alignment detection light beams pass through the chromatic aberration control plate 110 at positions different from the positions where the incident beams passed and therefore do not pass through the axial chromatic aberration control elements $G1_{1A}$, $G1_{1B}$. Accordingly, the alignment detection beams pass through the control plate without correction of chromatic aberration and then through the reticle window 134 on the reticle 104 to return to the alignment optical system 101.

Figure 28:
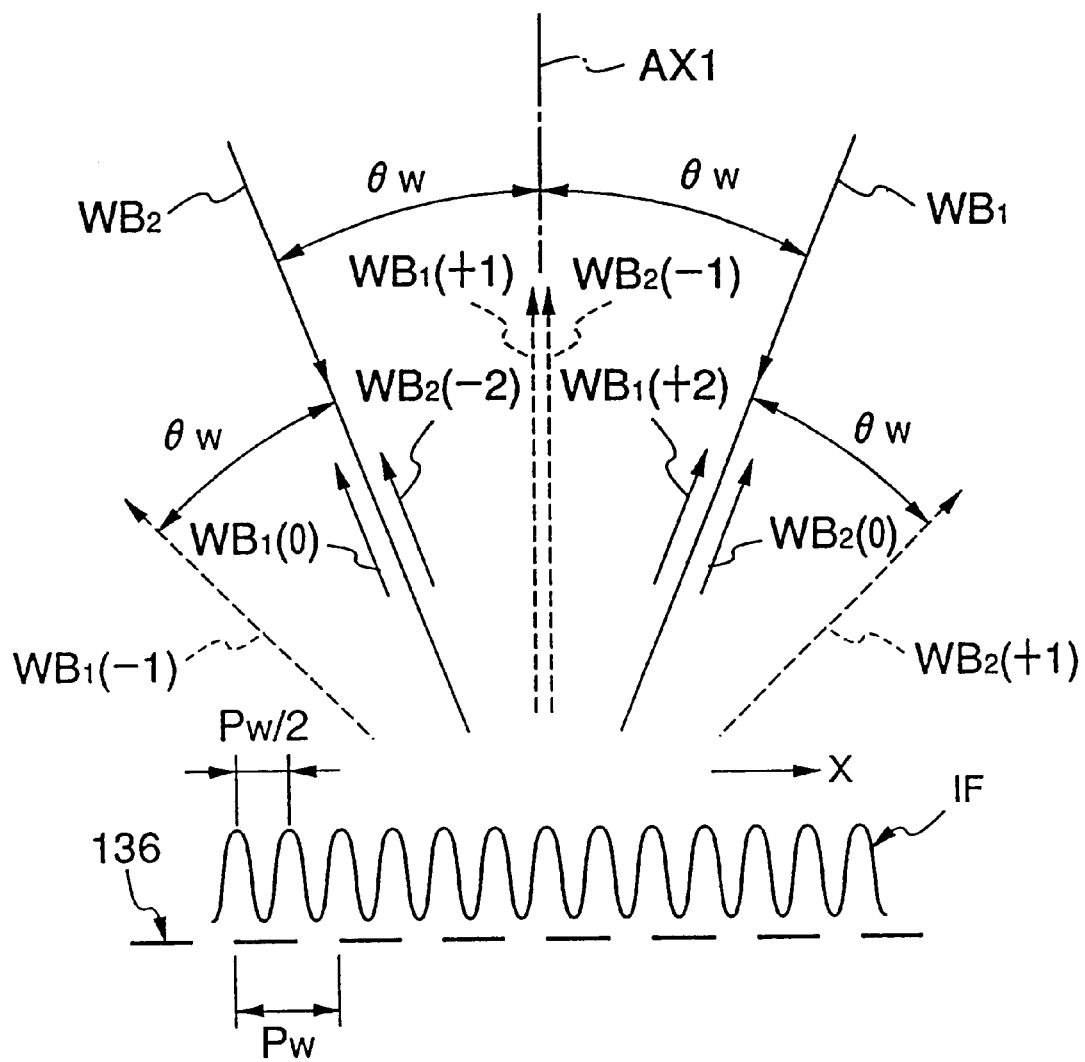
FIG. 28 is an illustration to show a relation between irradiation light and detection light in the third embodiment.

The three pairs of alignment detection light beams are next described in detail with reference to FIG. 28 enlarging the portion around the wafer mark 136 in FIG. 24B. In FIG. 28, when the two coherent irradiation beams $WB_1$, $WB_2$ with frequency difference $\Delta f$ are incident at cross angle $2\theta_W$ onto the wafer mark 136 of one-dimensional diffraction grating with pitch $P_W$, one-dimensional interference fringes IF appear at pitch $P_W/2$ on the wafer mark 136. The interference fringes IF are interference fringes flowing according to the frequency difference $\Delta f$ in the pitch direction (X direction) of wafer mark 136, a moving velocity V of which is expressed by the relation of $V = \Delta f \cdot P_W/2$. Consequently, the pair of+first-order diffracted light $WB_1$ (+1) of irradiation beam $WB_1$ and−first-order diffracted light $WB_2$ (−1) of irradiation beam $WB_2$ emerge vertically upward from the wafer mark 136, and other pairs as described above.

Normally, such double beam interference alignment system (LIA system) detects a positional deviation of wafer mark 136 by obtaining a phase difference between a photoelectric signal of reference interference light separately produced from two emission beams and a photoelectric signal of interference light (first alignment detection light) of±first-order diffracted light $WB_1$ (+1), $WB_2$ (−1) proceeding along the symmetry axis AX1 obtained by projection of the optical axis $AX_0$ of projection optical system 105 in the Y direction.

Also, +second-order diffracted light $WB_1$ (+2) of irradiation beam $WB_1$ and zeroth-order diffracted light $WB_2$ (0) of irradiation beam $WB_2$ emerges in parallel as interference light (second alignment detection light) backward along the incident direction of irradiation beam $WB_1$. Similarly, zeroth-order diffracted light $WB_1$ (0) of irradiation beam $WB_1$ and −second-order diffracted light $WB_2$ (−2) of irradiation beam $WB_2$ emerges in parallel as interference light (third alignment detection light) backward along the incident direction of irradiation beam $WB_2$. Accordingly, an amount of positional deviation can be also obtained by averaging a positional deviation amount detected from a phase difference between the reference photoelectric signal and a photoelectric signal of interference light (third alignment detection light) between the zeroth-order diffracted light $WB_2$ (0) and the +second-order diffracted light $WB_1$ (+2) and a positional deviation amount detected from a phase difference between the reference photoelectric signal and a photoelectric signal of interference light (second alignment detection light) between the zeroth-order diffracted light $WB_1$ (0) and the −second-order diffracted light $WB_2$ (−2).

Thus, the alignment apparatus in the present embodiment can obtain an amount of positional deviation in either mode selected from the first mode using the±first-order diffracted light $WB_1$ (+1), $WB_2$ (−1), the second mode using the zeroth-order diffracted light $WB_2$ (0), the second-order diffracted light $WB_1$ (+2) and the zeroth-order diffracted light $WB_1$ (0), the −second-order diffracted light $WB_2$ (−2), and the third mode in which the intensity of interference light is compared between the first mode and the second mode and one with greater intensity is chosen to be used. The intensity of±first-order diffracted light could be lowered because of asymmetric cross section of wafer mark 136 depending upon the semiconductor process. In such occasions, the positional deviation amount of wafer mark 136 can be accurately detected using the above alignment detection light composed of the zeroth-order diffracted light and the second-order diffracted light.

The alignment optical system 101 is next described in more detail with reference to FIG. 29A and FIG. 29B. FIG. 29A is a drawing to show the alignment optical system 101 as seen in the same direction as FIG. 24A, FIG. 29B a drawing to show the alignment optical system 101 as seen in the same direction as FIG. 24B and FIG. 29C a bottom view of FIG. 29B. In these drawings, a laser beam emitted from a laser source 111 is split into two beams by a beam splitter 112, one of which enters an acousto-optic modulator (hereinafter referred to as "AOM") 114 and the other of which enters another AOM 115 after reflected by a reflection prism 113.

The AOMs 114 and 115 are driven at respective frequencies $F_1$ and $F_2$. Slits 116 and 117 each select only +first-order diffracted light out of laser beams of various orders diffracted by the AOMs 114 and 115 and the thus selected beams are used as alignment irradiation beams $B_1$ and $B_2$. If the laser beams entering the AOMs 114 and 115 each have the frequency of $f_0$, the alignment irradiation beams $B_1$ and $B_2$ will have respective frequencies $f_1$ and $f_2$ including an increment of drive frequency $F_1$ or $F_2$ of AOM 114 or 115. Namely, the following relations hold.

$$f_1 = f_0 + F_1 \quad (15)$$

$$f_2 = f_0 + F_2 \quad (16)$$

The irradiation beam $B_1$ is guided through a plane-parallel plate glass 118 for path adjustment and via a reflection prism 120 then to enter a coupling prism 121, while the other irradiation beam $B_2$ is guided through a plane-parallel plate glass 119 for path adjustment then to enter the coupling prism 121. The coupling prism 121 makes optical paths of irradiation beams $B_1$, $B_2$ nearly parallel to each other and a lens 122 focuses the beams on a field slit 123 located at a position conjugate with the reticle and the wafer. A plane-parallel plate 124 is located after the field slit 123, and has an incident plane which is a thin film vapor-deposited as a half mirror. The irradiation beams $B_1$, $B_2$ outgoing from an aperture of the field slit 123 are then split by the plane-parallel plate 124 into reticle irradiation beams $RB_1$, $RB_2$ (as shown by the broken line in FIG. 29A) and wafer irradiation beams $WB_1$, $WB_2$. The irradiation beams $RB_1$, $RB_2$ and the irradiation beams $WB_1$, $WB_2$ then pass through a lens 125 and a beam splitter 126 to be outgoing from the alignment optical system 101 toward the reticle.

The alignment detection light returning from the reticle mark 135 and the alignment detection light returning from the wafer mark 136 in FIG. 24A and FIG. 24B enters the beam splitter 126 in the alignment optical system 101, as shown in FIG. 29B. After these beams of alignment detection light are reflected by the beam splitter 126, they pass through a lens 127 and then enter a detection light separating prism 128 located conjugate with the reticle and the wafer. The detection light separating prism 128 separates the reticle detection light $RB_1$ (+1), $RB_2$ (−1) from the reticle mark, from the wafer detection light (first to third alignment detection light) from the wafer mark. In this case, as shown in FIG. 29C, the reticle detection light shown by the broken line enters a region on the detection light separating prism 128 different from a region where the wafer detection light shown by the solid line enters, so that they can be completely separated from each other by providing a transmissive portion in a part of reflective plane in the detection light separating prism 128.

After the ±first-order diffracted light $RB_1$ (+1) $RB_2$ (−1) as the reticle detection light passes through the detection light separating prism 128, the light is photoelectrically detected and converted into electric signals by a photoelectric detector 129. On the other hand, the detection light separating prism 128 reflects the three types of interference light: $WB_1$ (+1), $WB_2$ (−1); $WB_1$ (0), $WB_2$ (−2); $WB_1$ (+2), $WB_2$ (0) toward a photoelectric detector 131, which photoelectrically detects and converts the light into electric signals. The photoelectric detector 131 is divided into three portions therein to photoelectrically detect the interference light: $WB_1$ (+1), $WB_2$ (−1); $WB_1$ (0), $WB_2$ (−2); $WB_1$ (+2), $WB_2$ (0) as the wafer detection light independently of each other.

Figure 30:
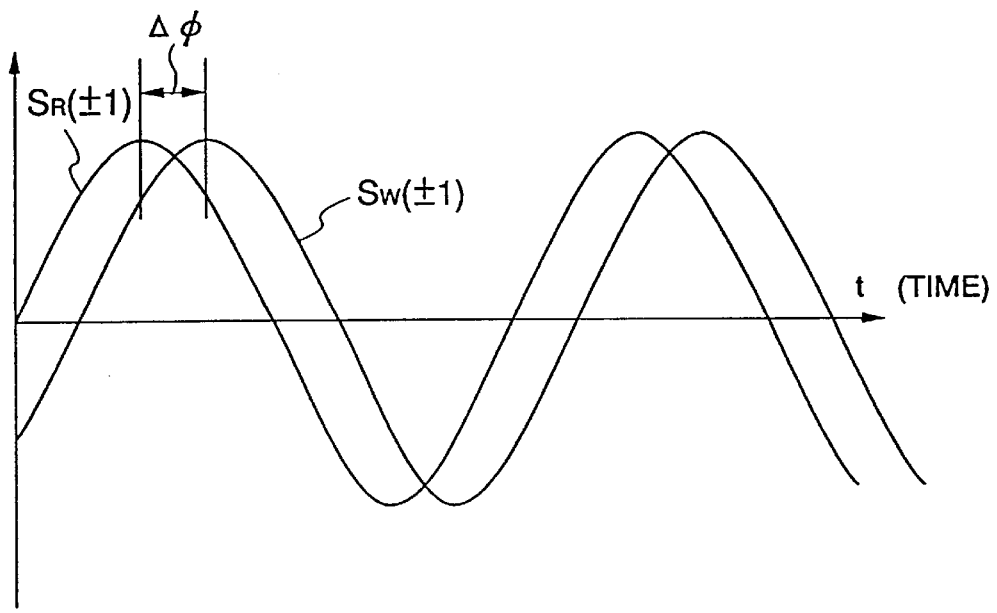
FIG. 30 is an illustration to illustrate the principle of alignment inspection in the third embodiment.
Figure 31:
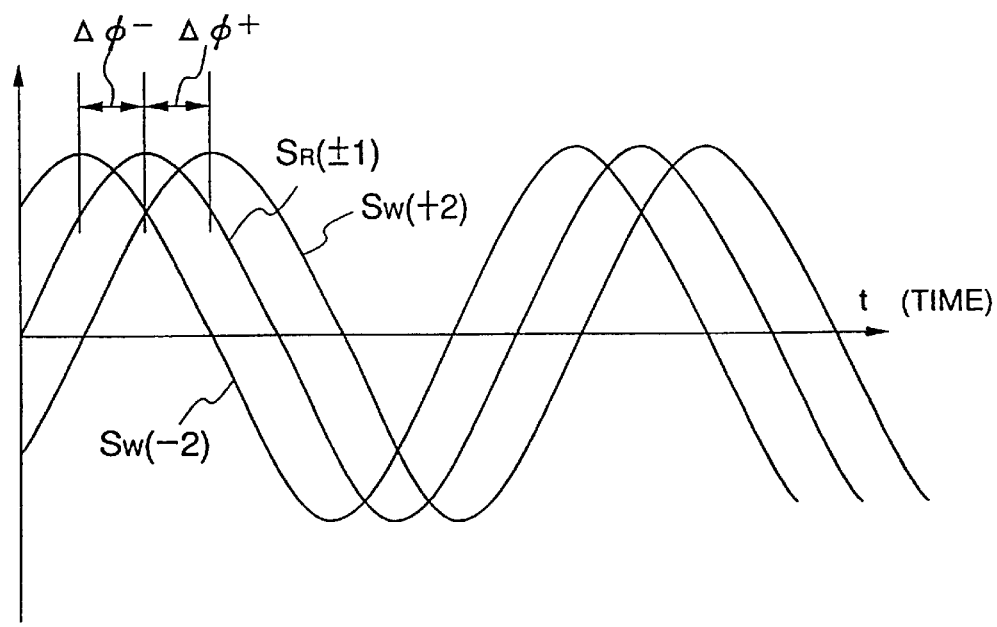
FIG. 31 is an illustration to further illustrate the principle of alignment inspection in the third embodiment.

FIGS. 30 and 31 show alignment signals output from the photoelectric detectors 129 and 131. FIG. 30 shows the reticle signal $S_R$ (±1) and the wafer signal $S_W$ (±1), in which the wafer signal $S_W$ (±1) is a sinusoidal wave obtained from the interference light (first alignment detection light) $WB_1$ (+1), $WB_2$ (−1) with frequency difference $\Delta f$ and the reticle signal $S_R$ (±1) a sinusoidal wave obtained from the interference light $RB_1$ (+1), $RB_2$ (−1) with frequency difference $\Delta f$. Detecting a phase difference $\Delta\Phi$ between the two alignment signals, relative positional deviation $\Delta x_1$ can be calculated by the following relation of Equation (17) between the reticle 104 and the wafer 106.

$$\Delta x_1 = Pw \cdot \Delta\Phi / 4\pi \quad (17)$$

Similarly, FIG. 31 shows the reticle signal $S_R$ (±1), a wafer signal $S_W$ (+2) and a wafer signal $S_W$ (−2), in which the wafer signal $S_W$ (+2) is a sinusoidal wave obtained from the interference light $WB_1$ (+2), $WB_2$ (0) with frequency difference $\Delta f$ as the wafer detection light and the wafer signal $S_W$ (−2) a sinusoidal wave obtained from the interference light $WB_1$ (0), $WB_2$ (−2) with frequency difference $\Delta f$. Detecting phase differences $\Delta\Phi^+$ and $\Delta\Phi^-$ between the two wafer signals and the reticle signal $S_R$ (±1), the relative positional deviation $\Delta x_2$ can be calculated by the following relation of Equation (18) between the reticle 104 and the wafer 106.

$$\Delta x_2 = Pw \cdot (\Delta\Phi^{30} + \Delta\Phi^-)/(2 \cdot 4\pi) \quad (18)$$

The positional deviations $\Delta x_1$ and $\Delta x_2$ obtained by Equations (17) and (18) may be selectively used. For example, one with higher level of signal can be selectively used while comparing a signal level of the wafer signal $S_W$ (±1) with those of the wafer signals $S_W$ (±2), $S_W$ (−2).

Embodiment 4

The fourth embodiment of the present invention is next described with reference to FIG. 32A to FIG. 33. The fourth embodiment is an example in which the axial chromatic aberration and the lateral chromatic aberration of projection optical system 105 is corrected for alignment light irradiated onto a wafer mark and the axial chromatic aberration and the lateral chromatic aberration is also corrected for the alignment light returning from the wafer mark. The alignment is effected using not only ±first-order diffracted light of alignment light but also diffracted light of other orders. In FIG. 32A and FIG. 32B elements corresponding to those in FIG. 24A and FIG. 24B are denoted by the same. reference numerals and omitted to describe the details thereof herein.

FIG. 32A is a drawing to show a projection exposure apparatus in the present embodiment as seen along the X direction and FIG. 32B is a right side view of FIG. 32A. In the present embodiment, a chromatic aberration control plate 132 is located on the pupil plane of projection optical system 105. The chromatic aberration control plate 132 is different from that 110 in the third embodiment in layout and function of chromatic aberration control elements thereon.

Figure 33:
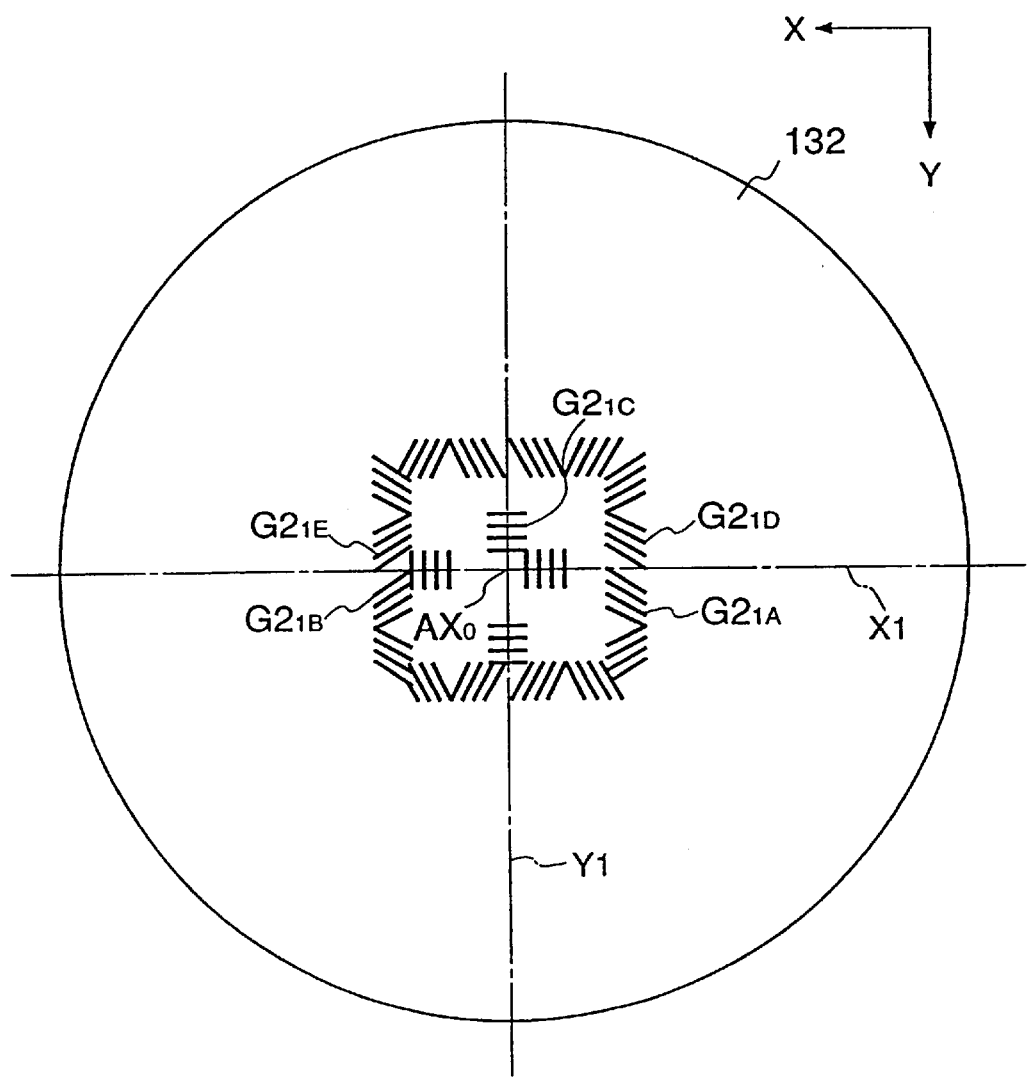
FIG. 33 is a plan view to illustrate a layout and a function of chromatic aberration correcting elements formed on a chromatic aberration control plate in the fourth embodiment.

FIG. 33 shows a layout and the shape of chromatic aberration control elements on the chromatic aberration control plate 132 in the fourth embodiment. A pair of axial and lateral chromatic aberration control elements $G2_{1A}$, $G2_{1B}$ of diffraction gratings are formed in axial symmetry with each other with respect to a line Y1 parallel to the Y axis through the optical axis $AX_0$ on the chromatic aberration control plate 132 of transparent substrate. In the present embodiment, these axial and lateral chromatic aberration control elements $G2_{1A}$, $G2_{1B}$ control the axial chromatic aberration and the lateral chromatic aberration of two beams irradiated onto a wafer mark on the wafer 106.

Also, lateral chromatic aberration control elements $G2_{1D}$, $G2_{1E}$ are formed at positions symmetric with the chromatic aberration control elements $G2_{1A}$, $G2_{1B}$ with respect to the line X1 parallel to the X direction through the optical axis $AX_0$ and in such a shape as the chromatic aberration control elements $G2_{1A}$, $G2_{1B}$ are shifted in parallel in the Y direction. Further, a lateral chromatic aberration control element $G2_{1C}$ of diffraction grating is formed at a predetermined pitch in the direction of the line Y1 nearly at the center between the chromatic aberration control elements $G2_{1D}$, $G2_{1E}$. These lateral chromatic aberration control elements $G2_{1C}$, $G2_{1D}$, $G2_{1E}$ perform correction of chromatic aberration for alignment detection light from the wafer mark 136. The present embodiment is provided with 20 (=5×4) chromatic aberration control elements in total on the chromatic aberration control plate 132 in order to detect positions of four wafer marks located at four different portions in the exposure area of projection optical system 105. The chromatic aberration control elements are arranged at different distances to the line Y1 or to the line X1 from each other to avoid overlap therebetween.

Again in FIG. 32A and FIG. 32B the wafer alignment irradiation beams $WB_1$ and $WB_2$ irradiated onto the wafer mark 136 on the wafer 106 pass through a reticle window 134 on the reticle 104 to enter the projection optical system 105 in the present embodiment. Then the irradiation beams $WB_1$ and $WB_2$ are irradiated onto the wafer mark 136 on the wafer 106 while controlled not only in axial chromatic aberration but also in lateral chromatic aberration by the axial and lateral chromatic aberration control elements $G2_{1A}$, $G2_{1B}$ on the chromatic aberration control plate 132. In this occasion, the position of the irradiation beams $WB_1$ and $WB_2$ to be irradiated onto the wafer mark 136 is shifted in the direction to approach the optical axis of the projection optical system 105, that is, in the meridional direction by $\Delta\beta$ from the position in the third embodiment, as shown in FIG. 32A.

Wafer detection light $WB_1$ (+1), $WB_2$ (−1), wafer detection light $WB_1$ (+2), $WB_2$ (0) and wafer detection light $WB_1$ (0), $WB_2$ (−2) emerges from the wafer mark 136 similarly as in the third embodiment. When the wafer detection light reaches the chromatic aberration control plate 132, the wafer detection light is controlled in lateral chromatic aberration by respective lateral chromatic aberration control elements $G2_{1C}$, $G2_{1D}$, $G2_{1E}$. As a result, the wafer detection light passes through the reticle window 134 through which the alignment light entered, and then returns into the alignment optical system 101. The structure and operation except for the above are the same as those in the third embodiment, and therefore are omitted to explain herein.

Since the fourth embodiment controls the chromatic aberration of alignment light irradiated onto the wafer mark 136 and the chromatic aberration of alignment light from the wafer mark 136, the reticle mark 135 and the wafer mark 136 are conjugate with each other under the alignment light as seen from the alignment optical system 101, which simplifies the structure of alignment optical system 101. Also, the reticle window 134 formed on the reticle 104 can be set at a convenient position and the wafer mark 136 can also be set at a desired position, for example at a position where the exposure light is less irradiated. Further, the reticle window 134 may be made smaller.

Embodiment 5

The fifth embodiment of the present invention is next described with reference to FIG. 34A to FIG. 37. The fifth embodiment is an example in which the control function of axial chromatic aberration is removed from the chromatic aberration control elements in the fourth embodiment. The alignment is carried out using not only±first-order diffracted light of alignment light but also diffracted light of other orders. In FIG. 34A, FIG. 34B, FIG. 36A, FIG. 36B and FIG. 36C, elements corresponding to those in FIG. 32A and FIG. 32B are denoted by the same reference numerals and omitted to explain herein.

FIG. 34A is a drawing to show a projection exposure apparatus in the present embodiment as seen along the X direction and FIG. 34B is a right side view of FIG. 34A. In the present embodiment, a chromatic aberration control plate 133 is located on the pupil plane of projection optical system 105. The function of chromatic aberration control elements on the chromatic aberration control plate 133 is different from that on the chromatic aberration control plate 132 in the fourth embodiment.

Figure 35:
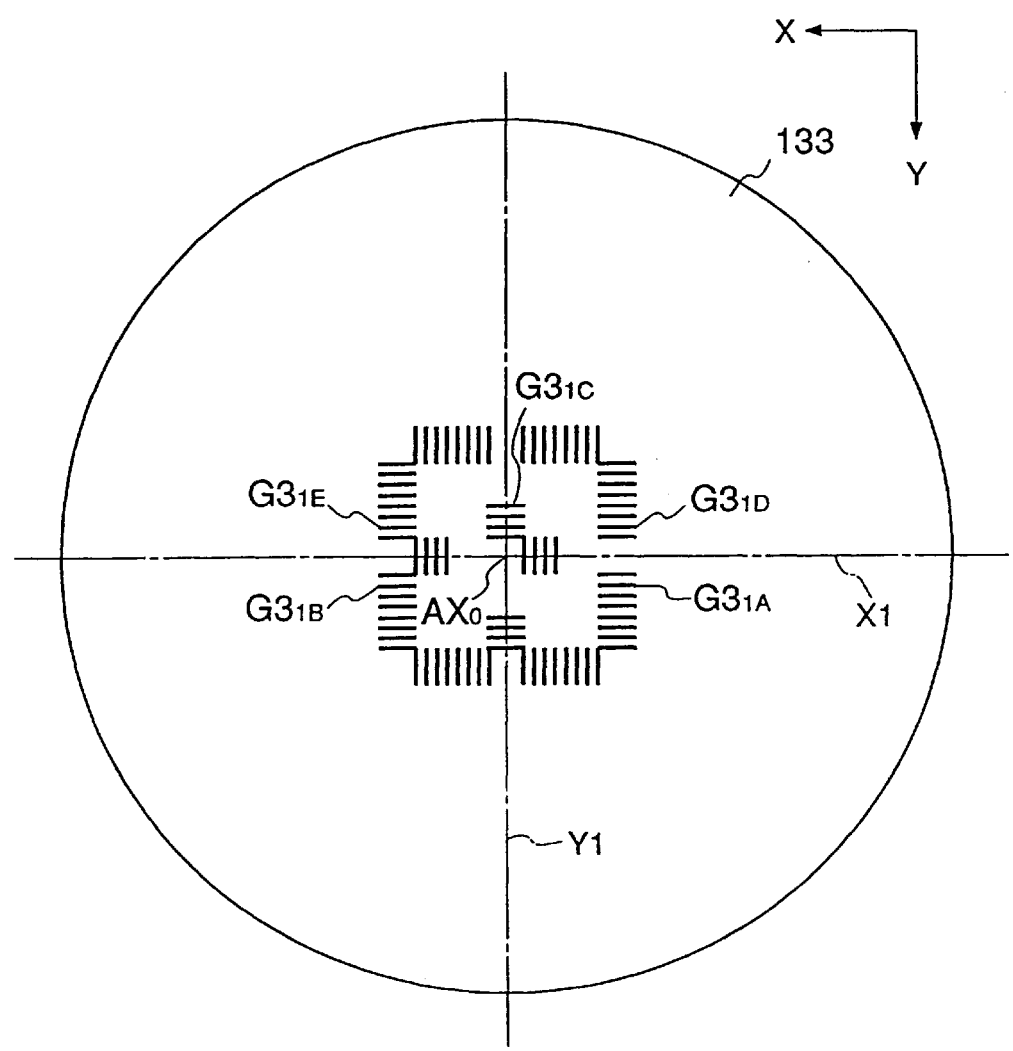
FIG. 35 is a plan view to illustrate a layout and a function of chromatic aberration correcting elements formed on a chromatic aberration control plate in the fifth embodiment.

FIG. 35 shows a layout and the shape of chromatic aberration control elements on the chromatic aberration control plate 133 in the fifth embodiment. A pair of lateral chromatic aberration control elements $G3_{1A}$, $G3_{1B}$ of diffraction gratings are formed in axial symmetry with respect to the line Y1 parallel to the Y axis through the optical axis $AX_0$ on the chromatic aberration control plate 133 of transparent substrate. In the present embodiment, these lateral chromatic aberration control elements $G3_{1A}$, $G3_{1B}$ control the lateral chromatic aberration of two beams irradiated onto a wafer mark on the wafer 106.

Also, lateral chromatic aberration control elements $G3_{1D}$, $G3_{1E}$ are formed at positions symmetric with the chromatic aberration control elements $G3_{1A}$, $G3_{1B}$ with respect to the line X1 parallel to the X direction through the optical axis $AX_0$ and in such a shape as the chromatic aberration control elements $G3_{1A}$, $G3_{1B}$ are shifted in parallel in the Y direction. Further, a lateral chromatic aberration control element $G3_{1C}$ of diffraction grating is formed at a predetermined pitch nearly in the direction of line Y1 midway between the chromatic aberration control elements $G3_{1D}$, $G3_{1E}$. These lateral chromatic aberration control elements $G3_{1C}$, $G3_{1D}$, $G3_{1E}$ correct the chromatic aberration of alignment detection light from the wafer mark 136. The present embodiment is also provided with 20 (=5×4) chromatic aberration control elements in total on the chromatic aberration control plate 133 in order to detect positions of four wafer marks located in four different portions in the exposure area of projection optical system 105. Also, the chromatic aberration control elements are arranged at respective distances to the line Y1 or to the line X1 so as not to overlap with each other.

Again in FIG. 34A and FIG. 34B wafer alignment irradiation beams $WB_1$ and $WB_2$ to be irradiated onto a wafer mark 136 on the wafer 106 pass through a reticle window 134 on the reticle 104 then to enter the projection optical system 105 in the present embodiment. Then the irradiation beams $WB_1$ and $WB_2$ are irradiated onto the wafer mark 136 on the wafer 106 as controlled only in lateral chromatic aberration by the lateral chromatic aberration control elements $G3_{1A}$, $G3_{1B}$ (see FIG. 35) on the chromatic aberration control plate 133.

Then, wafer detection light $WB_1$ (+1), $WB_2$ (−1), wafer detection light $WB_1$ (+2), $WB_2$ (0) and wafer detection light $WB_1$ (0), $WB_2$ (−2) emerges from the wafer mark 136 similarly as in the fourth embodiment. When the wafer detection light reaches the chromatic aberration control plate 133, the beams of wafer detection light are controlled in lateral chromatic aberration by the respective lateral chromatic aberration control elements $G3_{1C}$, $G3_{1D}$, $G3_{1E}$. As a result, the wafer detection light passes through the reticle window 134 where the alignment light entered, and then returns into the alignment optical system 101. The structure and operation except for the above are the same as those in the third embodiment, and are omitted to explain herein.

Meanwhile, the axial chromatic aberration is not corrected in the present embodiment, so that the wafer irradiation beams $WB_1$, $WB_2$ for irradiating the wafer mark 136 are focused at $\Delta L$ of axial chromatic aberration above the reticle 104.

FIG. 36A to FIG. 36C show the structure of alignment optical system 101 in the fifth embodiment, corresponding to FIG. 29A to FIG. 29C. In these drawings, an optical path difference generating element 137 is provided on an optical path of reticle irradiation beams $RB_1$, $RB_2$ separated by a plane-parallel plate 124. The other structure is the same as that in FIG. 29A to FIG. 29C. The optical path difference generating element 137 changes a cross position between the reticle irradiation beams $RB_1$, $RB_2$ and the wafer irradiation beams $WB_1$, $WB_2$ in FIGS. 34A, 34B. Alternatively, it is also conceivable that the lens 125 in FIGS. 36A and 36B is constituted as a bifocal lens to make states of deflection of the two irradiation beams different from each other.

Figure 37:
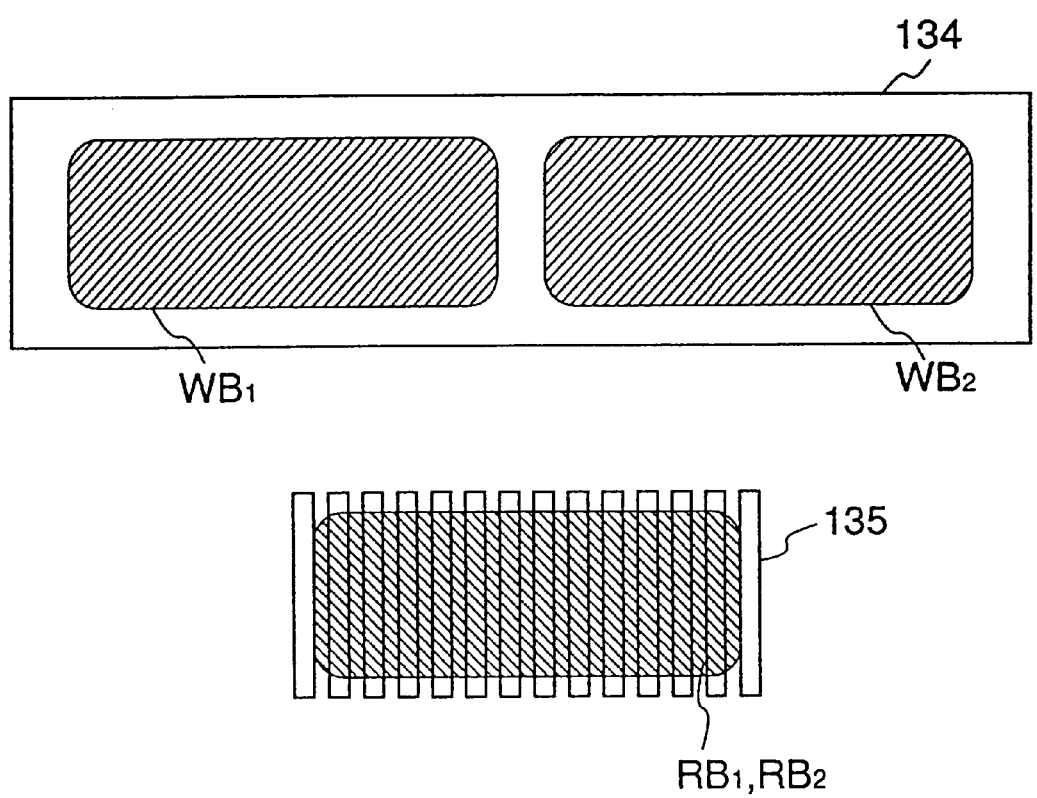
FIG. 37 is an enlarged plan view of major part to show an example of shape of reticle mark and reticle window in the fifth embodiment, and an alignment light transmitting portion and an alignment light irradiating portion.

FIG. 37 shows the reticle mark 135 and the reticle window 134 on the reticle 104 in the present embodiment. Since the axial chromatic aberration of the wafer irradiation beams $WB_1$, $WB_2$ is not corrected in the present embodiment, the reticle window 134 must be made wider thereby as shown in FIG. 37.

Since the fifth embodiment controls the lateral chromatic aberration of alignment light irradiated onto the wafer mark 136 and the lateral chromatic aberration of alignment detection light from the wafer mark 136, the reticle window 134 formed on the reticle 104 can be set at a convenient position and the wafer mark 136 can also be set at a desired position, for example at a position where the exposure light is less irradiated. Also, since only the lateral chromatic aberration is controlled without correcting the axial chromatic aberration of projection optical system 105 for wafer irradiation light, in case of the exposure light and the alignment light having not so large axial chromatic aberration (for example in case of the i line of mercury lamp being used as the exposure light and the He—Ne laser beam being used as the alignment light), the grating patterns of chromatic aberration control elements can be formed only in two directions perpendicular to each other, which facilitates the production of chromatic aberration control plate 133.

In the fourth embodiment and the fifth embodiment as described above, the control of lateral chromatic aberration is effected in the radial direction (in the meridional direction) to the optical axis $AX_0$ of projection optical system 105, for example as shown in FIG. 32A. However, the control of lateral chromatic aberration can be effected at an arbitrary direction as well as in the meridional direction.

Also, although the above embodiments employ the so-called double beam heterodyning technique using two beams different in frequency as the alignment light, the present invention is similarly applied to cases in which a collimated beam is irradiated onto a reticle mark and another collimated beam onto a wafer mark, and a reticle signal and a wafer signal each are obtained from interference light composed of two beams (for example±first-order diffracted light) emerging by diffraction from the reticle mark or from the wafer mark. Also, the present invention can be similarly applied to alignment apparatus of the so-called double beam homodyne method employing two beams identical in frequency to each other.

Employing the method other than the heterodyne method, no modulated detection signals are obtained while the reticle and wafer both are stationary. Then, position detection can be carried out as modulating the detection signals by moving either the reticle or the wafer, by driving to insert into the path an optical element (for example a plane-parallel plate, birefringent prism, etc.) for giving a horizontal shift to an image between the reticle and the wafer, or by periodically selecting the state of polarization of irradiation light or detection light.

Embodiment 6

The sixth embodiment is described with FIG. 38A to FIG. 45. The present embodiment is an example in which only the axial chromatic aberration of projection optical system is corrected or controlled for the alignment light irradiated onto the alignment mark (wafer mark) on the wafer.

FIG. 38A shows the main part of a projection exposure apparatus in the present embodiment and FIG. 38B is a right side view of FIG. 38A. In the drawings, the Y axis is defined in parallel with the plane of FIG. 38A in the plane perpendicular to the optical axis of projection optical system 205 and the X axis in parallel with the plane of FIG. 38B. In FIG. 38A, a dichroic mirror 203 is disposed above a reticle 204 as inclined at an inclination angle of 45°. The dichroic mirror 203 reflects exposure light with wavelength $\lambda_1$ from an unrepresented illumination optical system to illuminate transfer circuit patterns on the reticle 204 with uniform illuminance. Under the exposure light with wavelength $\lambda_1$, an image of circuit patterns on the reticle 204 is demagnified at 5:1 by the projection optical system 205 to be transferred onto a wafer 206 coated with a photoresist. The wafer 206 is set on a Z stage which can be vertically moved in the Z direction parallel to the optical axis $AX_0$ of projection optical system 206. The Z stage 207 is mounted on an X stage 208 which can be moved in the X direction perpendicular to the optical axis $AX_0$. The X stage 208 is mounted on a Y stage 209 which can be moved in the Y direction perpendicular to the optical axis $AX_0$ and to the Y direction.

Figure 39A:
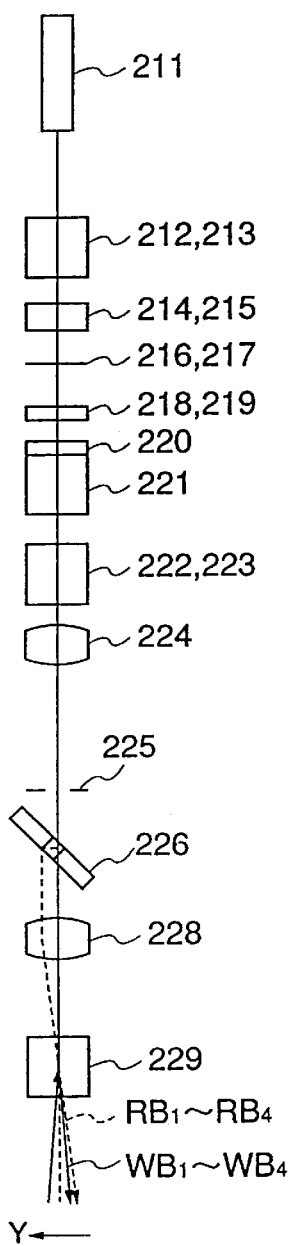
FIG. 39A is a scheme as seen along the X direction to show the construction of an alignment optical system in the sixth embodiment.
Figure 39B:
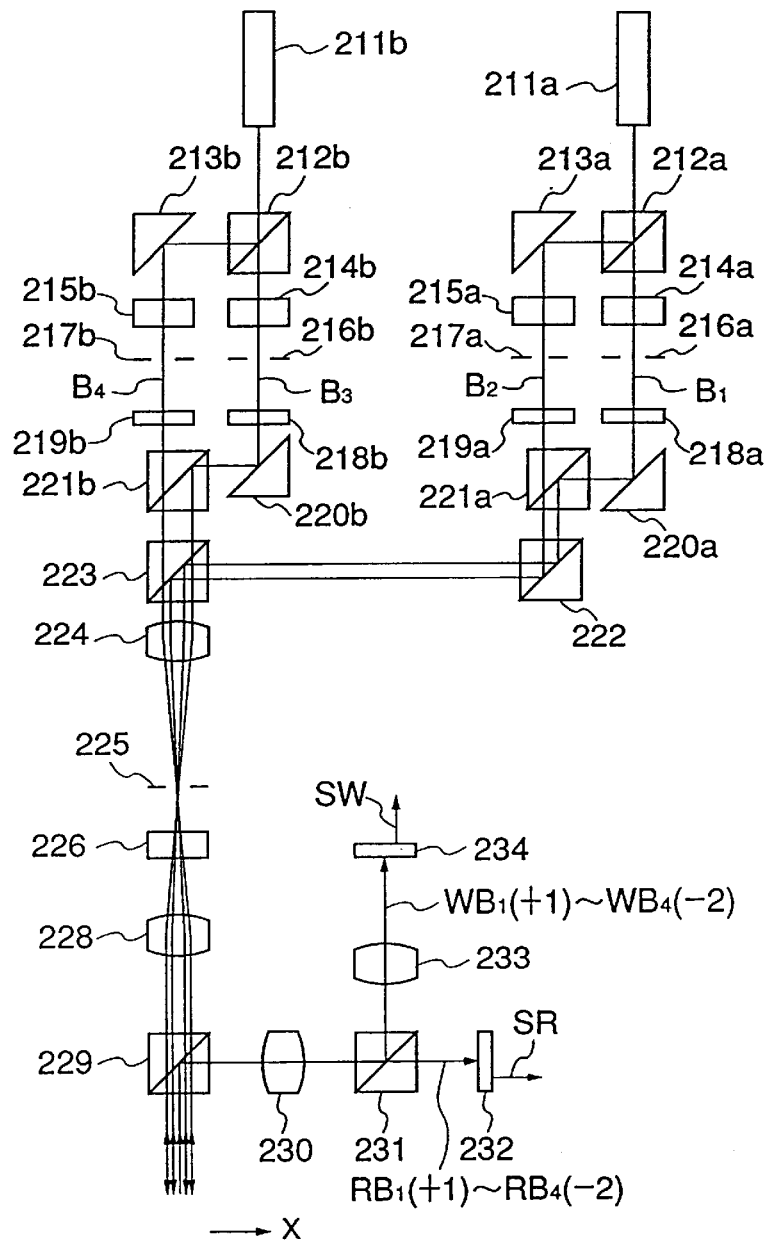
FIG. 39B is a scheme as seen along the Y direction to show the construction of the alignment optical system in the sixth embodiment.
Figure 39C:
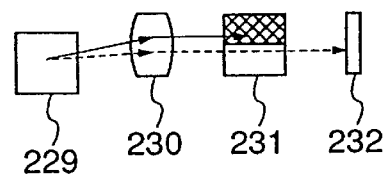
FIG. 39C is a scheme as seen from the bottom (along the Z direction) to show the major part of the alignment optical system shown in FIG. 39B.

In FIG. 38A and FIG. 38B the alignment apparatus in the present embodiment is provided with an alignment optical system 201, an objective lens 202 and a chromatic aberration control plate 210 placed on the pupil plane of projection optical system 205. The detailed structure of alignment optical system 201 is shown in FIG. 39A to FIG. 39C. Actually, the apparatus has four alignment optical systems disposed above the dichroic mirror 203, but the following description concerns only a certain specific alignment optical system 201.

Outgoing from the alignment optical system 201 are two beams of reticle alignment irradiation light $RB_1$, $RB_2$ (shown by the broken line in FIG. 38A) and two beams of wafer alignment irradiation light $WB_1$, $WB_2$ each pair with frequency difference $\Delta f_1$ (=50 kHz) and two beams of reticle alignment irradiation light $RB_3$, $RB_4$ (shown by the broken line in FIG. 39A) and two beams of wafer alignment irradiation light $WB_3$, $WB_4$ each pair with frequency difference $\Delta f_2$ (=75 kHz). The four pairs of irradiation beams have an average frequency of $\lambda_2$, which is different from the wavelength $\lambda_1$ of exposure light. Among them, the reticle alignment irradiation beams $RB_1$, $RB_2$ are guided through an objective lens 202 and a dichroic mirror 203 to be focused on the reticle 204.

Figure 41:
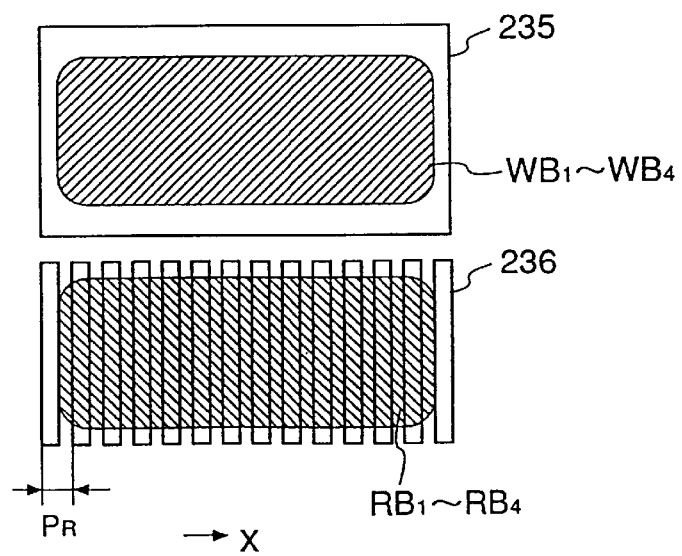
FIG. 41 is an enlarged plan view of major part to show an example of shape of reticle mark and reticle window in the sixth embodiment, and an alignment light transmitting portion and an alignment light irradiating portion.

FIG. 41 shows a portion near the circuit pattern area on the reticle 204. A reticle mark 236 of diffraction grating is formed at a grating pitch $P_R$ in the X direction near the circuit pattern area on the reticle 204. A reticle window 235 of light-transmissive portion is formed near the reticle mark 236. In FIG. 38A, the reticle irradiation beams $RB_1$, $RB_2$ are irradiated at respective incident angles $-\theta_R$ and $\theta_R$ onto the reticle mark 236 (next to the reticle window 235). Since the grating pitch $P_R$ of reticle mark 236 is set to satisfy the following relation of Equation (19),+first-order diffracted light $RB_1$ (+1) of irradiation beam $RB_1$ and−first-order diffracted light $RB_2$ (−1) of irradiation beam $RB_2$ emerges vertically upward (in the Z direction) with respect to the measurement direction (X direction) to return to the alignment optical system 201.

$$\sin(\theta_R) = \lambda_2 / P_R \qquad (19)$$

Similarly, the reticle alignment irradiation beams $RB_3$, $RB_4$ are irradiated at respective incident angles $-2\theta_R$ and $2\theta_R$ onto the reticle mark 236 on the reticle 204 through the objective lens 202 and the dichroic mirror 203. Then, +second-order diffracted light $RB_3$ (+2) of irradiation beam $RB_3$ and −second-order diffracted light $RB_4$ (−2) of irradiation beam $RB_4$ emerges vertically upward from the reticle mark 236 to return to the alignment optical system 201.

On the other hand, the wafer alignment irradiation beams $WB_1$, $WB_2$ pass through the objective lens 202 and the dichroic mirror 203, as shown in FIG. 38A, and then pass through the reticle window 235 on the reticle 204 to reach the chromatic aberration control plate 210 in the projection optical system 205.

Figure 43:
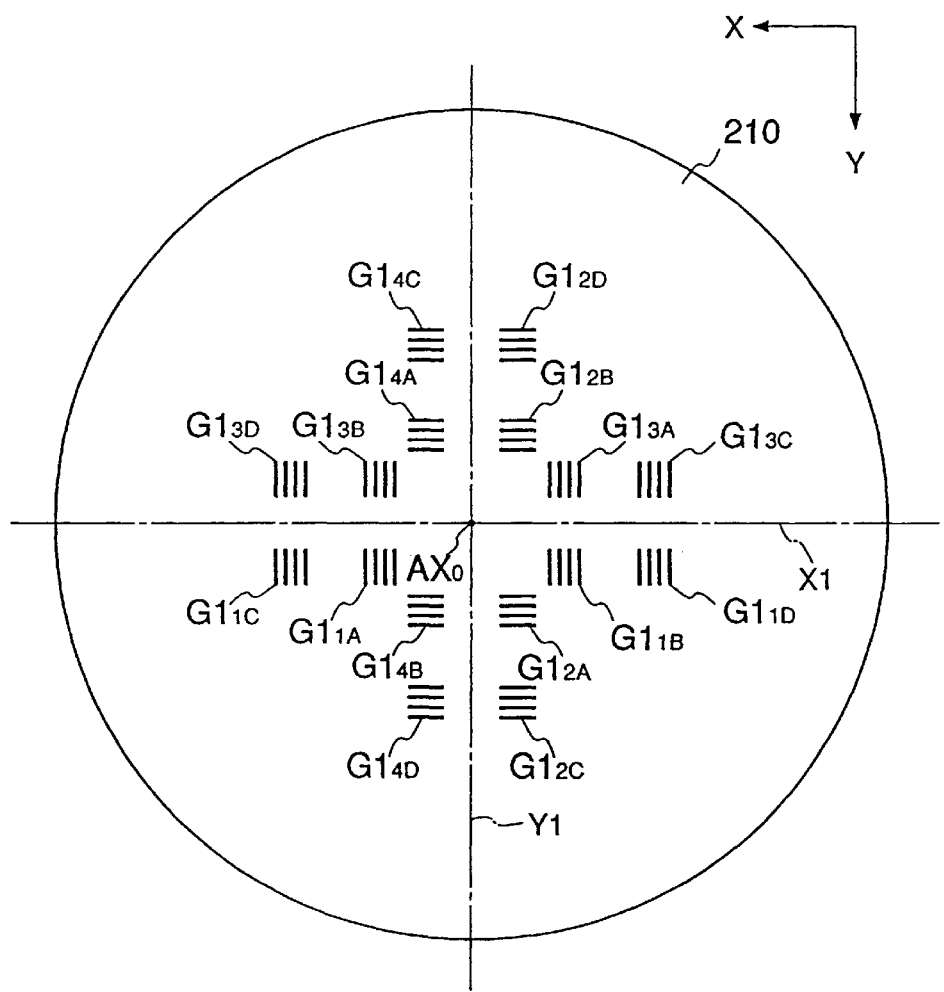
FIG. 43 is a plan view to illustrate a layout and a function of chromatic aberration correcting elements formed on a chromatic aberration control plate in the sixth embodiment.

FIG. 43 shows the chromatic aberration control plate 210. A pair of axial chromatic aberration control elements $G1_{1A}$, $G1_{1B}$ are formed on the chromatic aberration control plate 210 of transparent substrate in axial symmetry with respect to the line Y1 parallel to the Y axis through the optical axis $AX_0$ and at positions apart a predetermined distance from the line X1 parallel to the X axis through the optical axis $AX_0$. In the present embodiment, these axial chromatic aberration control elements $G1_{1A}$, $G1_{1B}$ correct the axial chromatic aberration of two wafer irradiation beams $WB_1$, $WB_2$ to be irradiated onto a wafer mark on the wafer 206. Another pair of axial chromatic aberration control elements $G1_{1C}$, $G1_{1D}$ of diffraction gratings are formed in axial symmetry with respect to the line Y1 outside the axial chromatic aberration control elements $G1_{1A}$, $G1_{1B}$. These axial chromatic aberration control elements $G1_{1C}$, $G1_{1D}$ correct the axial chromatic aberration of remaining two wafer irradiation beams $WB_3$, $WB_4$ to be irradiated onto a wafer mark on the wafer 206.

Also, the present embodiment includes 16 (=4×4) axial chromatic aberration control elements in total provided on the chromatic aberration control plate 210 in order to detect positions of four wafer marks located in four different portions in the exposure area of projection optical system 205. In more detail, axial chromatic aberration control elements $G1_{3A}$ to $G1_{3D}$ are provided at positions in point symmetry with the axial chromatic aberration control elements $G1_{1A}$ to $G1_{1D}$ with respect to the optical axis $AX_0$, and further axial chromatic aberration control elements $G1_{2A}$ to $G1_{2D}$ and $G1_{4A}$ to $G1_{4D}$ at positions 90° rotated from the positions of the above eight axial chromatic aberration control elements. In other words, a pair of axial chromatic aberration control elements $G1_{3B}$, $G1_{3A}$ of diffraction gratings are formed at positions different in distance to the optical axis $AX_0$ and two pairs of axial chromatic aberration control elements $G1_{2A}$, $G1_{2B}$ and $G1_{4B}$, $G1_{4A}$ are formed in axial symmetry with respect to the line X1. These axial chromatic aberration control elements (all elements formed in the same arrangement) are phase gratings of recess and protrusion pattern.

Again in FIG. 38B, the irradiation beams $WB_1$, $WB_2$ enter the axial chromatic aberration control elements $G1_{1B}$, $G1_{1A}$ on the chromatic aberration control plate 210 and their optical paths are bent by angle $-\theta_{G1}$ and $\theta_{G1}$, respectively. Then the irradiation beams $WB_1$, $WB_2$ are irradiated at incident angle $-\theta_W$, $\theta_W$, respectively, onto the wafer mark on the wafer 206.

Figure 42:
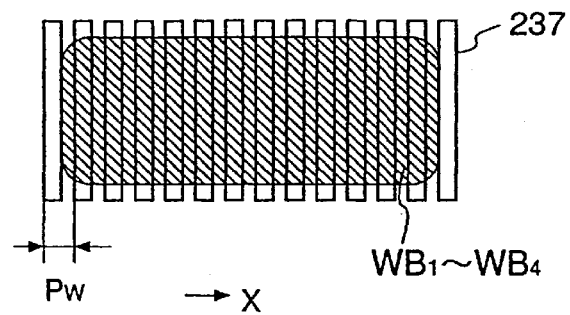
FIG. 42 is an enlarged plan view of major part to show an example of shape of wafer mark in the sixth embodiment and an alignment light irradiating portion.

FIG. 42 shows the wafer mark 237 on the wafer 206. The wafer mark 237 is a diffraction grating formed at a grating pitch $P_W$ in the measurement direction (X direction). Since the grating pitch $P_W$ of wafer mark 237 is set to satisfy the following relation of Equation (20),+first-order diffracted light $WB_1$ (+1) of irradiation beam $WB_1$ and−first-order diffracted light $WB_2$ (−1) of irradiation beam $WB_2$ emerges vertically upward from the wafer mark with respect to the measurement direction (X direction) as the alignment detection light, as shown in FIG. 38B.

$$\sin(\theta_W) = \lambda_2 / P_W \qquad (20)$$

Similarly, the wafer irradiation beams $WB_3$, $WB_4$ enter the axial chromatic aberration control elements $G1_{1C}$, $G1_{1D}$ on the chromatic aberration control plate 210 and their optical paths are bent thereby by angle $-\theta_{G1}$, $\theta_{G1}$, respectively. Then the wafer irradiation beams $WB_3$, $WB_4$ are irradiated at incident angle $-2\theta_W$, $2\theta_W$, respectively, onto the wafer mark 237. Then, +second-order diffracted light $WB_3$ (+2) of irradiation beam $WB_3$ and −second-order diffracted light $WB_4$ (−2) of irradiation beam $WB_4$ emerges vertically upward from the wafer mark 237 as alignment detection light.

Also, since the irradiation beams $WB_1$ to $WB_4$ are incident into the wafer mark 236 as inclined at an angle $\theta_m$ relative to the normal line to the wafer 206 in the non-measurement direction (Y direction), as shown in FIG. 38A, the above two pairs of alignment detection beams pass through the chromatic aberration control plate 210 at positions different from those where the alignment light beams passed upon incidence. In other words, the alignment detection light will never pass through the axial chromatic aberration control elements $G1_{1A}$, $G1_{1B}$, $G1_{1C}$, $G1_{1D}$. After that, the alignment detection light each passes through the reticle window 235 on the reticle 204 and returns to the alignment optical system 201.

The alignment optical system 201 is next described in detail with reference to FIG. 39A to FIG. 39C. FIG. 39A is a drawing to show the alignment optical system 201 as seen in the same direction as FIG. 38A, FIG. 39B a drawing to show the alignment optical system 201 as seen in the same direction as FIG. 38B and FIG. 39C a bottom view of FIG. 39B. In these drawings, a laser beam emitted from a laser beam source 211a is split into two beams by a beam splitter prism 212a, one of which enters an acousto-optic modulator (AOM) 214a and the other of which enters AOM 215a after reflected by a reflection prism 213a.

The AOMs 214a and 215a are driven at frequency $F_1$ and $F_2$ respectively. A frequency difference $\Delta f_1$ is 50 kHz between the frequency $F_1$ and frequency $F_2$. Slits 216a and 217a select only+first-order diffracted light out of laser beams of various orders diffracted by the AOMs 214a and 215a, which is to be alignment irradiation beams $B_1$ and $B_2$. Letting $f_0$ be the frequency of laser beams entering the AOMs 214a and 215a, the frequency of the alignment irradiation beam $B_1$ or $B_2$ will be frequency $f_1$ or $f_2$ higher drive frequency $F_1$ or $F_2$ of AOM 214 or 215 than the original frequency $f_0$. Namely, the aforementioned relations of Equations (15) and (16) hold.

The irradiation beam $B_1$ is guided through a plane-parallel plate glass 218a for path adjustment and via a reflection prism 220a to enter a coupling prism 221a, while the other irradiation beam $B_2$ is guided through a plane-parallel plate glass 219a for path adjustment to enter the coupling prism 221a. Two irradiation beams (heterodyne beams) $B_1$ and $B_2$ different $\Delta f_1$ in frequency from each other are outgoing from the coupling prism 221a and go via a reflection prism 222 toward a coupling prism 223.

Also, a second heterodyne beam generating system comprised of elements of from a laser beam source 211b to a coupling prism 221b is provided in symmetry with the first heterodyne beam generating system comprised of the elements of from the laser beam source 211a to the coupling prism 221a. In the second heterodyne beam generating system, a laser beam emitted from the laser beam source 211b is split into two beams by a beam splitter prism 212b, one of which enters AOM 214b of drive frequency $F_3$ and the other of which enters AOM 215b of drive frequency $F_4$ after reflected by a reflection prism 213b. A frequency difference $\Delta f_2$ is 75 kHz between the frequency $F_3$ and frequency $F_4$. Slits 216b and 217b select only +first-order diffracted light out of laser beams of various orders diffracted by the AOMs 214b and 215b, which is to be alignment irradiation beams $B_3$ and $B_4$ different $\Delta f_2$ in frequency from each other. These irradiation beams $B_3$ and $B_4$ are guided via a coupling prism 221b and go nearly in parallel into a coupling prism 223.

The optical paths of irradiation beams $B_1$ to $B_4$ are set nearly in parallel by the coupling prism 223, and the beams are focused by a lens 224 on a field slit 225 located conjugate with the reticle and the wafer. Placed after the field slit 225 is a plane-parallel plate 226 with a thin film vapor-deposited thereon to keep the incident plane as a half mirror. Then the irradiation beams $B_1$ to $B_4$ are outgoing through the aperture of the field slit 225 and are split by the plane-parallel plate 226 into reticle irradiation beams $RB_1$ to $RB_4$ (shown by the broken line in FIG. 39A) and wafer irradiation beams $WB_1$ to $WB_4$. In more detail, the irradiation beam $B_1$ is split into irradiation beams $RB_1$ and $WB_1$, the irradiation beam $B_2$ into irradiation beams $RB_2$ and $WB_2$, the irradiation beam $B_3$ into irradiation beams $RB_3$ and $WB_3$, and the irradiation beam $B_4$ into irradiation beams $RB_4$ and $WB_4$. Then the irradiation beams $RB_1$ to $RB_4$ and the irradiation beams $WB_1$ to $WB_4$ pass through a lens 228 and a beam splitter 229 and then are outgoing from the alignment optical system 201.

The alignment detection light returning from the reticle mark 236 and the alignment detection light returning from the wafer mark 237 in FIGS. 38A and 38B enters the beam splitter 229 in the alignment optical system 201, as shown in FIG. 39B. After the alignment detection light is reflected by the beam splitter 229, it enters a detection light separating prism 231 located conjugate with the reticle and the wafer. The detection light separating prism 231 separates the reticle detection light from the reticle mark, from the wafer detection light from the wafer mark. In this case, as shown in FIG. 39C, the reticle detection light shown by the broken line enters a region different from a region where the wafer detection light shown by the solid line enters on the detection light separating prism 231, and they can be completely separated from each other by providing a transmissive portion in a part of reflective plane in the detection light separating prism 231.

After passing through the detection light separating prism 231, the ±first-order diffracted light $RB_1$ (+1), $RB_2$ (−1) and the ±second-order diffracted light $RB_3$ (+2), $RB_4$ (−2) as the reticle detection light is photoelectrically detected and converted into electric signals by a photoelectric detector 232, which outputs a reticle signal SR. On the other hand, after reflected by the detection light separating prism 231, the ±first-order diffracted light $WB_1$ (+1), $WB_2$ (−1) and the ±second-order diffracted light $WB_3$ (+2), $WB_4$ (−2) as the wafer detection light passes through a lens 233 and is then photoelectrically detected and converted into electric signals by a photoelectric detector 234, which outputs a wafer signal SW. Accordingly, the reticle signal SR is a signal in which there are mixed a beat signal of frequency $\Delta f_1$ from the ±first-order diffracted light $RB_1$ (+1), $RB_2$ (−1) and a beat signal of frequency $\Delta f_2$ from the ±second-order diffracted light $RB_3$ (+2), $RB_4$ (−2), whereas the wafer signal SW is similarly a signal in which there are mixed a beat signal of frequency $\Delta f_1$ from the ±first-order diffracted light $WB_1$ (+1), $WB_2$ (−1) and a beat signal of frequency $\Delta f_2$ from the ±second-order diffracted light $WB_3$ (+2), $WB_4$ (−2).

Figure 40:
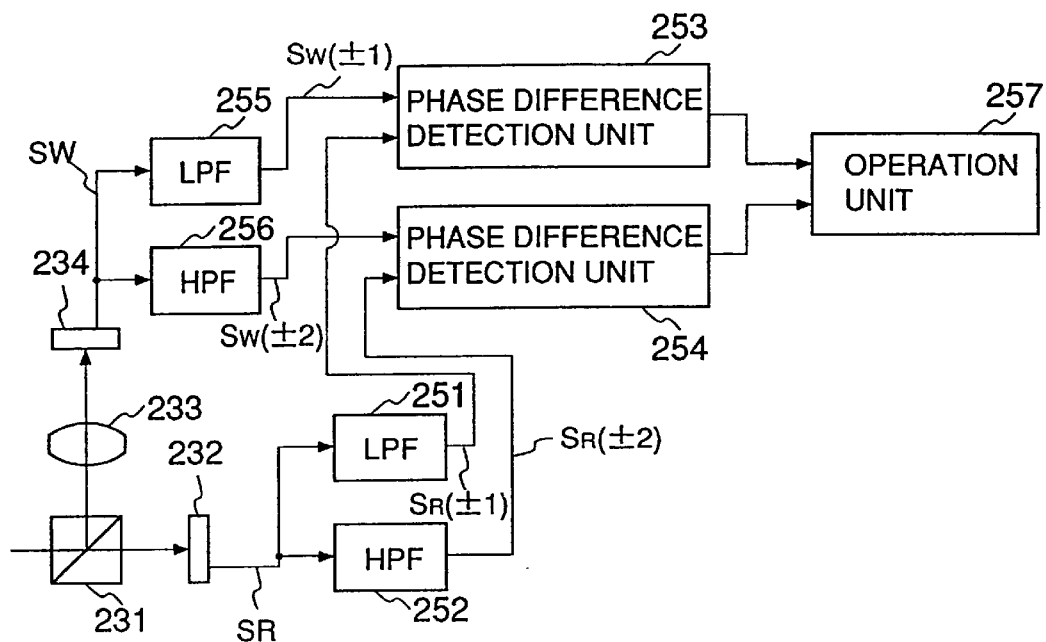
FIG. 40 is a block diagram to show the structure of a signal processing system for alignment inspection associated with the alignment optical system in the sixth embodiment.

FIG. 40 shows an example of signal processing system in the present embodiment. The reticle signal SR is supplied to a low-pass filter circuit (LPF) 251 and a high-pass filter circuit (HPF) 252. In this example, the cut-off frequency is set at 60 kHz for the low-pass filter circuit 251 and the high-pass filter circuit 252, considering the intermediate frequency between the frequency $\Delta f_1$ and the frequency $\Delta f_2$. Thus, the reticle signal $S_R$ (±1) of frequency $\Delta f_1$ extracted in the low-pass filter circuit 251 is supplied to one input of a phase difference detection unit 253 and the reticle signal $S_R$ (±2) of frequency $\Delta f_2$ extracted in the high-pass filter circuit 252 to one input of a phase difference detection unit 254.

Also, the wafer signal SW is supplied to a low-pass filter circuit (LPF) 255 and a high-pass filter circuit (HPF) 256 each set at the cut-off frequency of 60 kHz. Then the wafer signal $S_W$ (±1) of frequency $\Delta f_1$ extracted in the low-pass filter circuit 255 is supplied to the other input of the phase difference detection unit 253 while the wafer signal $S_W$ (±2) of frequency $\Delta f_2$ extracted in the high-pass filter circuit 256 to the other input of the phase difference detection unit 254. Phase differences detected in the phase difference detection units 253 and 254 are supplied to an operation unit 257. The operation unit 257 calculates an amount of positional deviation between the reticle mark 236 (or the reticle 204) and the wafer mark 237 (or the wafer 206) in FIGS. 38A and 38B based on the two phase differences.

Figure 44:
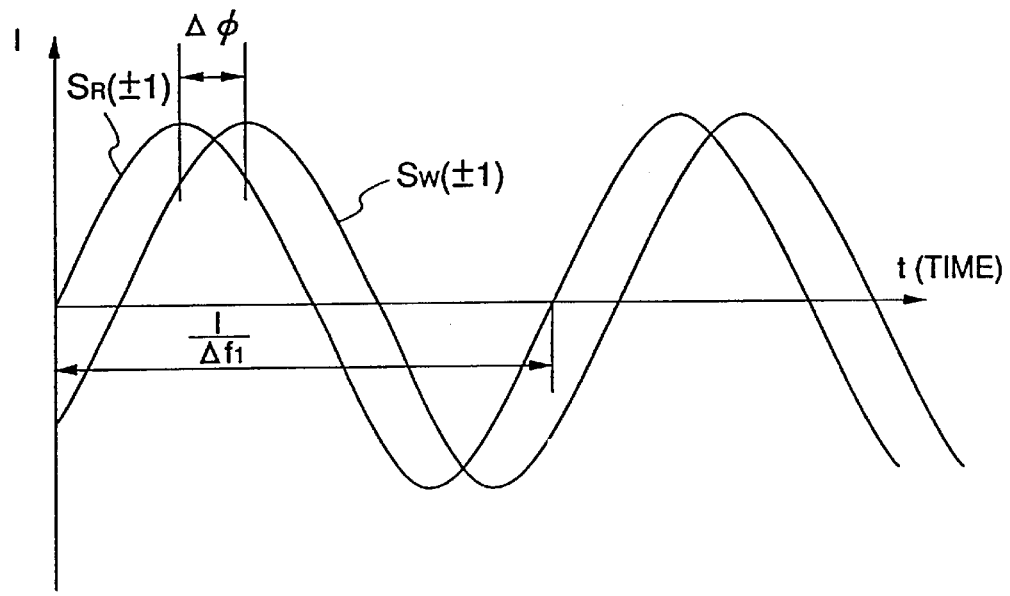
FIG. 44 is an illustration to illustrate the principle of alignment inspection in the sixth embodiment.
Figure 45:
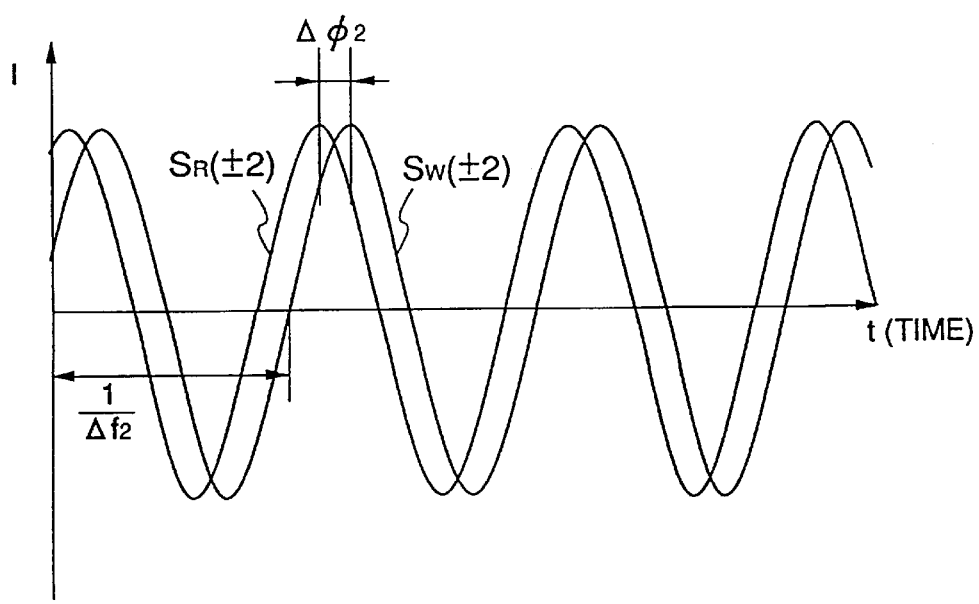
FIG. 45 is an illustration to further illustrate the principle of alignment inspection in the sixth embodiment.

FIG. 44 and FIG. 45 show the reticle signal and the wafer signal obtained in the signal processing system in FIG. 40. The reticle signal $S_R$ (±1) and the wafer signal $S_W$(±1) as shown in FIG. 44 are sinusoidal waves produced by interference between the ±first-order diffracted light $RB_1$ (+1) and $RB_2$ (−1) with frequency difference $\Delta f_1$ and between the ±first-order diffracted light $WB_1$ (+1) and $WB_2$ (−1), respectively. Detecting a phase difference $\Delta \Phi_1$ between the two signals, relative positional deviation $\Delta x_1$ can be calculated by the following relation of Equation (21) between the reticle 204 and the wafer 206.

$$\Delta x_1 = Pw \cdot \Delta \Phi_1 / 4\pi \tag{21}$$

In the above equation, Pw is the pitch.

Similarly, the reticle signal $S_R$ (±2) and the wafer signal $S_W$(±2) as shown in FIG. 45 are sinusoidal waves produced by interference between the ±second-order diffracted light $RB_3$ (+2) and $RB_4$ (−2) with frequency difference $\Delta f_2$ and by interference between the ±second-order diffracted light $WB_3$ (+2) and $WB_4$ (−2) with frequency difference $\Delta f_2$. Accordingly, detecting a phase difference $\Delta \Phi_2$ between these two signals, relative positional deviation $\Delta x_2$ can also be calculated by the following relation of Equation (22) between the reticle 204 and the wafer 206.

$$\Delta x_2 = Pw \cdot \Delta \Phi_2 / 4\pi \tag{22}$$

Here, there are various methods for proper use of the positional deviations $\Delta x_1$ and $\Delta x_2$ respectively obtained by the above relations of Equations (21) and (22). An example is that the signal level of wafer signal $S_W$ (±1) is compared with that of wafer signal $S_W$ (±2) and one with higher signal level is selected to use. Another method is as follows. Using a typical sample wafer, an average amplitude level A1 of wafer signal $S_W$ (±1) and an average amplitude level A2 of wafer signal $S_W$ (±2) are preliminarily obtained. Then obtained for an actual wafer 206 are a deviation σ1 from the average amplitude level A1 for a signal level of wafer signal $S_W$(±1) and a deviation σ2 from the average amplitude level A2 for a signal level of wafer signal $S_W$ (±2). Then a weighted average of positional deviations $\Delta x_1$ and $\Delta x_2$ is calculated using a function of deviation σ1 and a function of deviation σ2. This average may be used as a relative positional deviation between the reticle 204 and the wafer 206. Alternatively, only one with average amplitude level closer to the average may be chosen out of the wafer signal $S_W$ (±1) and the wafer signal $S_W$ (±2).

Meanwhile, this embodiment is so arranged that the beat frequency $\Delta f_1$ of beat by±first-order diffracted light is made different from the beat frequency $\Delta f_2$ of beat by±second-order diffracted light and they are separated from each other at the step of signal processing by the method of Fourier series. Employing the Fourier series method, the signal of interference light by±first-order diffracted light is separated from that by±second-order diffracted light from the detection light in which components of frequency $\Delta f_1$ and components of frequency $\Delta f_2$ are mixed, using band-pass filters (or low-pass filters) permitting the signal of frequency $\Delta f_1$ or the signal of frequency $\Delta f_2$ to pass. An alternative method is that shutters are located at exit ends of laser beam sources 211a and 211b and alternately activated to open and close so that the components of beat frequency $\Delta f_1$ and the components of beat frequency $\Delta f_2$ may be detected in a time-division manner. In this case, the frequency $\Delta f_1$ can be theoretically equal to the frequency $\Delta f_2$. In this arrangement, instead of the shutters actuated to open and close, semiconductor laser devices may replace the laser beam sources 211a and 211b to control switching of emission from such laser beam sources. Otherwise, the AOMs 214a, 214b, 215a, 215b may be controlled to turn on and off.

Embodiment 7

The seventh embodiment of the present invention is next described with reference to FIG. 46A to FIG. 47. The seventh embodiment is an example in which not only corrected are the axial chromatic aberration and the lateral chromatic aberration of projection optical system 205 for the alignment light irradiated onto a wafer mark but also the axial chromatic aberration and the lateral chromatic aberration are corrected for the alignment light returning from the wafer mark. In FIGS. 46A and 46B elements corresponding to those in FIGS. 38A and 38B are denoted by the same reference numerals and omitted to explain in detail herein.

FIG. 46A is a drawing to show a projection exposure apparatus in the present embodiment as seen along the X direction and FIG. 46B is a right side view of FIG. 46A. In the present embodiment, a chromatic aberration control plate 238 is located on the pupil plane of projection optical system 205 and a layout and the role of chromatic. aberration control elements on the chromatic aberration control plate 238 are different from those on the chromatic aberration control plate 210 in the sixth embodiment.

Figure 47:
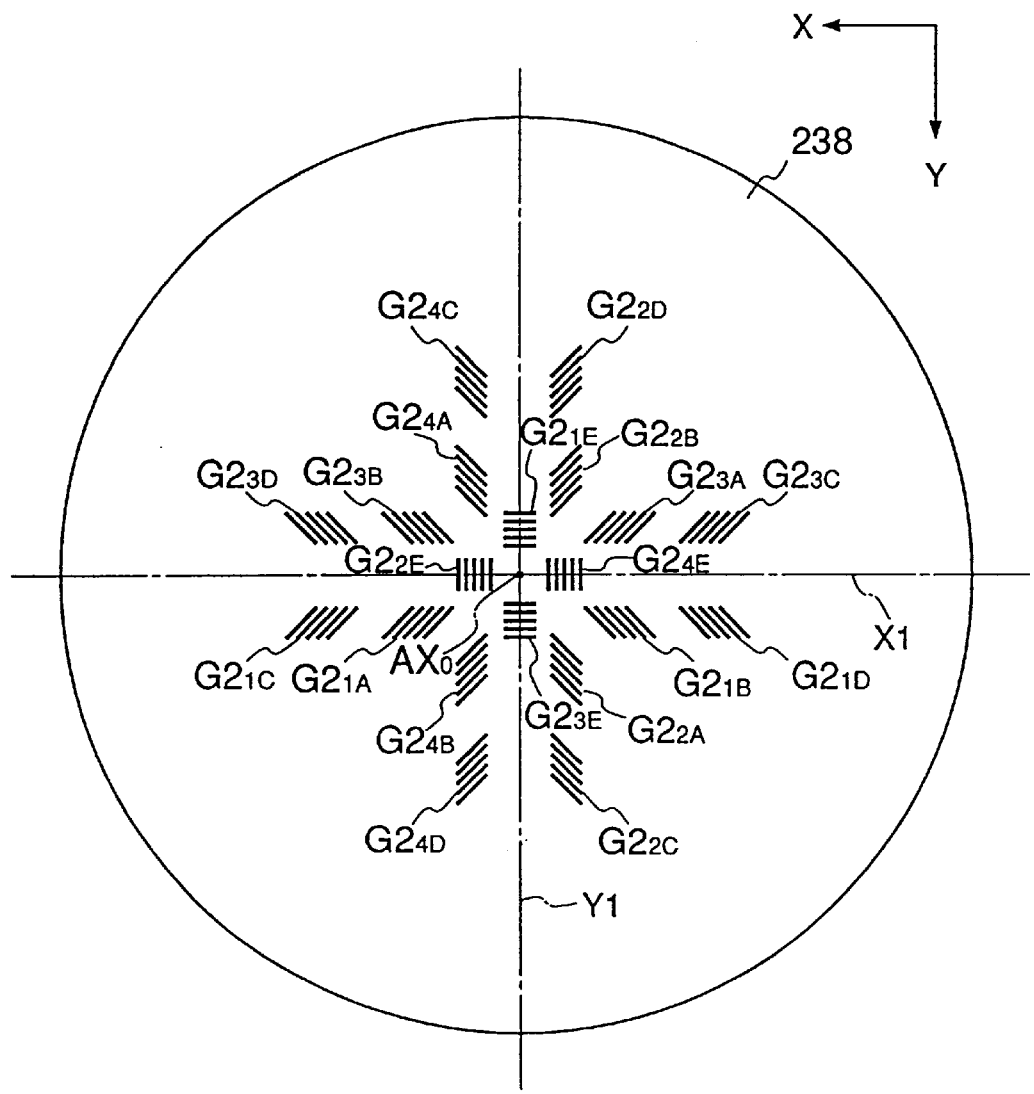
FIG. 47 is a plan view to illustrate a layout and a function of chromatic aberration correcting elements formed on a chromatic aberration control plate in the seventh embodiment.

FIG. 47 shows the layout and the shape of chromatic aberration control elements on the chromatic aberration control plate 238 in the seventh embodiment. On the chromatic aberration control plate 238 of transparent substrate, there are a pair of axial and lateral chromatic aberration control elements $G2_{1A}$, $G2_{1B}$ of diffraction gratings formed in axial symmetry with respect to a line Y1 parallel to the Y axis through the optical axis $AX_0$ and a pair of axial and lateral chromatic aberration control elements $G2_{1C}$, $G2_{1D}$ of diffraction gratings formed in axial symmetry with respect to the line Y1 outside the elements $G2_{1A}$, $G2_{1B}$. The present embodiment shows a case in which the axial and lateral chromatic aberration control elements $G2_{1A}$ to $G2_{1D}$ control the axial chromatic aberration and the lateral chromatic aberration for each of four beams irradiated onto a wafer mark on the wafer 206.

Also, a lateral chromatic aberration control element $G2_{1E}$ of diffraction grating is formed at a predetermined pitch at a position symmetric with the middle point between the chromatic aberration control elements $G2_{1A}$ to $G2_{1D}$ with respect to the line X1 parallel to the X direction through the optical axis $AX_0$, as extending along the line Y1 thereon. The lateral chromatic aberration control element $G2_{1E}$ corrects the lateral chromatic aberration for the alignment detection light from the wafer mark 237. The present embodiment includes 20 (=5×4) chromatic aberration control elements in total provided on the chromatic aberration control plate 238 in order to detect positions of four wafer marks located in four different portions in the exposure area of projection optical system 205. In more detail, chromatic aberration control elements $G2_{2A}$ to $G2_{2E}$, chromatic aberration control elements $G2_{3A}$ to $G2_{3E}$ and chromatic aberration control elements $G2_{4A}$ to $G2_{4E}$ are provided at respective positions as rotated 90°, 180° and 270° about the optical axis $AX_0$ from the positions of chromatic aberration control elements $G2_{1A}$ to $G2_{1E}$. Again in FIGS. 46A, 46B wafer alignment irradiation beams $WB_1$ to $WB_4$ to be irradiated onto the wafer mark 237 on the wafer 206 in the present embodiment enter the projection optical system 205 through a reticle window 235 on the reticle 204. Then the irradiation beams $WB_1$ to $WB_4$ are controlled not only in axial chromatic aberration but also in lateral chromatic aberration by the axial and lateral chromatic aberration control elements $G2_{1A}$ to $G2_{1D}$ on the chromatic aberration control plate 238 and then irradiated onto the wafer mark 237 on the wafer 206. In this occasion, as shown in FIG. 46A, the irradiation beams $WB_1$ to $WB_4$ are irradiated onto the wafer mark 237 at a position closer $\Delta\beta$ to the optical axis $AX_0$ of projection optical system 205 (in the meridional direction) than the position in the sixth embodiment.

Wafer detection light $WB_1$ (+1), $WB_2$ (−1) and wafer detection light $WB_3$ (+2), $WB_4$ (−2) emerges from the wafer mark 237 similarly as in the sixth embodiment. When the wafer detection light reaches the chromatic aberration control plate 238, the wafer detection light is controlled in lateral chromatic aberration by the lateral chromatic aberration control element $G2_{1E}$. Consequently, the wafer detection light passes through the reticle window 235 as passed upon incidence and then returns into the alignment optical system 201. The structure and operation except for the above are the same as those in the sixth embodiment.

Since the chromatic aberration of alignment light irradiated onto the wafer mark 237 and the chromatic aberration of alignment light from the wafer mark 237 both are controlled in the seventh embodiment, the reticle mark 236 and the wafer mark 237 are conjugate with each other under the alignment light when seen from the alignment optical system 201, which simplifies the structure of alignment optical system 201. Also, the wafer irradiation light and the wafer detection light can be arranged to pass through the reticle 204 at positions outside the exposure area, so that the area of wafer mark region occupied by the marks in the exposure area on the wafer 206 can be reduced. Further, the reticle window 235 formed on the reticle 204 can be set at a convenient position, and the wafer mark 237 can also be set at a desired position, for example at a position where the exposure light is less irradiated. Moreover, the reticle window 235 can be sized smaller.

Embodiment 8

Figure 48A:
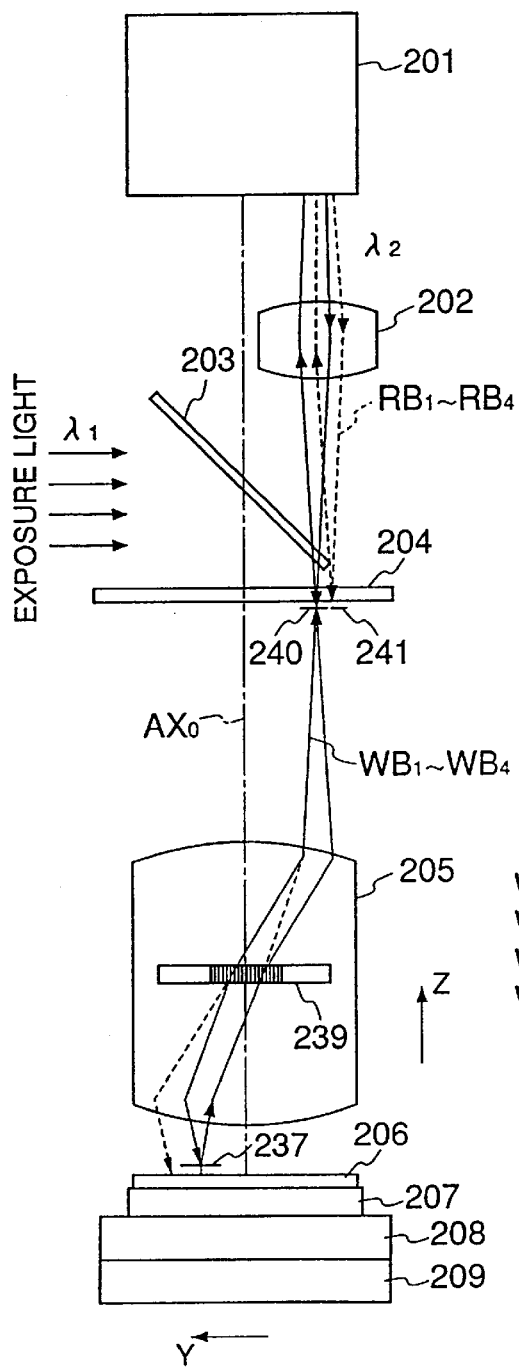
FIG. 48A is a scheme as seen along the X direction to show the construction of the eighth embodiment of the present invention.
Figure 48B:
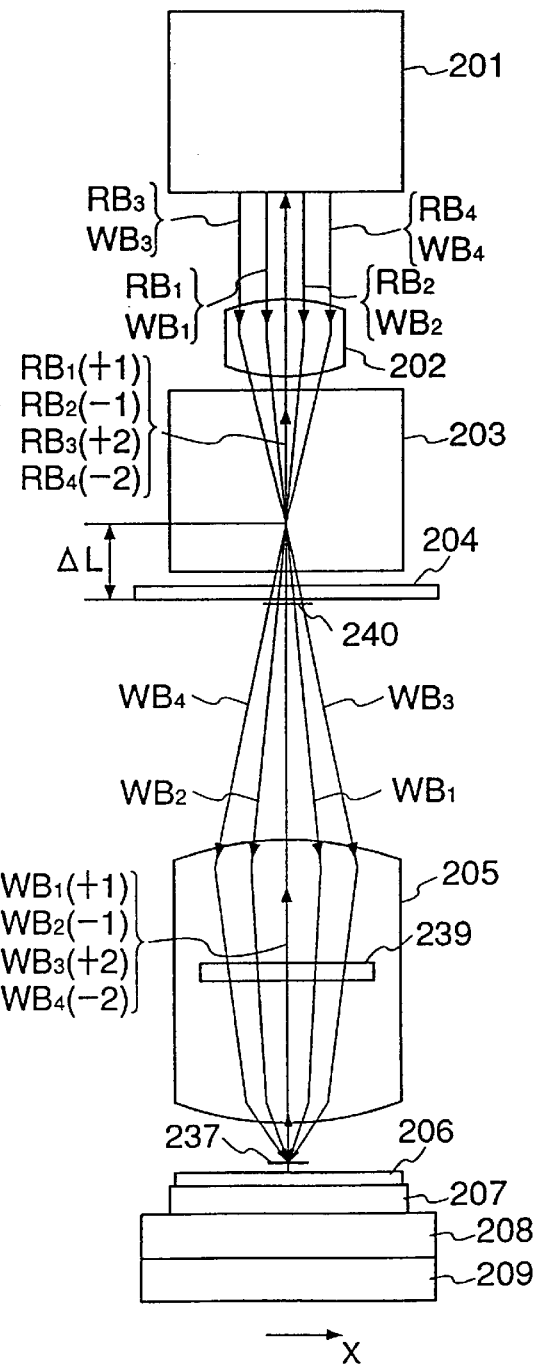
FIG. 48B is a scheme as seen along the Y direction to show the construction of the eighth embodiment of the present invention.

The eighth embodiment of the present invention is next described with reference to FIG. 48A to FIG. 51. The eighth embodiment is an example in which the function to control the axial chromatic aberration is removed from the chromatic aberration control elements in the seventh embodiment. In FIGS. 48A and 48B elements corresponding to those in FIGS. 46A and 46B are denoted by the same reference numerals and omitted to explain herein. Further, in FIGS. 49A and 49B elements corresponding to those in FIGS. 39A and 39B are denoted by the same reference numerals and omitted to explain herein.

FIG. 48A is a drawing to show a projection exposure apparatus in the present embodiment as seen along the X direction and FIG. 48B is a right side view of FIG. 48A. In the present embodiment, there is a chromatic aberration control plate 239 arranged on the pupil plane of projection optical system 205 and the role of chromatic aberration control elements on the chromatic aberration control plate 239 is different from that on the chromatic aberration control plate 238 in the seventh embodiment.

Figure 51:
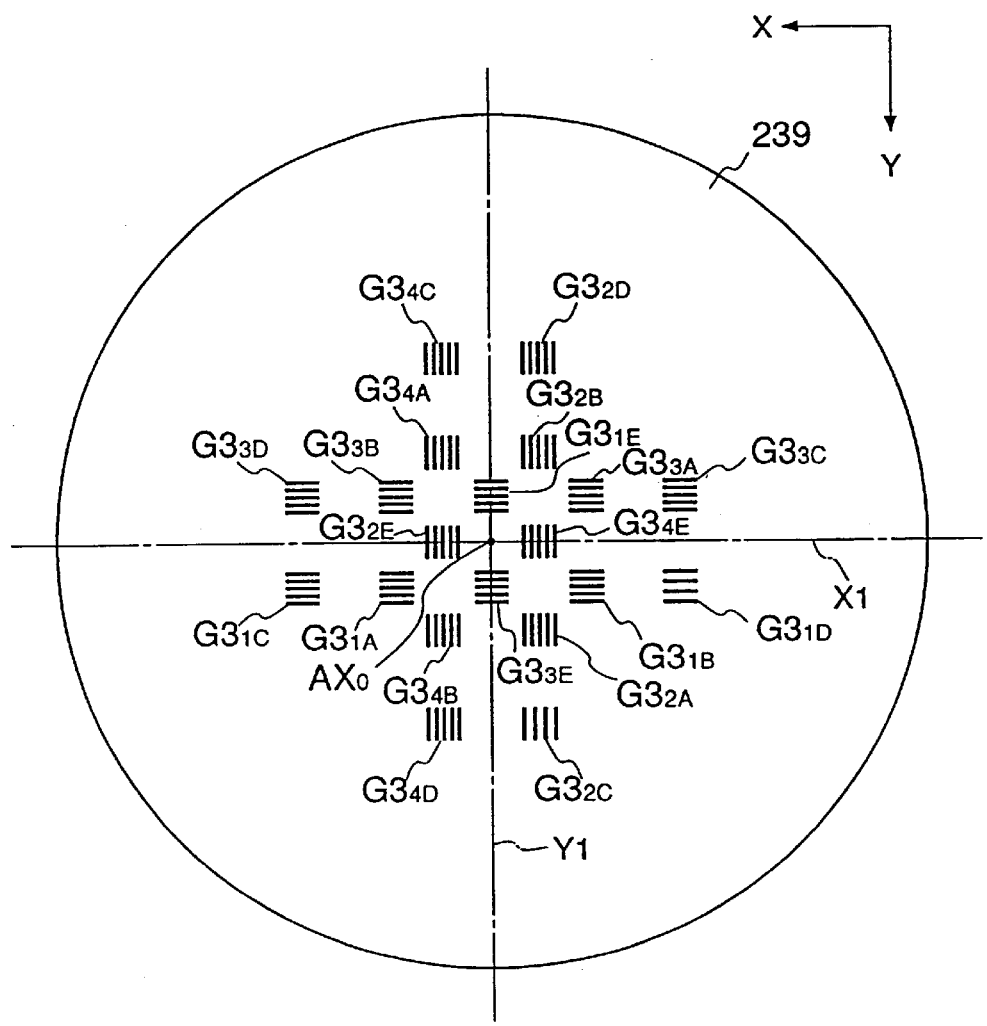
FIG. 51 is a plan view to illustrate a layout and a function of chromatic aberration correcting elements formed on a chromatic aberration control plate in the eighth embodiment.

FIG. 51 shows a layout and the shape of chromatic aberration control elements on the chromatic aberration control plate 239 in the eighth embodiment. A pair of lateral chromatic aberration control elements $G3_{1A}$, $G3_{1B}$ of diffraction gratings are formed in axial symmetry with respect to a line Y1 parallel to the Y axis through the optical axis $AX_0$ and another pair of lateral chromatic aberration control elements $G3_{1C}$, $G3_{1D}$ of diffraction gratings are formed outside the control elements $G3_{1A}$, $G3_{1B}$ on the chromatic aberration control plate 239 of transparent substrate. The present embodiment shows a case in which these lateral chromatic aberration control elements $G3_{1A}$ to $G3_{1D}$ control the lateral chromatic aberration of four beams irradiated onto a wafer mark on the wafer 206.

Also, a lateral chromatic aberration control element $G3_{1E}$ of diffraction grating is formed at a predetermined pitch at a position symmetric with the middle point between the chromatic aberration control elements $G3_{1A}$ to $G3_{1D}$ with respect to the line X1 parallel to the X direction through the optical axis $AX_0$, as extending in the direction of line Y1 thereon. The lateral chromatic aberration control element $G3_{1E}$ corrects the chromatic aberration of alignment detection light from the wafer mark 237. The present embodiment also includes 20 (=5×4) chromatic aberration control elements in total provided on the chromatic aberration control plate 239 in order to detect positions of four wafer marks in four different portions in the exposure area of projection optical system 205. In more detail, chromatic aberration control elements $G3_{2A}$ to $G3_{2E}$, chromatic aberration control elements $G3_{3A}$ to $G3_{3E}$ and chromatic aberration control elements $G3_{4A}$ to $G3_{4E}$ are disposed at respective locations as rotated 90°, 180° and 270° about the optical axis $AX_0$ from the positions of chromatic aberration control elements $G3_{1A}$ to $G3_{1E}$.

In FIGS. 48A and 48B the wafer irradiation beams $WB_1$ to $WB_4$ to be irradiated onto the wafer mark 237 on the wafer 206 in the present embodiment enter the projection optical system 205 through a reticle window 240 on the reticle 204. Then the irradiation beams $WB_1$ to $WB_4$ are irradiated onto the wafer mark 237 on the wafer 206 as controlled only in lateral chromatic aberration by the lateral chromatic aberration control elements $G3_{1A}$ to $G3_{1D}$ on the chromatic aberration control plate 239.

Wafer detection light $WB_1$ (+1), $WB_2$ (−1) and wafer detection light $WB_3$ (+2), $WB_4$ (−2) emerges from the wafer. mark 237 similarly as in the seventh embodiment. When the wafer detection light reaches the chromatic aberration control plate 239, the lateral chromatic aberration control element $G3_{1E}$ controls the lateral chromatic aberration of the wafer detection light. Consequently, the wafer detection light passes through the reticle window 240 as passed upon incidence then to return into the alignment optical system 201. The structure and operation except for the above are the same as those in the sixth embodiment and omitted to explain herein.

Meanwhile, since the axial chromatic aberration correction is not effected in the present embodiment, the wafer irradiation beams $WB_1$ to $WB_4$ for irradiating the wafer mark 237 are focused at ΔL of axial chromatic aberration above the reticle 204, as shown in FIG. 48B.

FIG. 49A to FIG. 49C show the structure of alignment optical system 201 in the eighth embodiment, corresponding to FIG. 39A to FIG. 39C. In these drawings, an optical path difference generating element 227 is provided on an optical path of reticle irradiation beams $RB_1$ to $RB_4$ separated by a plane-parallel plate 226. The optical path difference generating element 227 is made of a transparent material which changes an optical path length for the irradiation beams separated by the plane-parallel plate 226. The other structure is the same as in FIG. 39A to FIG. 39C. The optical path difference generating element 227 changes a cross position between the reticle irradiation beams $RB_1$ to $RB_4$ and the wafer irradiation beams $WB_1$ to $WB_4$. Also, such an alternative may be employed that the state of polarization of the reticle irradiation beams is made different from that of wafer irradiation beams and the lens 228 in FIGS. 49A and 49B is constructed as a bifocal lens.

Figure 50:
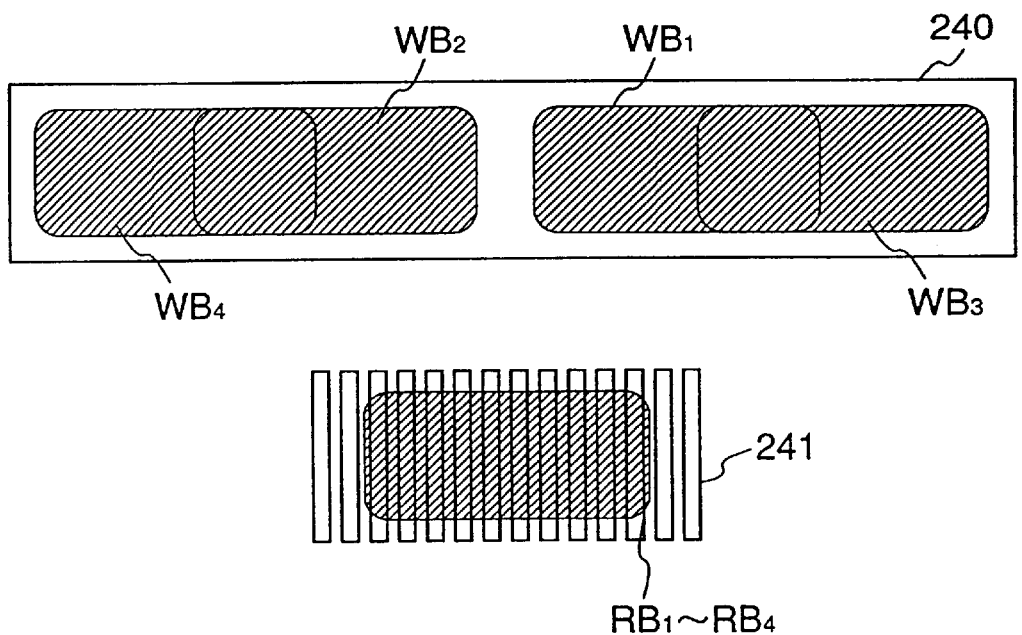
FIG. 50 is an enlarged plan view of major part to show an example of shape of reticle mark and reticle window in the eighth embodiment, and an alignment light transmitting portion and an alignment light irradiating portion.

FIG. 50 shows a reticle mark 241 and a reticle window 240 on the reticle 204 in the present embodiment. Since the axial chromatic aberration of wafer irradiation beams $WB_1$ to $WB_4$ is not corrected in the present embodiment, the reticle window 240 must be made wider thereby as shown in FIG. 50.

In the eighth embodiment the lateral chromatic aberration of alignment light (wafer irradiation light) irradiated onto the wafer mark 237 and the lateral chromatic aberration of alignment detection light from the wafer mark 237 are controlled, so that the reticle window 240 formed on the reticle 204 can be set at a convenient position and the wafer mark 237 can also be set at a desired position, for example at a position where the exposure light is less irradiated. Also, since only the lateral chromatic aberration is controlled without correcting the axial chromatic aberration of projection optical system 205 for the wafer irradiation light, in case the axial chromatic aberration of exposure light and alignment light being not so large (for example in case of the exposure light being the i line of mercury lamp and the alignment line being a He—Ne laser beam), the grating pattern of chromatic aberration control elements can be constituted only in two directions perpendicular to each other, which facilitates the production of chromatic aberration control plate 239.

Meanwhile, the control of lateral chromatic aberration is effected in the radial direction (meridional direction) to the optical axis $AX_0$ of projection optical system 205, as shown in FIG. 46A in the above seventh and eighth embodiments. However, the direction of control of lateral chromatic aberration is not limited to the meridional direction but can be an arbitrary direction.

Embodiment 9

The ninth embodiment of the present invention is next described with reference to FIG. 52 to FIG. 54. The present embodiment is an example in which an alignment optical system detects not only an X-directional positional deviation but also a Y-directional positional deviation between the reticle 204 and the wafer 206. For that, in addition to the wafer irradiation beams $WB_1$ to $WB_4$ and the reticle irradiation beams $RB_1$ to $RB_4$ for X-directional alignment as shown in FIGS. 46A and 46B, unrepresented wafer irradiation beams $WB_5$ to $WB_8$ and reticle irradiation beams $RB_5$ to $RB_8$ are emitted for Y-directional alignment through an objective lens corresponding to the objective lens 202 in FIGS. 46A and 46B. Explaining referring to FIGS. 46A and 46B the wafer irradiation beams $WB_5$ to $WB_8$ and the reticle irradiation beams $RB_5$ to $RB_8$ for Y-directional alignment are irradiated onto a wafer mark and onto a reticle mark, respectively, in a plane perpendicular to the plane of FIG. 46B.

Figure 52:
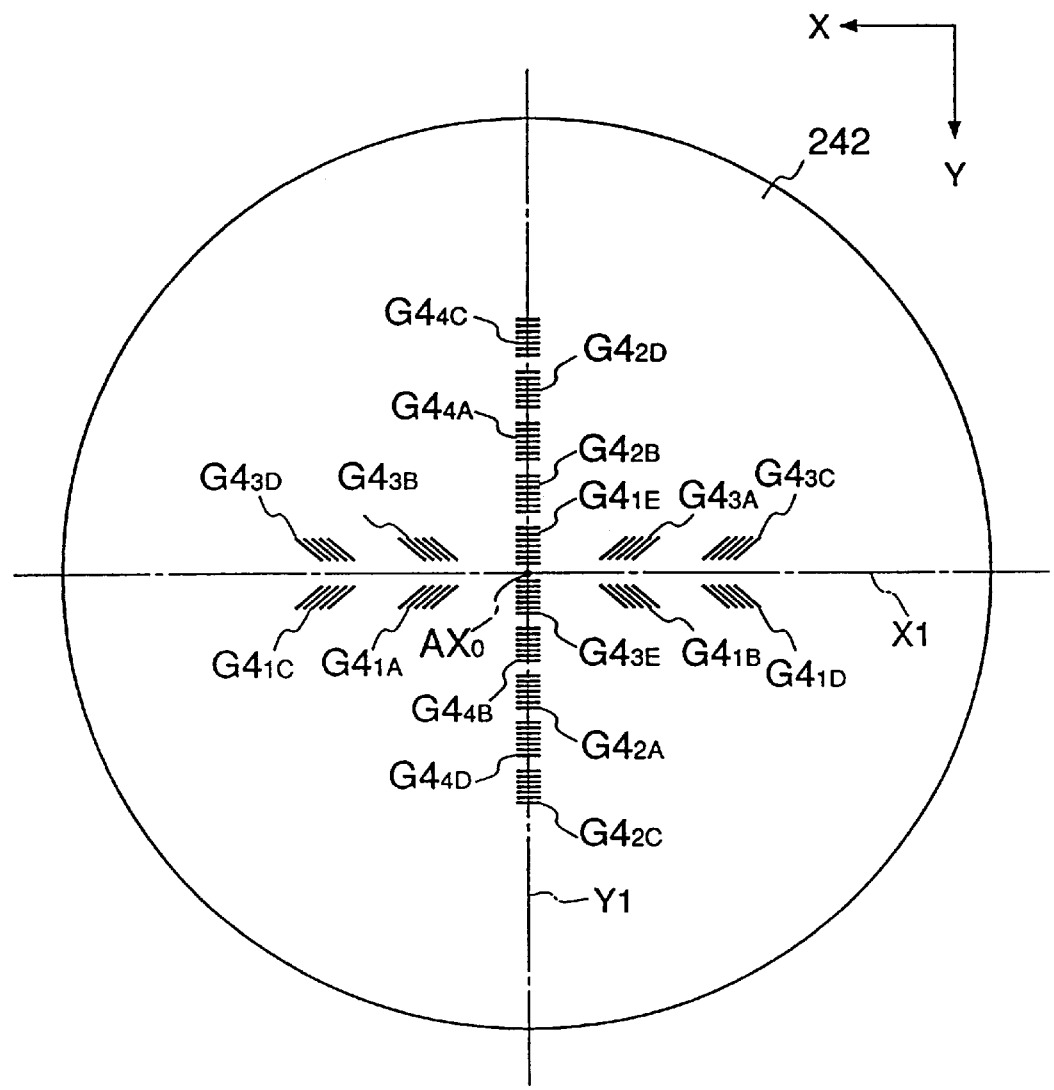
FIG. 52 is a plan view to illustrate a layout and a function of chromatic aberration correcting elements formed on a chromatic aberration control plate in the ninth embodiment.

FIG. 52 shows a layout and the shape of chromatic aberration control elements on a chromatic aberration control plate 242 located on the pupil plane of projection optical system in the ninth embodiment. In FIG. 52, chromatic aberration control elements $G4_{1A}$ to $G4_{1D}$ are provided for correcting axial and lateral chromatic aberration of wafer irradiation beams $WB_1$ to $WB_4$ for X-directional alignment and a chromatic aberration control element $G4_{1E}$ for correcting lateral chromatic aberration of detection light from the wafer mark under irradiation of the wafer irradiation beams. The shape and the layout of chromatic aberration control elements $G4_{1A}$ to $G4_{1E}$ are the same as the axial and lateral chromatic aberration control elements $G2_{1A}$ to $G2_{1D}$ and the lateral chromatic aberration control element $G2_{1E}$ shown in FIG. 46 in the seventh embodiment.

As for the wafer irradiation beams $WB_5$ to $WB_8$ for Y-directional alignment, the direction of shift amount (amount corresponding to $\Delta\beta$ in FIG. 46A) of beam position on the wafer is coincident with the Y direction which is the measurement direction, so that the direction of gratings for the control elements necessary for controlling the axial chromatic aberration is coincident with that for control elements necessary for controlling the lateral chromatic aberration. Accordingly, the control of chromatic aberration of wafer irradiation beams $WB_5$ to $WB_8$ for Y-directional alignment is effected by the chromatic aberration control elements $G4_{2A}$ to $G4_{2D}$ of diffraction gratings for irradiation light aligned on the line Y1 parallel to the Y direction through the optical axis $AX_0$ on the chromatic aberration control plate 242 and formed at a predetermined pitch along the direction of line Y1 thereon. Also, the chromatic aberration of detection light emerging from the wafer mark upon irradiation of wafer irradiation beams $WB_5$ to $WB_8$ can be controlled by the chromatic aberration control element $G4_{1E}$ for X-directional alignment.

The present embodiment may include two alignment optical systems for detecting X-directional positional deviations and two more for Y-directional positional deviations. For that, there are chromatic aberration control elements $G4_{3A}$ to $G4_{3E}$ and irradiation beam chromatic aberration control elements $G4_{4A}$ to $G4_{4D}$ provided on the chromatic aberration control plate 242 in FIG. 52 at respective positions as rotated 90° from the positions of the chromatic aberration control elements $G4_{1A}$ to $G4_{1E}$ and the irradiation beam chromatic aberration control elements $G4_{2A}$ to $G4_{2D}$. Accordingly, there are 18 chromatic aberration control elements in total provided on the chromatic aberration control plate 242.

FIG. 53 shows the shape and the layout of reticle mark 244 and reticle window 243 on the reticle in the present embodiment. The reticle mark 244 is composed of two-dimensional gratings obtained by superimposing X-directional gratings with pitch $P_R$ on Y-directional gratings with pitch $P_R$. The reticle irradiation beams $RB_1$ to $RB_4$ for X direction and the reticle irradiation beams $RB_5$ to $RB_8$ for Y direction are irradiated onto the reticle mark 244, while the wafer irradiation beams $WB_1$ to $WB_4$ for X direction and the wafer irradiation beams $WB_5$ to $WB_8$ for Y direction pass through the reticle window 243. FIG. 53 shows the wafer mark 245 on the wafer in the present embodiment. As shown in FIG. 53, the wafer mark 245 is two-dimensional gratings as superposition of X-directional gratings with pitch $P_W$ and Y-directional gratings with pitch $P_W$. The wafer irradiation beams $WB_1$ to $WB_4$ for X direction and the wafer irradiation beams $WB_5$ to $WB_8$ for Y direction are irradiated onto the wafer mark 245.

In the present embodiment, a light receiving system in the alignment optical system must discriminate the wafer detection light and the reticle detection light for X direction from the wafer detection light and the reticle detection light for Y direction. In this case, for example the wafer detection light for X direction and the wafer detection light for Y direction are superimposed on each other on the pupil plane of projection optical system, so that they cannot be separated from each other by an element such as a slit. A possible method for separation is for example a method in which the direction of polarization of X-directional irradiation light is made different from that of Y-directional irradiation light.

The present embodiment employs such a method that the alignment irradiation beams for X direction have frequency differences of $\Delta f_1$ and $\Delta f_2$ and the alignment irradiation beams for Y direction are arranged to have frequency differences of $\Delta f_3$ and $\Delta f_4$ different from $\Delta f_1$ and $\Delta f_2$. Detection light beams of four beat frequencies are received by a single photoelectric detector, and an output signal from the photoelectric detector is supplied to a high-pass filter circuit, a low-pass filter circuit and two band-pass filter circuits as described above to obtain four independent wafer signals. The same detection can be applied to the reticle signal.

The present embodiment as so arranged permits alignment detection in two directions with an objective lens (lens corresponding to the objective lens 202 in FIG. 46B). Accordingly, the apparatus can be so constructed as to have only two objective lenses in total, if only a two-dimensional positional deviation amount (a positional deviation amount in the X and Y directions and a deviation amount of rotation angle) is detected between the reticle 204 and the wafer 206. Further, if four objective lenses are used in total, the apparatus can also detect a magnification error between the reticle 204 and a chip on the wafer 206, which further enhances the alignment accuracy.

Also, for example in the embodiment shown in FIG. 46A to FIG. 46C, the Y-directional positional deviation can be detected between the reticle 204 and the wafer 206 by such an arrangement that the wafer mark 237 is formed as a two-dimensional diffraction grating and the wafer irradiation beams $WB_3$, $WB_4$ in FIG. 46B are irradiated in the Y direction, i.e., in the plane perpendicular to the plane of FIG. 46B.

Further, the embodiments as described above may employ another method for separately extracting signals of respective frequencies from the signal in which a plurality of signals with mutually different frequencies are mixed. For example, a possible method is that the original signal is subjected to digital sampling using a frequency which is more than a double of the maximum frequency of the plurality of frequencies and the thus sampled signals are once stored in a memory. Only a signal of specific frequency can be taken out of the signals thus stored in the memory by operational processing utilizing the method of Fourier series. In this case, the signals can be completely separated and extracted by setting a ratio of beat frequencies (for example $\Delta f_1$, $\Delta f_2$) to a simple integral ratio and selecting the sampling time as a common multiple of cycle of each signal.

Yet further, in the sixth to ninth embodiments, the average wavelength of wafer irradiation beams $WB_1$, $WB_2$ is equal to that of wafer irradiation beams $WB_3$, $WB_4$, for example in FIG. 39A to FIG. 39C, but the average wavelength of wafer irradiation beams $WB_1$, $WB_2$ may be made different from that of wafer irradiation beams $WB_3$, $WB_4$. In case of such different average wavelengths, the detection light from the wafer mark by the wafer irradiation beams $WB_1$, $WB_2$ may be separated for example by the wavelength discrimination from that by wafer irradiation beams $WB_3$, $WB_4$.

Embodiment 10

The tenth embodiment is described with FIG. 55 and FIGS. 56A, 56B and 56C. The first to ninth embodiments as described above each are so arranged that the alignment light (irradiation beams) is irradiated through the reticle and the projection optical system onto the wafer mark on the wafer and the alignment light (detection light) diffracted by the wafer mark is detected through the projection optical system and the reticle, that is, the alignment light is always irradiated and detected through the interposed reticle. In contrast, the alignment apparatus in the tenth embodiment is so arranged that the alignment light (irradiation light and detection light) is irradiated and detected only through the projection optical system without passing through the reticle.

Figure 55:
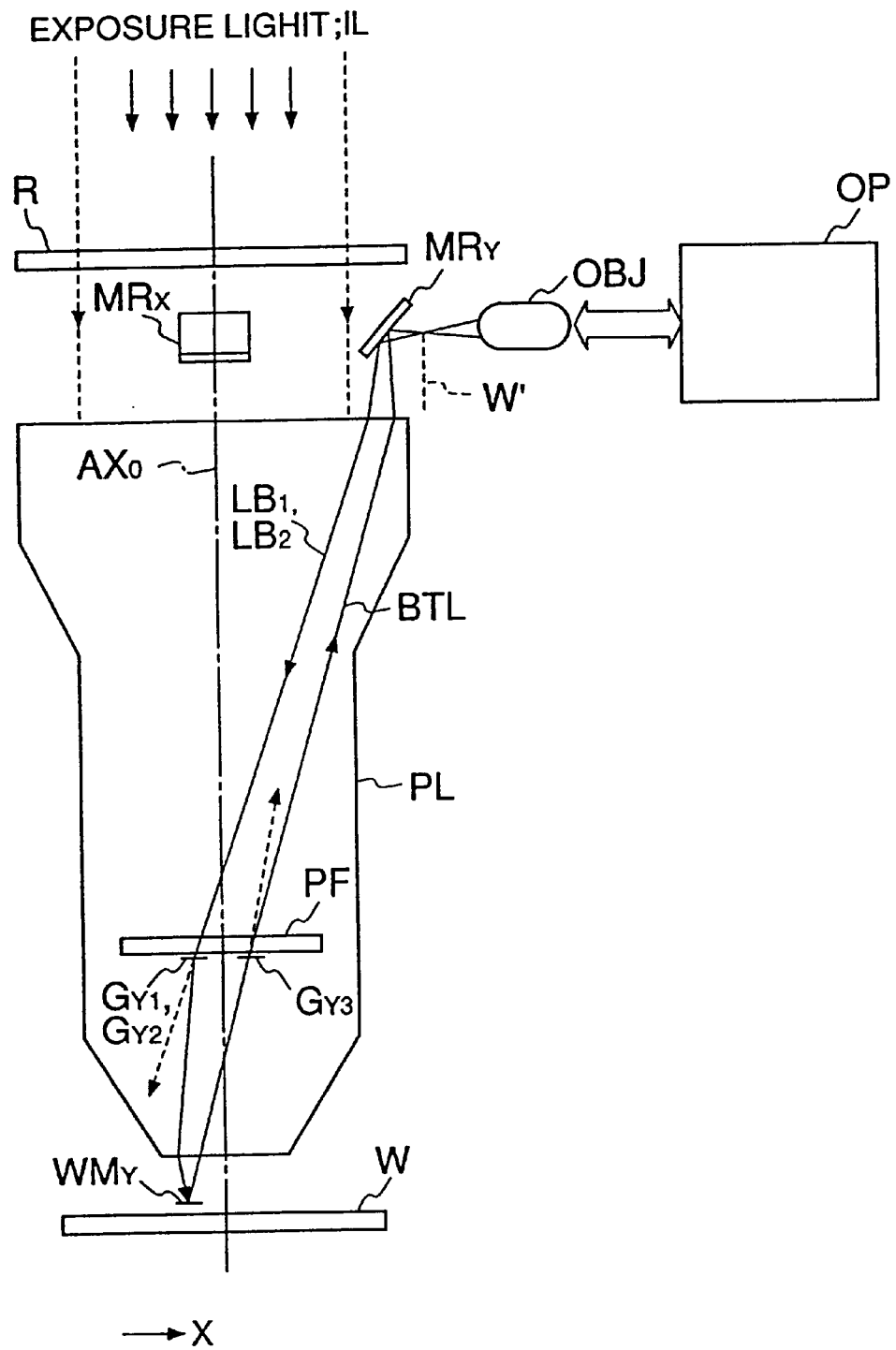
FIG. 55 is a scheme to show the construction of the tenth embodiment.

The scheme of exposure apparatus and the structure of alignment apparatus are first described based on FIG. 55. In the exposure apparatus, exposure light IL with single wavelength and uniform intensity is irradiated from an exposure light source (not shown) onto transfer circuit patterns formed on a reticle R and the exposure light IL passing through the reticle R is irradiated through a projection optical system PL onto a wafer W. The irradiation direction of exposure light IL is coincident with the optical axis $AX_0$ of projection optical system PL. The wafer W is mounted on a movable stage which is movable in the X direction perpendicular to the optical axis $AX_0$ and in the Y direction perpendicular to the optical axis $AX_0$ and to the X direction.

In the alignment apparatus, a total reflection mirror $MR_Y$ is set at a predetermined angle of inclination outside the maximum effective exposure area set for the exposure apparatus and between the reticle R and the projection optical system PL. Further outside the total reflection mirror $MR_Y$, an alignment optical system OP is provided for emitting alignment light for irradiation light toward the total reflection mirror $MR_Y$ and receiving alignment light for detection light incident via the total reflection mirror $MR_Y$. This alignment optical system OP is arranged to perform alignment inspection utilizing the heterodyning technique as described above in the first to ninth embodiments (see the arrangements shown for example in FIG. 5, FIG. 13A, FIG. 29B, FIG. 36B, FIG. 39B, FIG. 40, FIG. 49B).

Further, disposed on the pupil plane of projection optical system PL is a chromatic aberration control plate PF having a function such as those described in the first to ninth embodiments. A chromatic aberration control plate PF is properly selected depending upon the type of chromatic aberration to be corrected, that is, depending upon whether both the magnification chromatic aberration (lateral chromatic aberration) and the axial chromatic aberration should be corrected at a time or either one of them should be corrected.

Figure 56A:
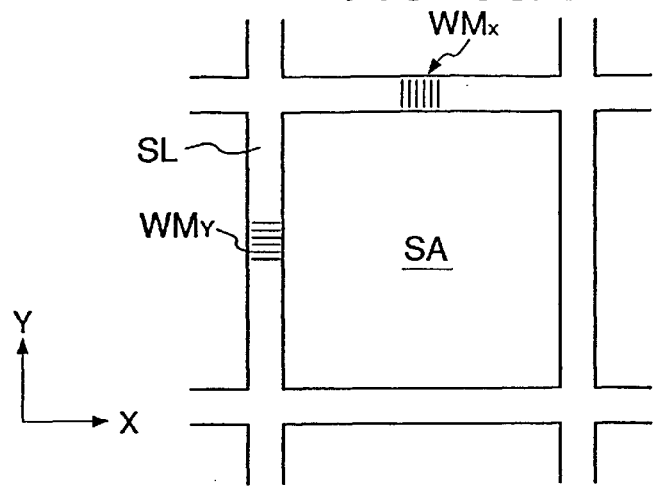
FIG. 56A is an enlarged plan view of major part to show an example of shape of wafer mark in the tenth embodiment.

FIG. 55 shows an example of arrangement in which both the magnification chromatic aberration (lateral chromatic aberration) and the axial chromatic aberration are corrected at a time. The alignment optical system OP produces two beams of alignment light (irradiation light) $LB_1$, $LB_2$ different in wavelength from each other and emits the two beams through the objective lens OBJ toward the total reflection mirror $MR_Y$. The irradiation beams $LB_1$, $LB_2$ are reflected by the total reflection mirror $MR_Y$ and enter the projection optical system PL at the outer edge of the maximum effective exposure area thereof. Then the irradiation light $LB_1$ is deflected in a predetermined direction by a chromatic aberration control element $GY_1$ of diffraction grating formed on the chromatic aberration control plate PF, while the irradiation light $LB_2$ is deflected in a predetermined direction by a chromatic aberration control element $GY_2$ of diffraction grating formed on the chromatic aberration control plate PF. The thus deflected double-beam irradiation light $LB_1$, $LB_2$ is irradiated onto a wafer mark $WM_Y$ of diffraction grating formed on a street line SL at the periphery outside each shot area SA on the wafer W, as shown in FIG. 56A. Then the irradiation light $LB_1$, $LB_2$ is diffracted by the wafer mark $WM_Y$, and interference light (detection light) BTL for example of±first-order diffracted light thereof proceeds backward to the projection optical system PL and is deflected in a predetermined direction by a chromatic aberration control element $GY_3$ formed on the chromatic aberration control plate PF. Further, the detection light is reflected by the total reflection mirror $MR_Y$ and passes through the objective lens OBJ then to enter the alignment optical system OP. Incidentally, if the pattern of diffraction gratings is arranged in two directions perpendicular to the exposure area SA, such as wafer marks $WM_Y$, $WM_X$ as shown in FIG. 56A, the total reflection mirror $MR_Y$ can be relatively readily arranged outside the exposure area.

Figure 56B:
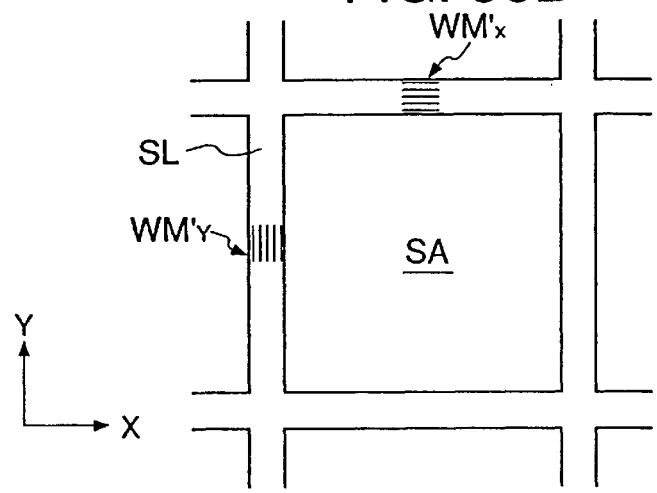
FIG. 56B is an enlarged plan view of major part to show another example of shape of wafer mark in the tenth embodiment.
Figure 56C:
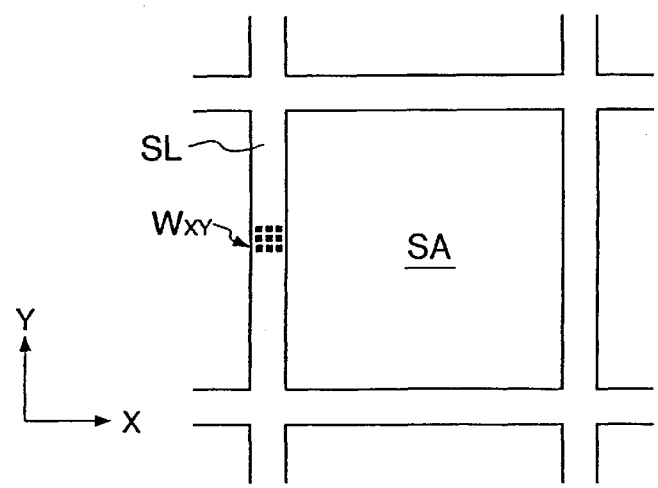
FIG. 56C is an enlarged plan view of major part to show still another example of shape of wafer mark in the tenth embodiment.

In contrast, if the pattern of diffraction gratings is aligned in the directions parallel to the exposure area SA, such as wafer marks $WM_Y'$, $WM_X'$ as shown in FIG. 56B the positions of chromatic aberration correction elements $GY_1$ to $GY_3$ and the shape of diffraction grating pattern must be designed such that the incident and outgoing positions of alignment light (irradiation light and detection light) are set outside the exposure area. In other words, the chromatic aberration correction elements $GY_1$ to $GY_3$ are designed for correcting at least the magnification chromatic aberration (maybe the both of magnification chromatic aberration and axial chromatic aberration) of projection optical system PL for irradiation light and detection light such that the total reflection mirror $MR_Y$ is located outside the exposure area of the exposure apparatus. It is apparent that a chromatic aberration control plate PF suitable for such wafer marks $WM_Y'$, $WM_X'$ can be achieved by applying the principle of chromatic aberration control plate in the present invention as described in the first to ninth embodiments (by correcting at least the magnification chromatic aberration).

Also, in case the alignment inspection is carried out employing a wafer mark $WM_{XY}$ comprised of a plurality of rectangular gratings, the position of chromatic aberration control elements $GY_1$ to $GY_3$ on the chromatic aberration control plate PF and the shape of diffraction grating pattern must be designed such that the total reflection mirror $MR_Y$ is arranged to be located outside the exposure area to reflect the irradiation light and the detection light. Also in this case, a chromatic aberration control plate PF suitable for such wafer mark $WM_Y'$, $WM_X'$ can be achieved by applying the principle of chromatic aberration control plate in the present invention as described in the first to ninth embodiments (by correcting at least the magnification chromatic aberration).

As described above in the embodiments, the shape of chromatic aberration control elements $GY_1$, $GY_2$, $GY_3$ (the shape of diffraction gratings) on the chromatic aberration control plate PF is preferably determined in order to improve the alignment inspection accuracy such that the plane conjugate with the wafer W with respect to the projection optical system PL (the plane W' shown by the dotted line in FIG. 54) should be made approximately coincident with the reflection plane of the total reflection mirror $MR_Y$ under the alignment light.

A positional deviation amount of wafer W can be detected by analyzing the detection light BTL entering the alignment optical system OP by the heterodyning technique. The wafer W can be set at the regular position by finely adjusting the movable stage based on the thus obtained positional deviation amount.

As described above, the present embodiment permits alignment inspection in such arrangement that the alignment light does not pass through the reticle R, which can obviate the special reticle mark and the special reticle window for alignment on the reticle R and which can provide a simple alignment apparatus.

What is claimed is:

1. An alignment apparatus, which is set in an exposure apparatus having a projection optical system for projecting a projection pattern formed on a mask onto a substrate under exposure light and which performs relative alignment between said mask and said substrate, comprising:

alignment light irradiating system for forming a pair of two beams from each of light beams of plural wavelengths different from that of said exposure light to obtain a plural sets of beam pairs and irradiating the plural sets of beam pairs through said projection optical system onto a specific alignment mark on said substrate;

a plurality of chromatic aberration correction optical elements set in optical paths of said plural sets of beam pairs and on or near a Fourier transform plane of said projection pattern formed on said mask in said projection optical system, for deflecting said beam pairs so as to make two beams in each beam pair incident at substantially equal incident angles into said specific alignment mark;

photoelectric detector for receiving beams of diffracted light which emerge in a substantially same direction from said specific alignment mark upon irradiation of said plural sets of beam pairs, to generate a signal corresponding to the diffracted light; and controller for controlling the relative alignment between said mask and said substrate, based on said signal from said photoelectric detector.

2. An alignment apparatus according to claim 1, wherein said chromatic aberration correction optical elements are optical elements which correct at least one of a lateral chromatic aberration and a longitudinal chromatic aberration of said projection optical system for said plural sets of beam pairs irradiated from said alignment light irradiating system.

3. An alignment apparatus according to claim 1, wherein said chromatic aberration correction optical elements are diffraction gratings which diffract said plural sets of beam pairs irradiated from said alignment light irradiating system, so that the beam pairs are deflected toward said specific alignment mark.

4. An alignment apparatus according to claim 1, further comprising a second chromatic aberration correction optical element set in an optical path of said diffracted light emerging from said specific alignment mark on said substrate to deflect said diffracted light.

5. An alignment apparatus according to claim 4, wherein said second chromatic aberration correction optical element is an optical element which corrects at least one of a lateral chromatic aberration and a longitudinal chromatic aberration of said projection optical system for the beams of diffracted light emerging in said substantially same direction.

6. An alignment apparatus according to claim 5, wherein said second chromatic aberration correction optical element is a diffraction grating for diffracting said beams of diffracted light.

7. An alignment apparatus according to claim 1, further comprising:

a second chromatic aberration correction optical element for deflecting±first-order diffracted light in said beams of diffracted light emerging from said specific alignment mark on said substrate and simultaneously deflecting zeroth-order diffracted light and second-order diffracted light therein;

wherein said photoelectric detector comprises a first light-receiving element for receiving said±first-order diffracted light and a second light-receiving element for receiving said zeroth-order and second-order diffracted light, each of said light-receiving elements generating a signal corresponding to said diffracted light.

8. An alignment apparatus according to claim 1, wherein said alignment light irradiating system comprises a light source for emitting a plurality of laser beams with mutually different wavelengths different from that of said exposure light, and an optical splitter for splitting each of said laser beams into two beams to obtain said plural sets of beam pairs.

9. An alignment apparatus according to claim 1, wherein said alignment light irradiating system comprises:

a light source for emitting a plurality of laser beams with mutually different wavelengths different from that of said exposure light;

frequency shifting device for producing from each of said laser beams two beams with a specific predetermined beat frequency to obtain said plural sets of beam pairs; and reference signal generator for generating a reference signal with a frequency equal to said beat frequency;

wherein said controller obtains a phase difference between a signal output from said photoelectric detector and said reference signal and performs a control of relative alignment between said mask and said substrate, based on said phase difference.

10. An alignment apparatus according to claim 1, wherein said alignment light irradiating system makes two beams in each of said plural sets of beam pairs enter said projection optical system as breaking meridional telecentricity thereof by a same angle.

11. An alignment apparatus according to claim 1, wherein said alignment light irradiating system makes two beams in each of said plural sets of beam pairs enter said projection optical system as breaking meridional telecentricity thereof by different angles from each other.

12. An alignment apparatus, which is set in an exposure apparatus having a projection optical system for projecting a projection pattern formed on a mask onto a substrate under exposure light and which performs relative alignment between said mask and said substrate, comprising:

alignment light irradiating system for forming a pair of two beams from each of light beams of plural wavelengths different from that of said exposure light to obtain a plural sets of beam pairs and splitting said beam pairs into two portions to obtain a first irradiation beam and a second irradiation beam, said alignment light irradiating system irradiating said first irradiation beam onto a first alignment mark formed on said mask with two beams in each beam pair being incident at substantially equal incident angles, and said alignment light irradiating system irradiating said second irradiation beam onto a second alignment mark on said substrate through a transmission window formed in a portion on said mask and then through said projection optical system;

a plurality of chromatic aberration correction optical elements provided on or near a Fourier transform plane to said projection pattern formed on said mask in said projection optical system and in an optical path of said second irradiation beam irradiated onto said second alignment mark, said chromatic aberration correction optical elements deflecting said beam pairs in said second irradiation beam to make two beams in each beam pair incident at substantially equal incident angles into said second alignment mark on said substrate;

first photoelectric detector for receiving beams of first diffracted light emerging at a substantially same direction from said first alignment mark to generate a first signal corresponding to said first diffracted light;

second photoelectric detector for receiving beams of second diffracted light emerging at a substantially same direction from said second alignment mark to generate a second signal corresponding to said second diffracted light; and controller for controlling the relative alignment between said mask and said substrate, based on said first and second signal.

13. An alignment apparatus according to claim 12, wherein said chromatic aberration correction optical elements are optical elements for correcting at least one of a lateral chromatic aberration and a longitudinal chromatic aberration of said projection optical system for said second irradiation beam composed of said plural sets of beam pairs and irradiated by said alignment light irradiating system.

14. An alignment apparatus according to claim 12, wherein said chromatic aberration correction optical elements are diffraction gratings for diffracting said second irradiation beam composed of said plural sets of beam pairs and irradiated by said alignment light irradiating system, to deflect said beam toward said second alignment mark.

15. An alignment apparatus according to claim 12, further comprising a second chromatic aberration correction optical element set in an optical path of said diffracted light emerging from said second alignment mark on said substrate to deflect the diffracted light.

16. An alignment apparatus according to claim 15, wherein said second chromatic aberration correction optical element is an optical element for correcting at least one of a lateral chromatic aberration and a longitudinal chromatic aberration of said projection optical system for each beam in the diffracted light emerging in said substantially same direction.

17. An alignment apparatus according to claim 16, wherein said second chromatic aberration correction optical element is a diffraction grating for diffracting said beams of diffracted light.

18. An alignment apparatus according to claim 12, further comprising:

a second chromatic aberration correction optical element for deflecting±first-order diffracted light in said beams of diffracted light emerging from said second alignment mark on said substrate and simultaneously deflecting zeroth-order diffracted light and second-order diffracted light therein;

wherein said second photoelectric detector comprises a first light-receiving element for receiving said±first-order diffracted light and a second light-receiving element for receiving said zeroth-order diffracted light and second-order diffracted light, each of said light-receiving elements generating a second signal corresponding to said second diffracted light.

19. An alignment apparatus according to claim 12, wherein said alignment light irradiating system comprises a light source for emitting a plurality of laser beams with mutually different wavelengths different from that of said exposure light, and an optical splitter for splitting each laser beam into two beams to obtain said plural sets of beam pairs.

20. An alignment apparatus according to claim 12, wherein said alignment light irradiating comprises a light source for emitting a plurality of laser beams with mutually different wavelengths different from that of said exposure light, frequency shifting device for forming two beams with a specific predetermined beat frequency from each of said laser beams with respective wavelengths to obtain said plural sets of beam pairs, and reference signal generator for generating a reference signal with a frequency equal to said beat frequency;

wherein said controller obtains two phase differences between each of a first signal output from said first photoelectric detector and a second signal output from said second photoelectric detector, and said reference signal.

21. An alignment apparatus according to claim 12, wherein said alignment light irradiating system makes two beams in each of said plural sets of beam pairs incident into said projection optical system while breaking meridional telecentricity thereby by a same angle.

22. An alignment apparatus according to claim 12, wherein said alignment light irradiating system makes two beams in each of said plural sets of beam pairs incident into said projection optical system while breaking meridional telecentricity thereby by mutually different angles.

23. An alignment apparatus, which is set in an exposure apparatus having a projection optical system for projecting a projection pattern formed on a mask onto a substrate under exposure light and which performs relative alignment between said mask and said substrate, comprising:

alignment light irradiating system for irradiating a beam pair with a wavelength different from that of said exposure light through said projection optical system onto a specific alignment mark on said substrate;

a plurality of first chromatic aberration correction optical elements sets on or near a Fourier transform plane to said projection pattern formed on said mask in said projection optical system and in optical paths of said beam pair, said first chromatic aberration correction optical elements deflecting said beam pair to make two beams therein incident at substantially equal incident angles into said specific alignment mark on said substrate;

photoelectric detector for receiving diffracted light including groups of diffracted beams, group by group, said diffracted light emerging from said specific alignment mark when said beam pair is irradiated onto said specific alignment mark through said plurality of first chromatic aberration correction optical elements and diffracted thereby, and returning in said projection optical system as the groups of diffracted beams, each group of beams emerging in a substantially same direction, said photoelectric detector then generating signals corresponding to the diffracted light;

a plurality of second chromatic aberration correction optical elements set on or near the Fourier transform plane in said projection optical system and in an optical path of said diffracted light to deflect said diffracted light toward said photoelectric detector; and controller for performing alignment between said mask and said substrate, based on at least one signal corresponding to said diffracted light from said photoelectric detecting means.

24. An alignment apparatus according to claim 23, wherein said plurality of first chromatic aberration correction optical elements are optical elements for correcting either one of a lateral chromatic aberration and a longitudinal chromatic aberration of said projection optical system for said beam pair irradiated by said alignment light irradiating system; and wherein said plurality of second chromatic aberration correction optical elements are optical elements for correcting at least one of a lateral chromatic aberration and a longitudinal chromatic aberration of said projection optical system for said diffracted light.

25. An alignment apparatus according to claim 23, wherein said plurality of first chromatic aberration correction optical elements and said plurality of second chromatic aberration correction optical element are diffraction gratings.

26. An alignment apparatus according to claim 23, wherein said plurality of second chromatic aberration correction optical elements comprise an optical element for deflecting±first-order diffracted light emerging from said alignment mark on said substrate, and an optical element for deflecting zeroth-order diffracted light and second-order diffracted light.

27. An alignment apparatus according to claim 23, wherein said alignment light irradiating system comprises:

a light source for emitting a laser beam with a wavelength different from that of said exposure light;

a first optical splitter for splitting said laser beam into two beams;

a second optical splitter for splitting each of said two beams outgoing from said first optical splitter into two beams to supply four beams; and an objective optical system for irradiating a mask alignment beam pair composed of two beams out of said four beams, at incident angles symmetric with each other onto the alignment mark formed on said mask and irradiating two remaining beams as said beam pair at incident angles symmetric with each other onto the alignment mark on said substrate through said projection optical system.

28. An alignment apparatus according to claim 23:

wherein said alignment light irradiating system comprises:

a light source for emitting a laser beam with a wavelength different from that of said exposure light;

a first optical splitter for splitting said laser beam into two beams;

frequency shifting device for providing said two beams from said first optical splitter with a predetermined beat frequency;

a second optical splitter for splitting each of two beams outgoing from said frequency shifting device into two beams to supply four beams;

an objective optical system for irradiating a mask alignment beam pair composed of two beams out of said four beams, at incident angles symmetric with each other onto the alignment mark formed on said mask and irradiating two remaining beams as said beam pair at incident angles symmetric with each other onto the alignment mark on said substrate through said projection optical system; and reference signal generator for generating a reference signal with a frequency equal to said beat frequency; and wherein said photoelectric detector receives diffracted light emerging from said alignment mark formed on said mask, and said controller performs the relative alignment between said mask and said substrate, based on a phase difference between said reference signal and a signal corresponding to diffracted light from said alignment mark formed on said mask, and at least one phase difference between said reference signal and each of said signals corresponding to said groups of diffracted beams from said alignment mark formed on said substrate.

29. An alignment apparatus, which is set in an exposure apparatus having a projection optical system for projecting a projection pattern formed on a mask onto a substrate under exposure light and which performs relative alignment between said mask and said substrate, comprising:

alignment light irradiating system for forming a beam pair with a wavelength different from that of said exposure light and splitting said beam pair into two portions as a first irradiation beam and a second irradiation beam, said alignment light irradiating system irradiating two beams in said first irradiation beam at substantially equal incident angles onto a first alignment mark formed on said mask, and said alignment light irradiating system irradiating said second irradiation beam onto a second alignment mark on said substrate through a transmission window formed on said mask and then through said projection optical system;

first chromatic aberration correction optical elements set on or near a Fourier transform plane to said projection pattern formed on said mask in said projection optical system and in optical paths of said second irradiation beam irradiated onto said second alignment mark, said first chromatic aberration correction optical elements deflecting said second irradiation beam to make two beams in said beam pair incident at substantially equal incident angles into said second alignment mark;

first photoelectric detector for receiving first diffracted light emerging at a substantially same direction from said first alignment mark to generate a signal corresponding to the first diffracted light;

second photoelectric detector for receiving second diffracted light including groups of diffracted beams, said second diffracted light emerging at a substantially same direction from said second alignment mark to generate signals corresponding to the second diffracted light;

second chromatic aberration correction optical elements set in said groups of diffracted beams return optical path to deflect said second diffracted light toward said second photoelectric detector; and controller for controlling the relative alignment between said mask and said substrate, based on said signal from said first photoelectric detector and at least one of said signals from said second photoelectric detector.

30. An alignment apparatus according to claim 29, wherein said first chromatic aberration correction optical elements are optical elements for correcting at least one of a lateral chromatic aberration and a longitudinal chromatic aberration of said projection optical system for said beam pair irradiated from said alignment light irradiating system; and wherein said second chromatic aberration correction optical elements are optical elements for correcting at least one of a lateral chromatic aberration and a longitudinal chromatic aberration of said projection optical system for said second diffracted light.

31. An alignment apparatus according to claim 29, wherein said first chromatic aberration correction optical elements and said second chromatic aberration correction optical elements are diffraction gratings.

32. An alignment apparatus according to claim 29, wherein said second chromatic aberration correction optical elements comprise an optical element for deflecting±first-order diffracted light emerging from said second alignment mark on said substrate, and an optical element for deflecting zeroth-order diffracted light and second-order diffracted light.

33. An alignment apparatus according to claim 29, wherein said alignment light irradiating system comprises:
- a light source for emitting a laser beam with a wavelength different from that of said exposure light;
- a first optical splitter for splitting said laser beam into two beams;
- a second optical splitter for splitting each of said two beams outgoing from said first optical splitter into two beams to supply four beams; and
- an objective optical system for irradiating a mask alignment beam pair composed of two beams out of said four beams, at incident angles symmetric with each other onto the first alignment mark formed on said mask and irradiating two remaining beams as said beam pair at incident angles symmetric with each other onto the second alignment mark on said substrate through a transmission window formed on said mask and then through said projection optical system.

34. An alignment apparatus according to claim 29, wherein said alignment light irradiating system comprises:
- a light source for emitting a laser beam with a wavelength different from that of said exposure light;
- a first optical splitter for splitting said laser beam into two beams;
- frequency shifting device for providing said two beams from said first optical splitter with a predetermined beat frequency;
- a second optical splitter for splitting each of two beams outgoing from said frequency shifting means into two beams to supply four beams;
- an objective optical system for irradiating a mask alignment beam pair composed of two beams out of said four beams, at incident angles symmetric with each other onto the first alignment mark formed on said mask and irradiating two remaining beams as said beam pair at incident angles symmetric with each other onto the second alignment mark on said substrate through a transmission window formed on said mask and then through said projection optical system; and
- reference signal generator for generating a reference signal with a frequency equal to said beat frequency; and
- wherein said controller performs the relative alignment between said mask and said substrate, based on a phase difference between said signal from said first photoelectric detector and said reference signal, and at least one phase difference between each of said signals from said second photoelectric detector and said reference signal.

35. An alignment apparatus, which is set in an exposure apparatus having a projection optical system for projecting a projection pattern formed on a mask onto a substrate under exposure light and which performs relative alignment between said mask and said substrate, comprising:
- alignment light irradiating system for irradiating a first beam pair and a second beam pair, each pair composed of two beams with a substantially same wavelength different from that of said exposure light, onto a specific alignment mark on said substrate through said projection optical system, said alignment light irradiating system having first frequency shifting device for providing two beams of said first beam pair with a first beat frequency ($\Delta f_1$) and second frequency shifting device for providing two beams of said second beam pair with a second beat frequency ($\Delta f_2$) different from said first beat frequency ($\Delta f_1$);
- a plurality of chromatic aberration correction optical elements set on or near a Fourier transform plane to said projection pattern formed on said mask in said projection optical system and in optical paths of said first and second beam pairs, said chromatic aberration correction optical elements deflecting said first beam pair to make the two beams incident at substantially equal incident angles into said specific alignment mark on said substrate and deflecting said second beam pair to make the two beams incident at substantially equal incident angles into said specific alignment mark on said substrate, wherein said incident angles of the first beam pair and the second beam pair are set in a relation of an integral number of times;
- photoelectric detector for receiving diffracted light including groups of diffracted beams, group by group, each group including beams emerging in a substantially same direction, said diffracted light emerging when said first and second beam pairs are irradiated onto said specific alignment mark through said chromatic aberration correction optical elements and then returning through said projection optical system, said photoelectric detector then generating signals corresponding to said groups of diffracted beams;
- reference signal generator for generating a first reference signal with a frequency equal to said first beat frequency ($\Delta f_1$) and a second reference signal with a frequency equal to said second beat frequency ($\Delta f_2$); and
- controller for performing alignment between said mask and said substrate, based on phase differences between said signals of the first and second beat frequencies ($\Delta f_1, \Delta f_2$) from said photoelectric detector, and said first and second reference signals.

36. An alignment apparatus according to claim 35, wherein said plurality of chromatic aberration correction optical elements are optical elements for correcting at lease one of a lateral chromatic aberration and a longitudinal chromatic aberration of said projection optical system for said first and second beam pairs irradiated by said alignment light irradiating system.

37. An alignment apparatus according to claim 35, wherein said plurality of chromatic aberration correction optical elements are diffraction gratings for diffracting said first and second beam pairs irradiated by said alignment light irradiating system to deflect the beam pairs toward said specific alignment mark.

38. An alignment apparatus according to claim 35, further comprising a second chromatic aberration correction optical element set in an optical path of said diffracted light returning in said projection optical system from said specific alignment mark on said substrate to deflect said diffracted light toward said photoelectric detector.

39. An alignment apparatus according to claim 38, wherein said second chromatic aberration correction optical element is an optical element for correcting at least one of a lateral chromatic aberration and a longitudinal chromatic aberration of said projection optical system for said diffracted light.

40. An alignment apparatus according to claim 38, wherein said second chromatic aberration correction optical element is a diffraction grating for diffracting said diffracted light.

41. An alignment apparatus according to claim 35:
wherein said alignment light irradiating system further irradiates a third beam pair and a fourth beam pair each composed of two beams with a substantially same wavelength different from that of said exposure light, onto the specific alignment mark on said substrate through the projection optical system together with said first and second beam pairs, said alignment light irradiating system comprising third frequency shifting device for providing two beams in said third beam pair with a third beat frequency ($\Delta f_3$) different from said first and second beat frequencies ($\Delta f_1$, $\Delta f_2$), and fourth frequency shifting device for providing two beams in said fourth beam pair with a fourth beat frequency ($\Delta f_4$) different from said first, second and third beat frequencies ($\Delta f_1$, $\Delta f_2$, $\Delta f_3$);
wherein said plurality of chromatic aberration correction optical elements are set on or near the Fourier transform plane to said projection pattern formed on said mask in said projection optical system and in optical paths of said first, second, third and fourth beam pairs, said chromatic aberration correction optical elements deflecting said third beam pair to make two beams incident at substantially equal incident angles into the specific alignment mark on said substrate and deflecting said fourth beam pair to make two beams incident at substantially equal incident angles into said specific alignment mark on said substrate, wherein said incident angles of the fourth beam pair and the third beam pair are set in a relation of an integral number of times, and the incident angles of the first and second beam pairs and the incident angles of the third and fourth beam pairs are set in an orthogonal relation.

42. An alignment apparatus, which is set in an exposure apparatus having a projection optical system for projecting a projection pattern formed on a mask onto a substrate under exposure light and which performs relative alignment between said mask and said substrate, comprising:
alignment light irradiating system for forming a first irradiation beam and a second irradiation beam each having a first beam pair and a second beam pair each pair composed of two beams with a substantially same wavelength different from that of said exposure light, said alignment light irradiating system irradiating said first irradiation beam at equal incident angles for two beams in each beam pair onto a first alignment mark formed on said mask and irradiating said second irradiation beam onto a second alignment mark on said substrate through a transmission window formed on said mask and then through said projection optical system, wherein said alignment light irradiation system comprises first frequency shifting device for providing two beams in said first beam pair with a first beat frequency ($\Delta f_1$), and second frequency shifting device for providing two beams in said second beam pair with a second frequency difference ($\Delta f_2$) different from the first beat frequency ($\Delta f_1$);
a plurality of chromatic aberration correction optical elements set on or near a Fourier transform plane to said projection pattern formed on said mask in said projection optical system and in optical paths of said second irradiation beam, said chromatic aberration correction optical elements deflecting said first beam pair in said second irradiation beam to make two beams incident at substantially equal incident angles into said second alignment mark on said substrate and deflecting the second beam pair to make two beams incident at substantially equal incident angles into said second alignment mark on said substrate, wherein the incident angles of the first beam pair and the second beam pair are set in a relation of an integral number of times;
first photoelectric detector for receiving beams of first diffracted light emerging in a substantially same direction from said first alignment mark to generate a signal corresponding to the first diffracted light;
second photoelectric detector for receiving beams of diffracted light including groups of beams, group by group, each group including diffracted beams emerging in a substantially same direction, said diffracted light emerging when said first and second beam pairs are irradiated onto said second alignment mark through said chromatic aberration correction optical elements and then returning through said projection optical system, said second photoelectric detector then generating a signal corresponding to the diffracted light;
reference signal generator for generating a first reference signal with a frequency equal to said first beat frequency ($\Delta f_1$) and a second reference signal with a frequency equal to said second beat frequency ($\Delta f_2$); and
controller for performing alignment between said mask and said substrate, based on phase differences between signals of first and second beat frequencies ($\Delta f_1$, $\Delta f_2$) from said first and second photoelectric detector, and said first and second reference signals.

43. An alignment apparatus according to claim 42, wherein said plurality of chromatic aberration correction optical elements are optical elements for correcting at least one of a lateral chromatic aberration and a longitudinal chromatic aberration of said projection optical system for the first and second beam pairs in said second irradiation beam irradiated by said alignment light irradiating system.

44. An alignment apparatus according to claim 42, wherein said plurality of chromatic aberration correction optical elements are diffraction gratings for diffracting said first and second beam pairs in said second irradiation beam irradiated by said alignment light irradiating system to deflect the beams toward said specific alignment mark.

45. An alignment apparatus according to claim 42, further comprising a second chromatic aberration correction optical element set in an optical path in which said diffracted light returns from said second alignment mark on said substrate into said projection optical system, to deflect said diffracted light toward said second photoelectric detector.

46. An alignment apparatus according to claim 45, wherein said second chromatic aberration correction optical element is an optical element for correcting at least one of a lateral chromatic aberration and a longitudinal chromatic aberration of said projection optical system for said diffracted light.

47. An alignment apparatus according to claim 45, wherein said second chromatic aberration correction optical element is a diffraction grating for diffracting said diffracted light.

48. An alignment apparatus according to claim 42:
wherein said alignment light irradiating system further irradiates a third irradiation beam having a third beam pair and a fourth beam pair each pair composed of two beams with a substantially same wavelength different from that of said exposure light, at equal incident angles for two beams in each beam pair onto said first alignment mark together with said first irradiation beam, and irradiating a fourth irradiation beam having said third beam pair and fourth beam pair, together with said second irradiation beam, onto a second alignment mark on said substrate through a transmission window formed on said mask and through said projection optical system, wherein said alignment light irradiating system comprises third frequency shifting device for providing two beams in said third beam pair with a third beat frequency difference ($\Delta f_3$) different from said first and second beat frequencies ($\Delta f_1$, $\Delta f_2$) and fourth frequency shifting device for providing two beams in said fourth beam pair with a fourth beat frequency ($\Delta f_4$) different from said first, second and third beat frequencies ($\Delta f_1$, $\Delta f_2$, $\Delta f_3$); and wherein said plurality of chromatic aberration correction optical elements further have a plurality of chromatic aberration correction optical elements set on or near the Fourier transform plane to said projection pattern formed on said mask in said projection optical system and in optical paths of the first, second, third and fourth beam pairs in said second and fourth irradiation beams, said further elements deflecting said first, second, third and fourth beam pairs to make two beams in each pair incident at substantially equal incident angles into said second alignment mark on said substrate, wherein the incident angles of the fourth beam pair and the third beam pair are set in a relation of an integral number of times, and the incident angles of the first and second beam pairs and the incident angles of the third and fourth beam pairs are set in an orthogonal relation.

* * * * *